(12) United States Patent
Ullah et al.

(10) Patent No.: US 12,178,045 B2
(45) Date of Patent: Dec. 24, 2024

(54) MICROELECTRONIC DEVICES WITH TIERED DECKS OF ALIGNED PILLARS EXHIBITING BENDING AND RELATED METHODS

(71) Applicant: Micron Technology, Inc., Boise, ID (US)

(72) Inventors: Md Zakir Ullah, Singapore (SG); Xiaosong Zhang, Boise, ID (US); Adam L. Olson, Boise, ID (US); Mohammad Moydul Islam, Singapore (SG); Tien Minh Quan Tran, Singapore (SG); Chao Zhu, Singapore (SG); Zhigang Yang, Singapore (SG); Merri L. Carlson, Boise, ID (US); Hui Chin Chong, Singapore (SG); David A. Kewley, Boise, ID (US); Kok Siak Tang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/158,576

(22) Filed: Jan. 24, 2023

(65) Prior Publication Data
US 2023/0165004 A1  May 25, 2023

Related U.S. Application Data

(63) Continuation of application No. 17/016,002, filed on Sep. 9, 2020, now Pat. No. 11,563,027.

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS

| | | | |
|---|---|---|---|
| 4,677,301 A | 6/1987 | Tanimoto et al. | |
| 5,773,180 A | 6/1998 | Tomimatu | |
| 6,730,444 B2 | 5/2004 | Bowes | |
| 8,822,108 B2 | 9/2014 | Rolfson | |
| 2012/0061744 A1 | 3/2012 | Hwang et al. | |

(Continued)

OTHER PUBLICATIONS

International Search Report for Application No. PCT/US2021/049031, mailed Dec. 30, 2021, 3 pages.

(Continued)

*Primary Examiner* — Sarah K Salerno
(74) *Attorney, Agent, or Firm* — TraskBritt

(57) ABSTRACT

Microelectronic devices include a lower deck and an upper deck, each comprising a stack structure with a vertically alternating sequence of insulative structures and conductive structures arranged in tiers. First and second arrays of pillars extend through the stack structure of the lower and upper decks, respectively. In one or more of the first and second pillar arrays, at least some pillars exhibit a greater degree of bending away from a vertical orientation than at least some other pillars. The pillars of the first array align with the pillars of the second array along an interface between the lower and upper decks. Related methods are also disclosed.

20 Claims, 38 Drawing Sheets

(56) References Cited

U.S. PATENT DOCUMENTS

| | | |
|---|---|---|
| 2015/0279855 A1 | 10/2015 | Lu et al. |
| 2016/0071855 A1* | 3/2016 | Park .................. H10B 41/27 |
| | | 257/314 |
| 2018/0130737 A1 | 5/2018 | Kim |
| 2019/0019723 A1 | 1/2019 | Miyano |
| 2020/0091181 A1* | 3/2020 | Nagashima ............ H10B 41/10 |
| 2020/0161322 A1 | 5/2020 | Guo et al. |
| 2021/0249434 A1 | 8/2021 | Nishikawa |

OTHER PUBLICATIONS

Written Opinion of the International Searching Authority for Application No. PCT/US2021/049031, mailed Dec. 30, 2021, 3 pages.

\* cited by examiner

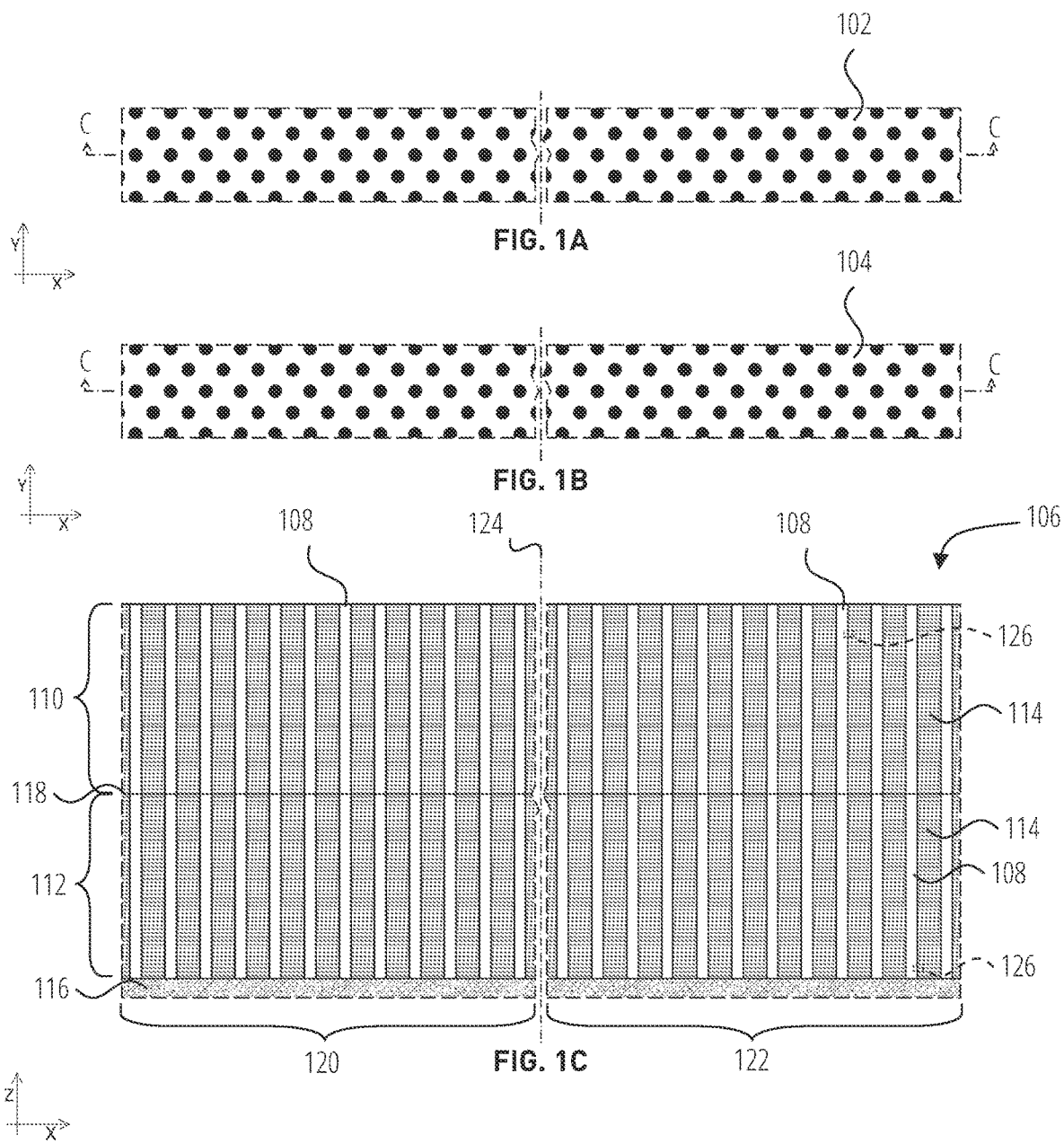

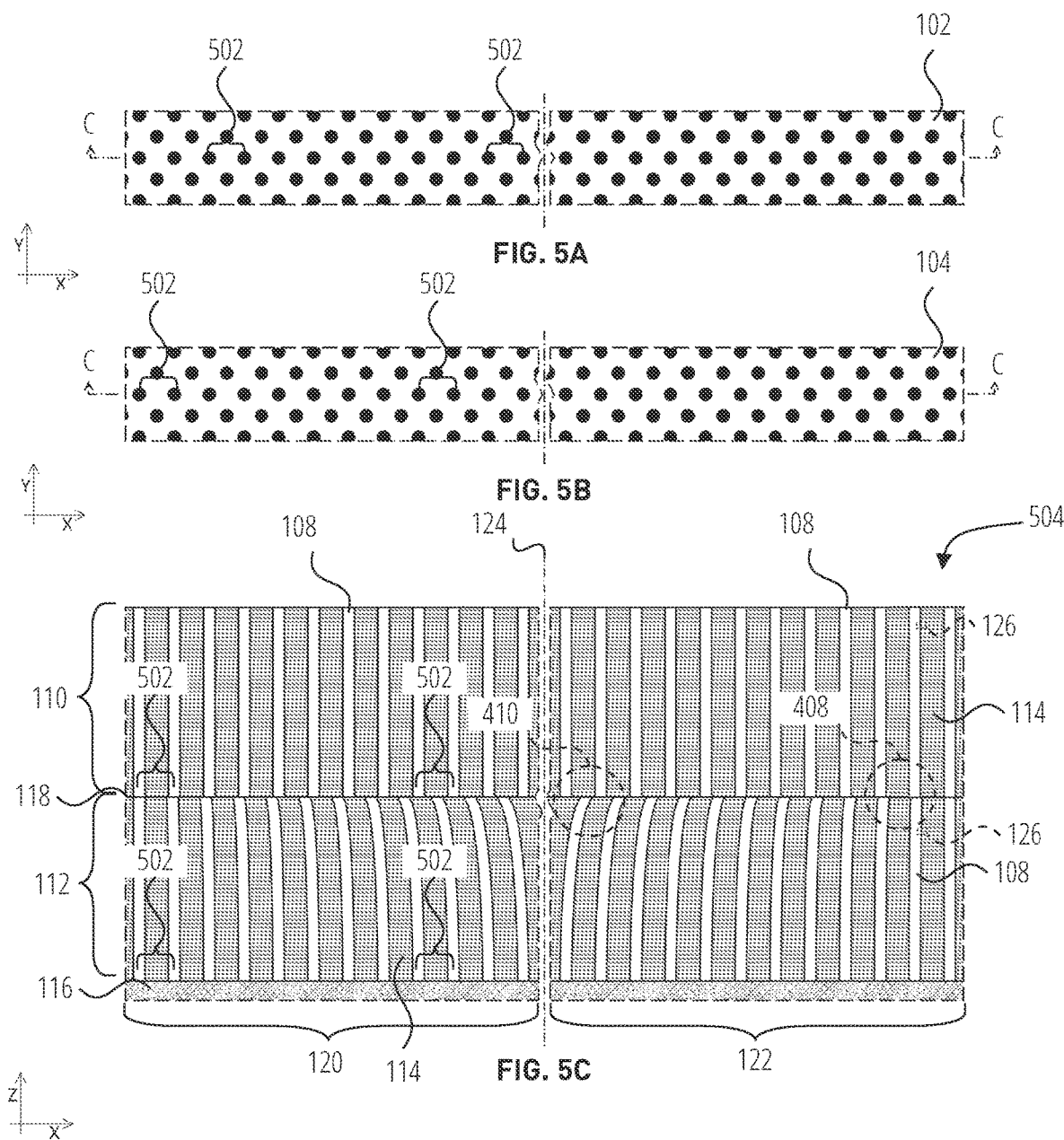

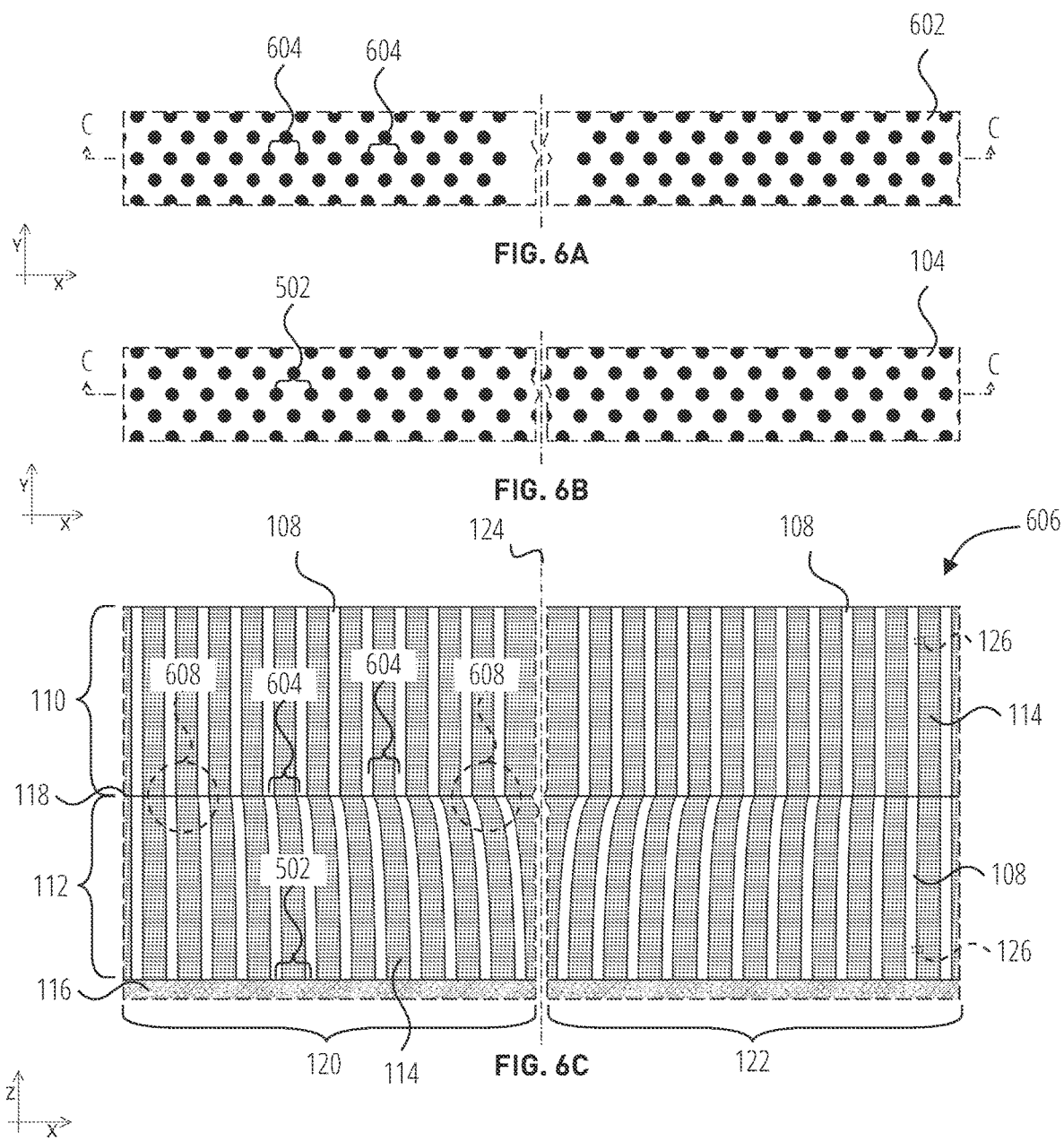

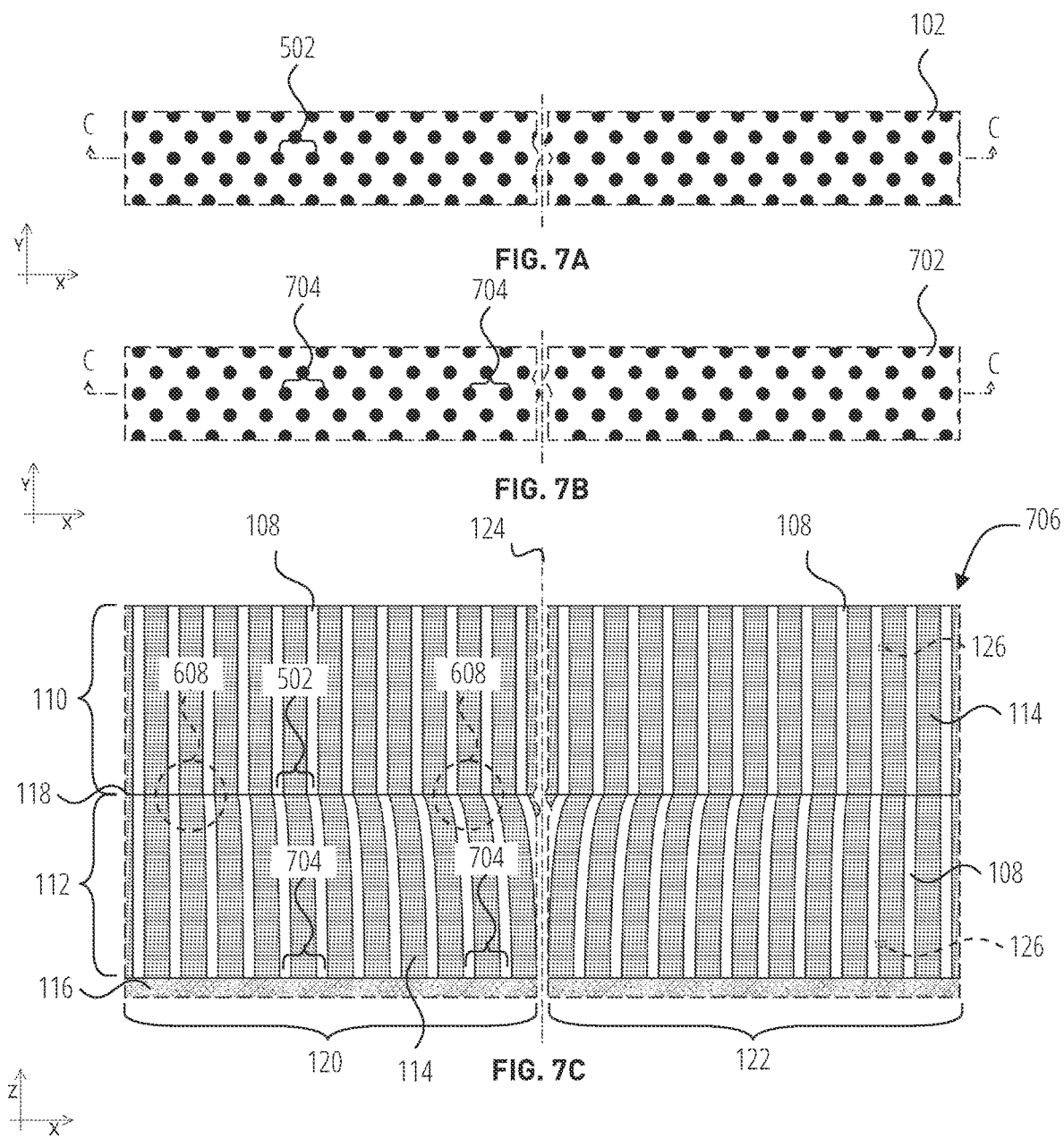

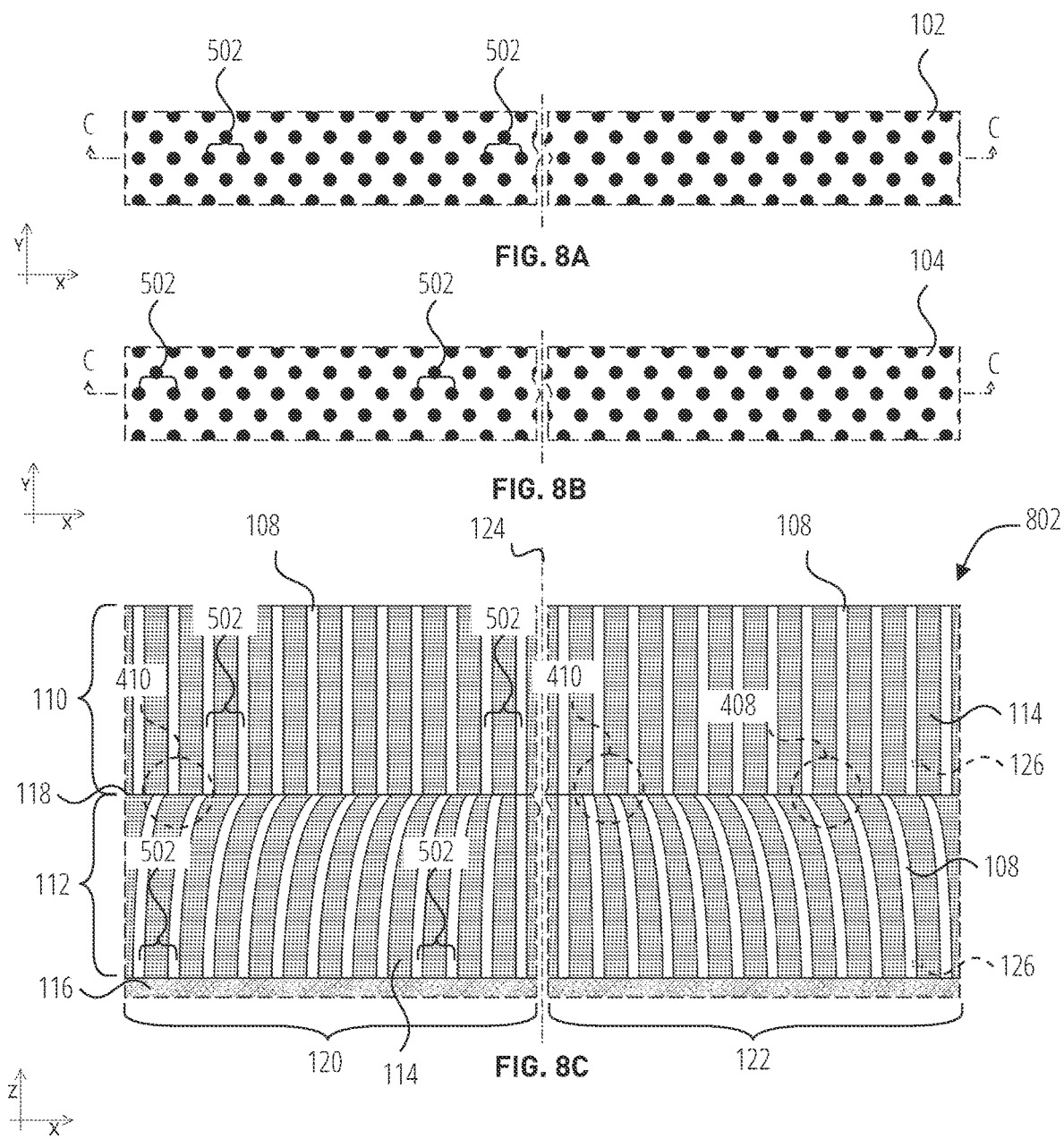

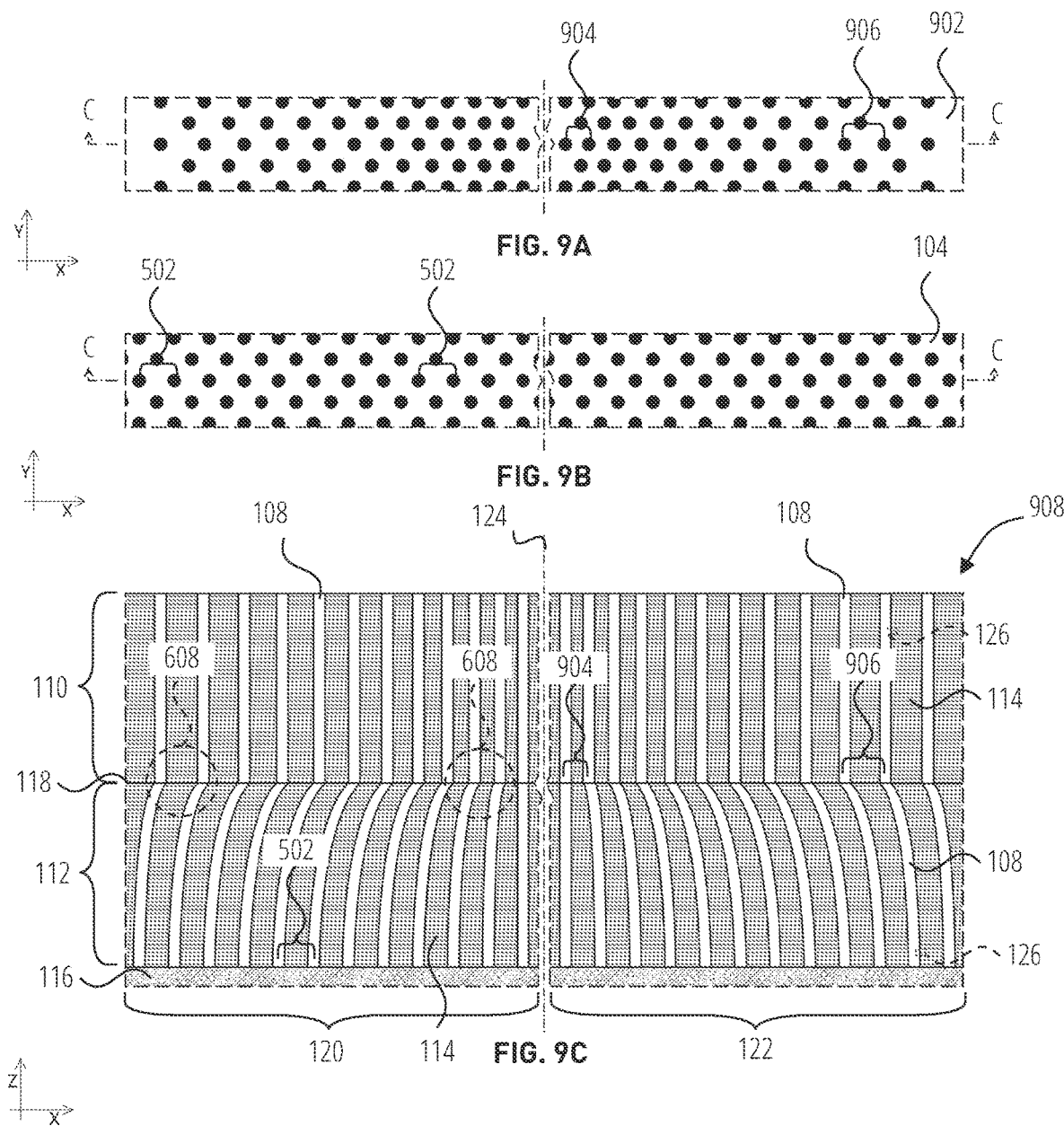

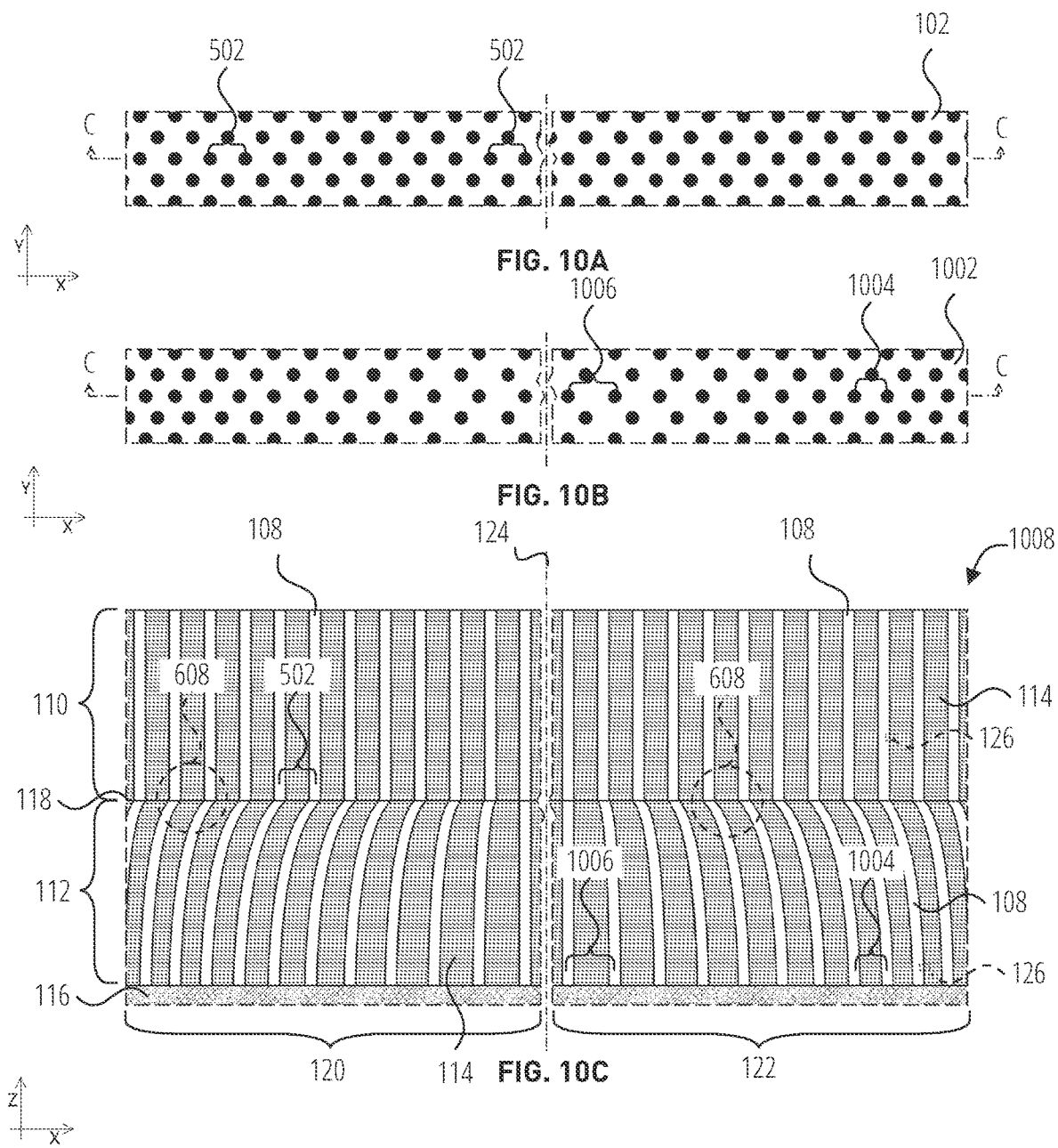

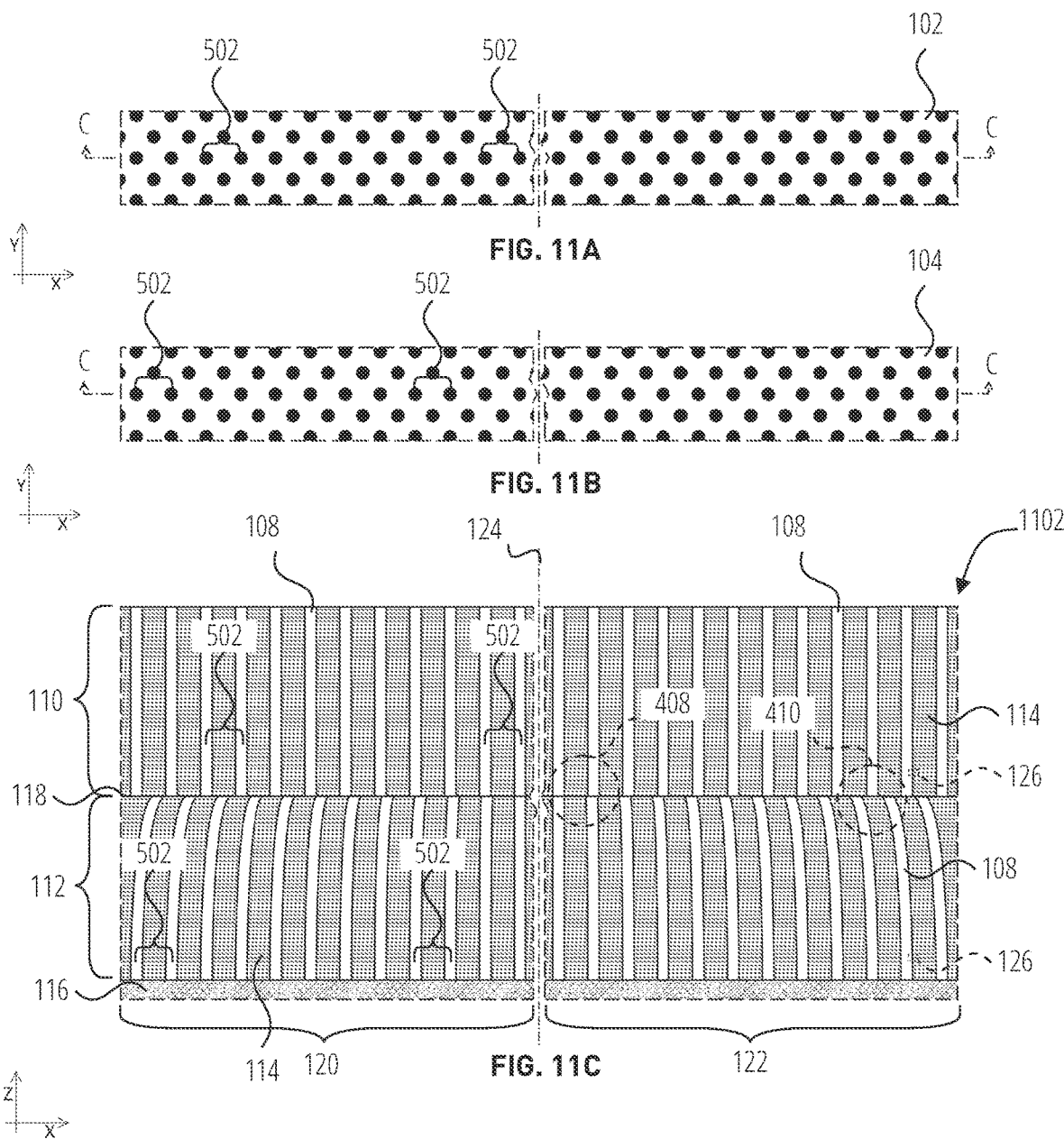

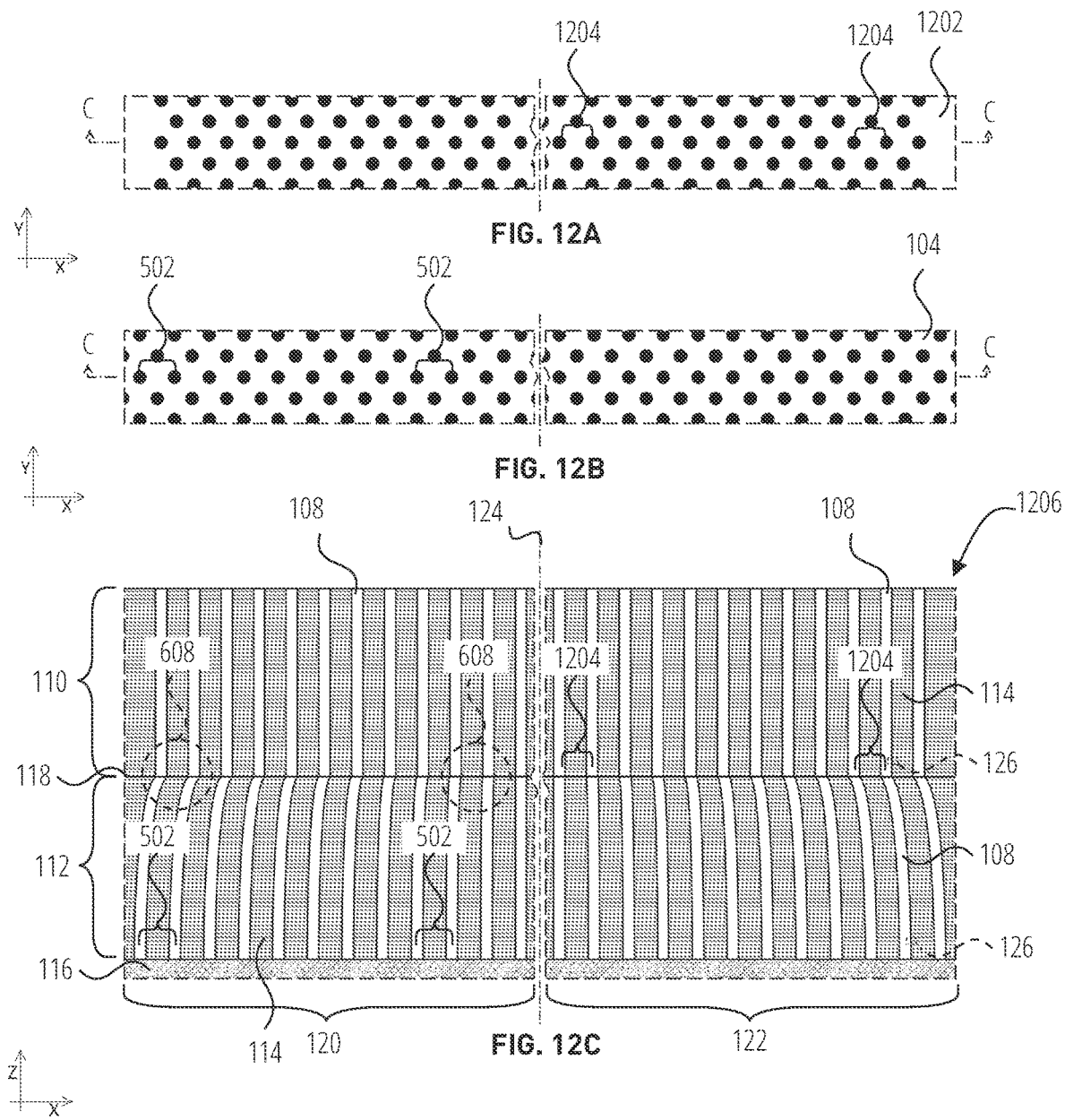

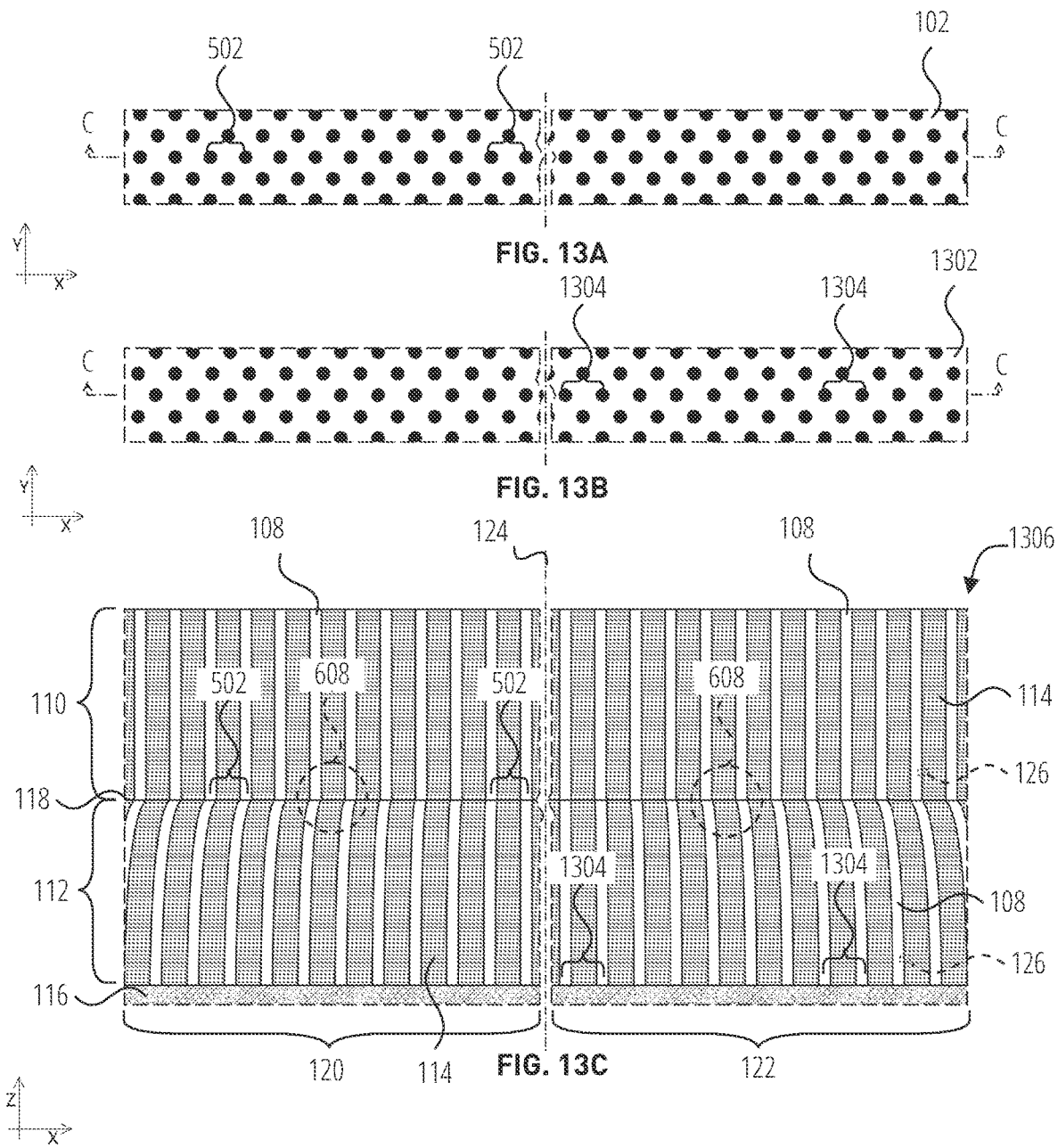

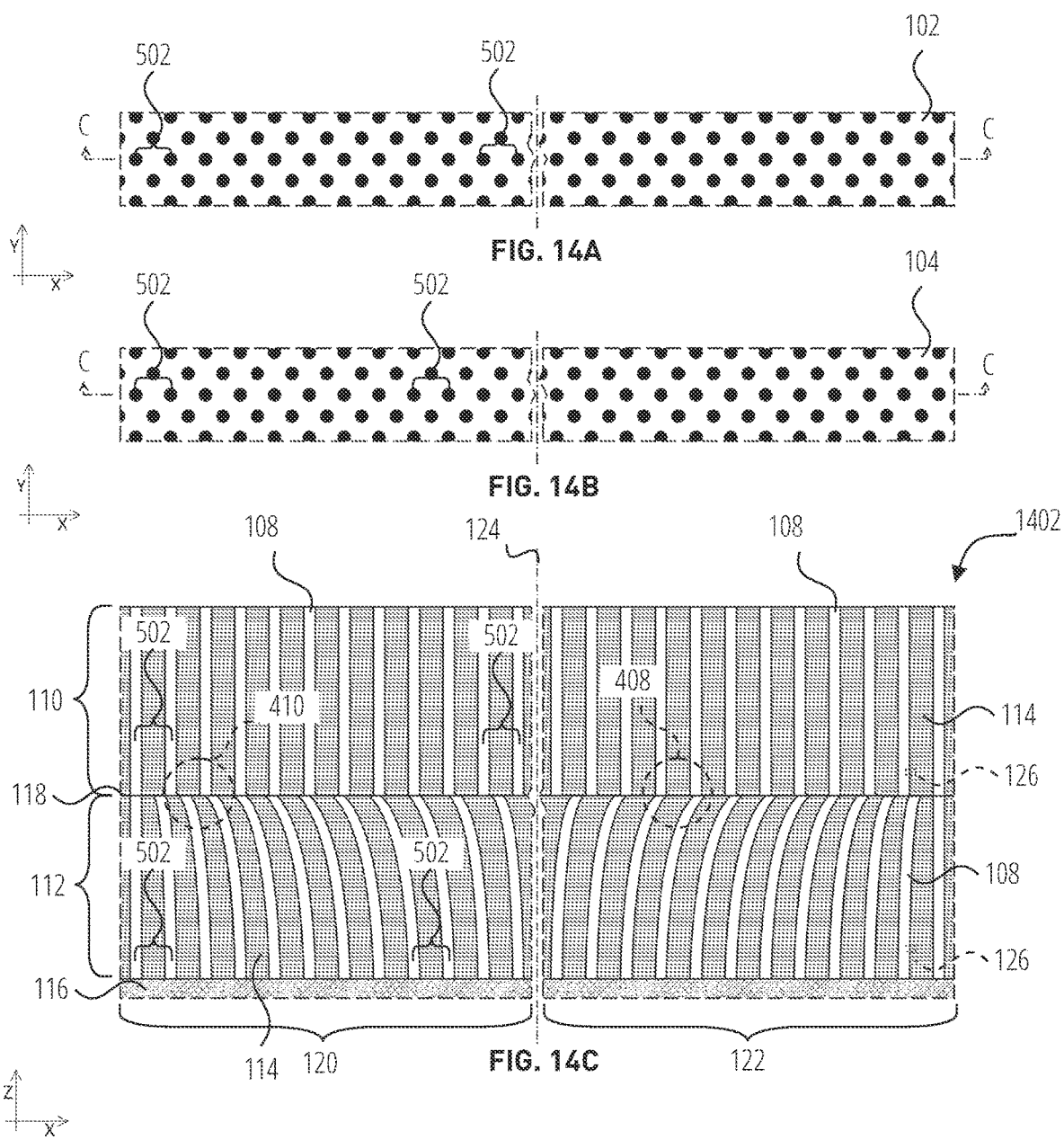

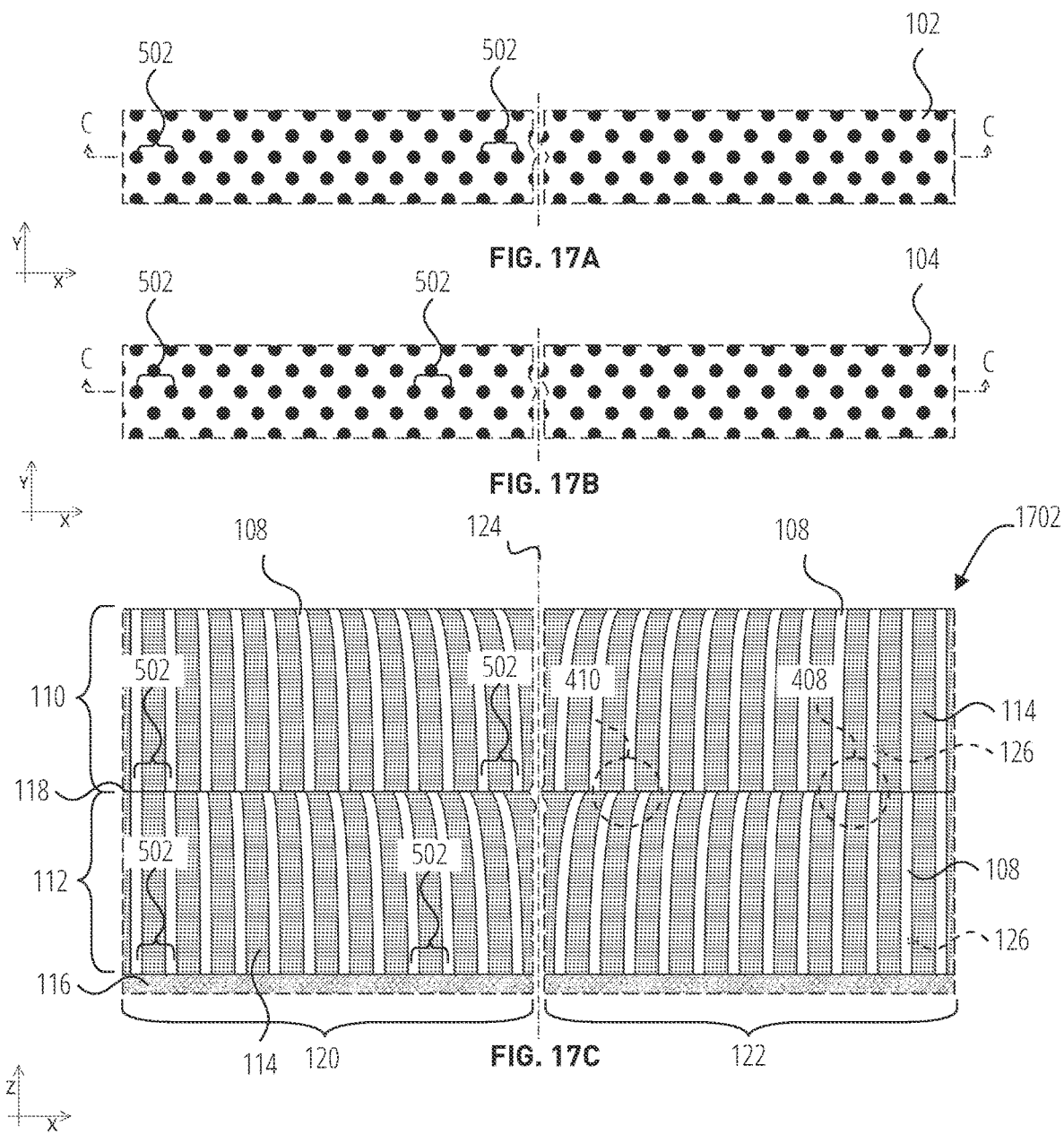

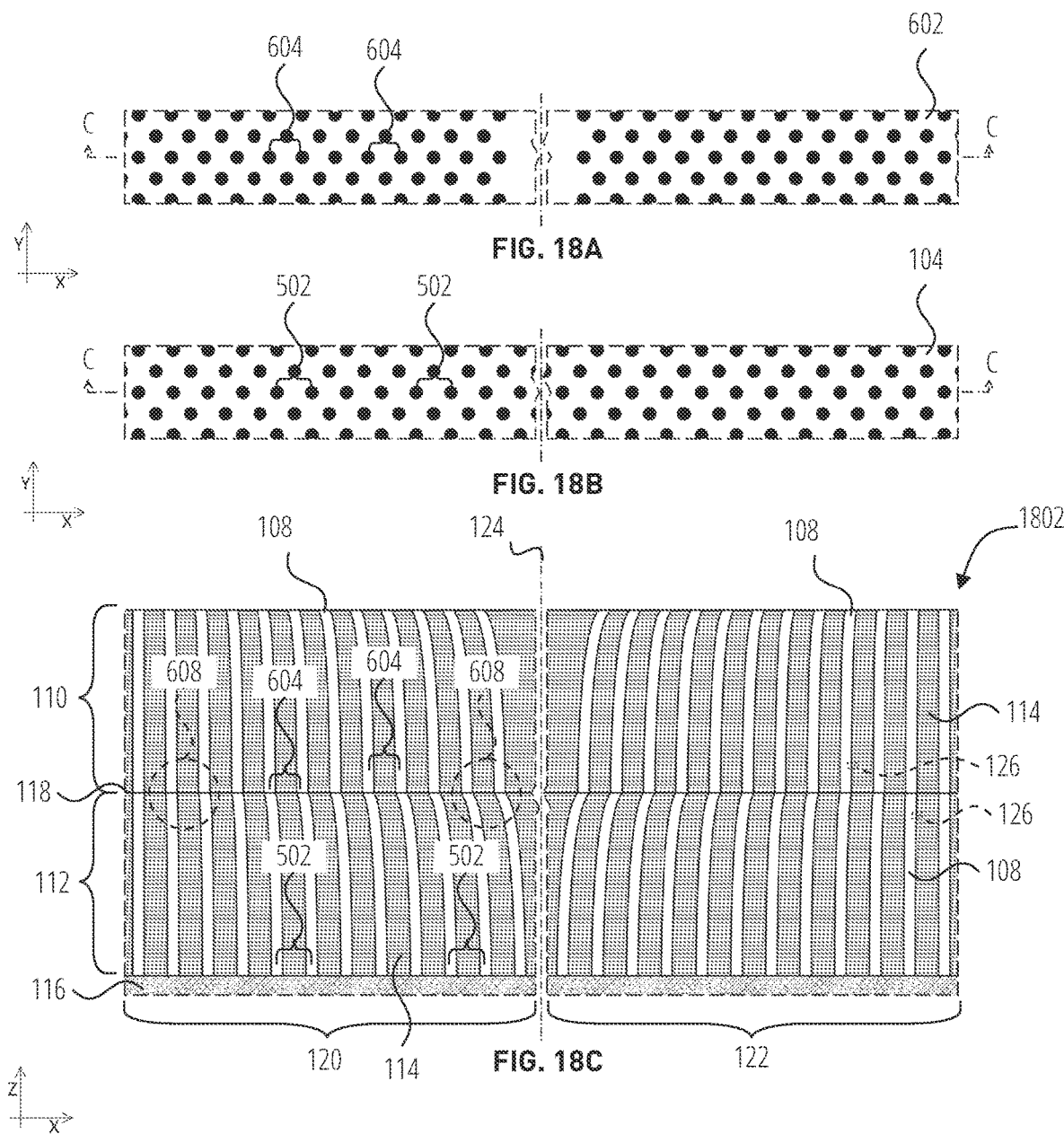

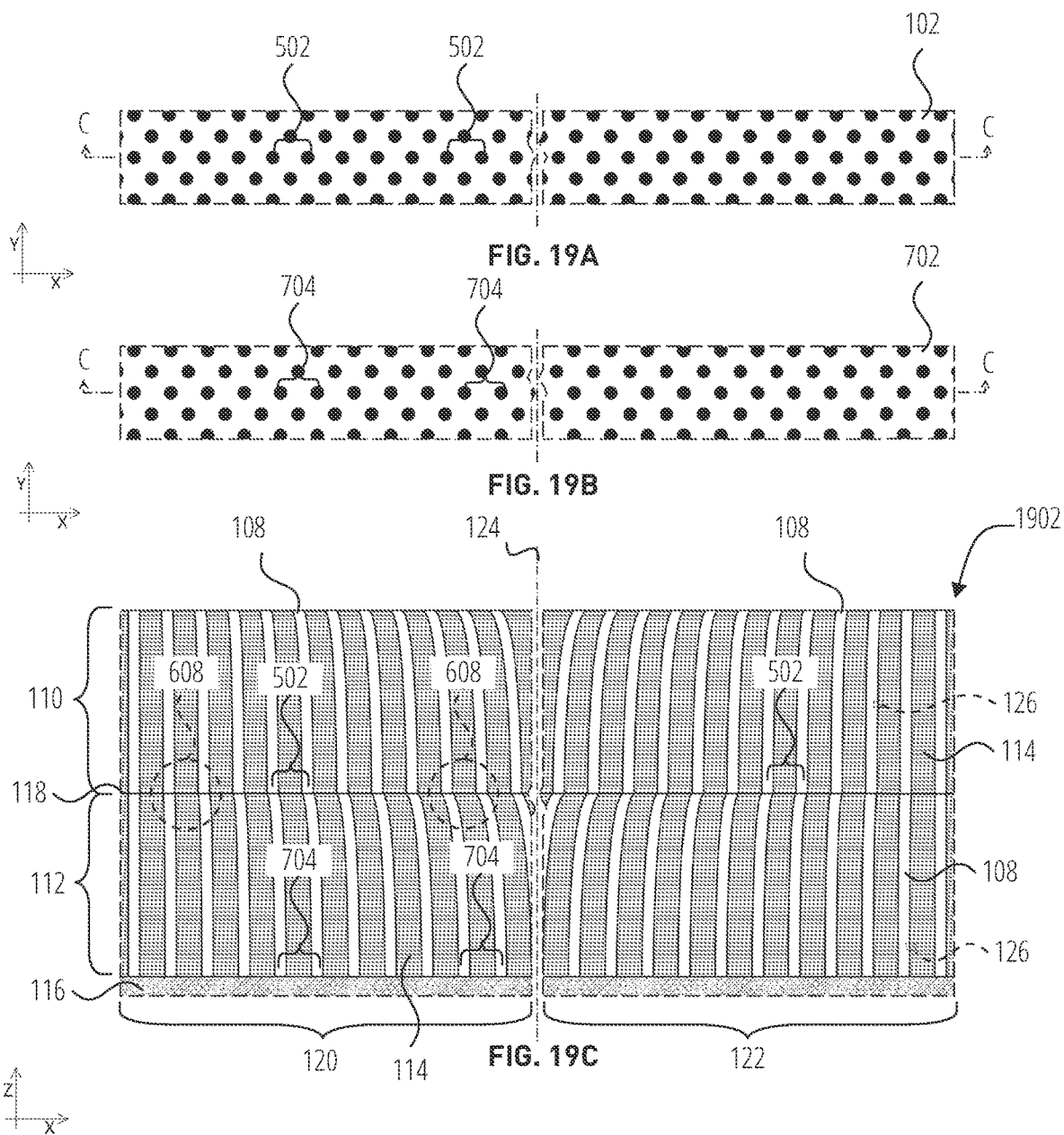

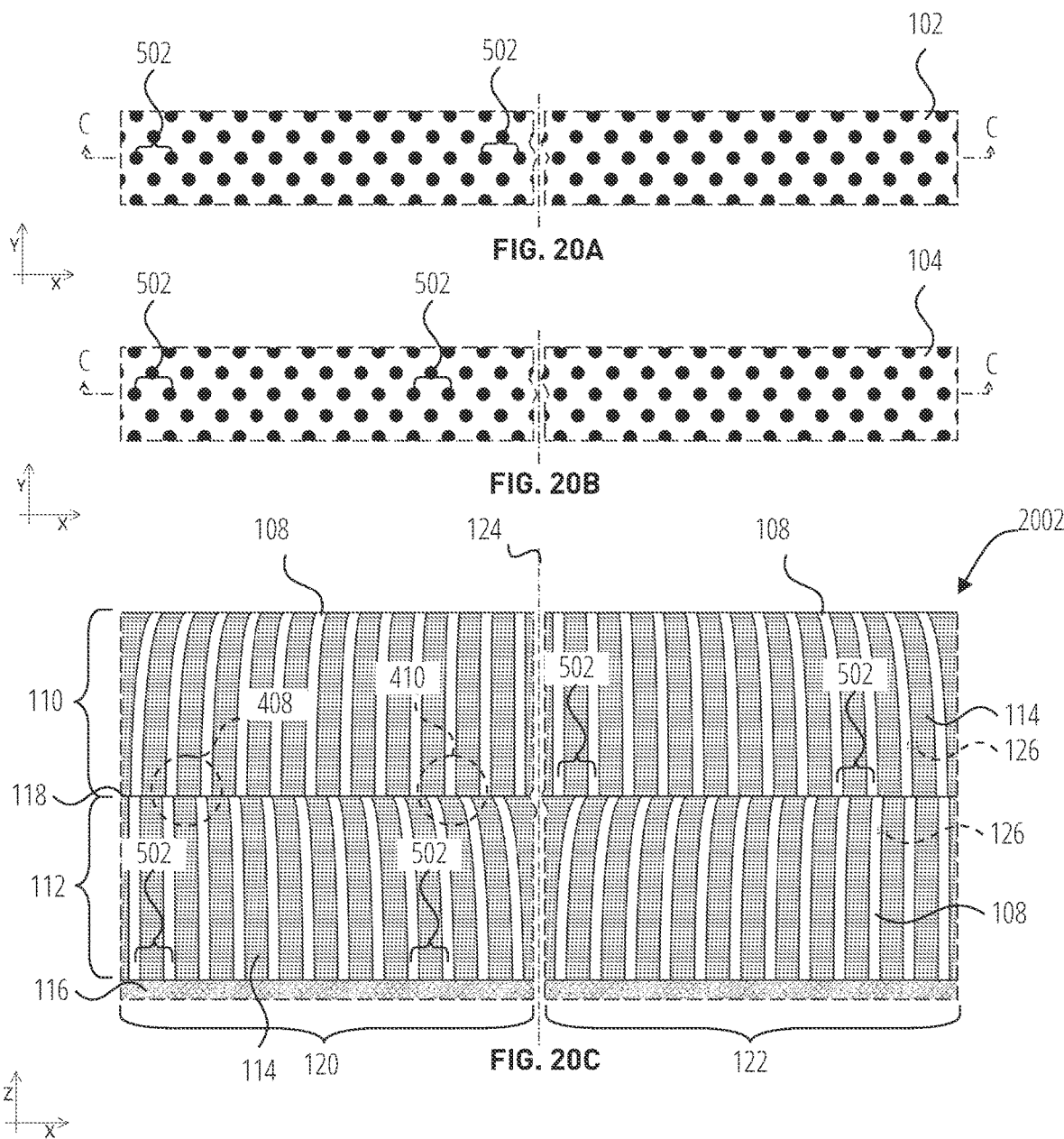

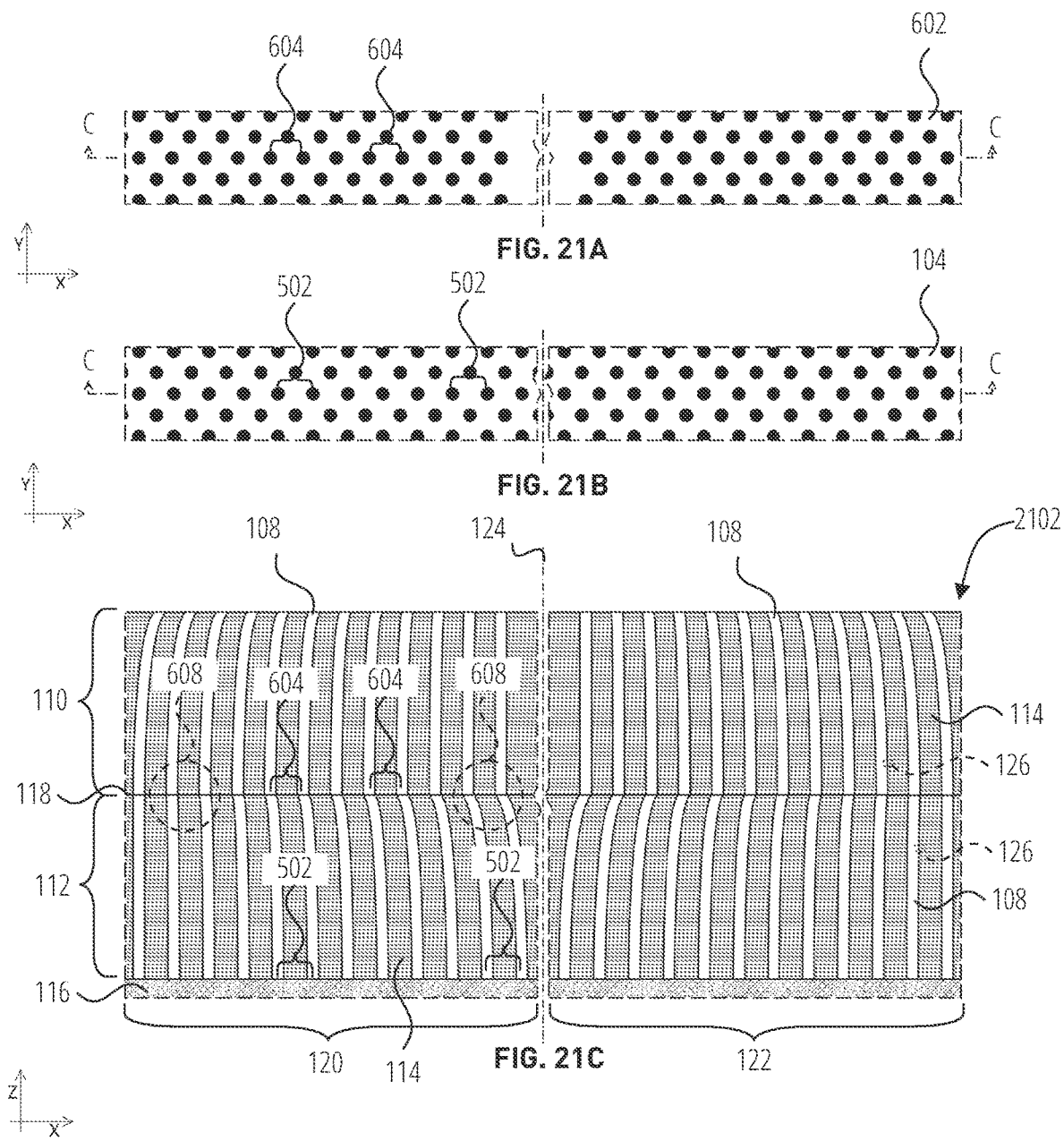

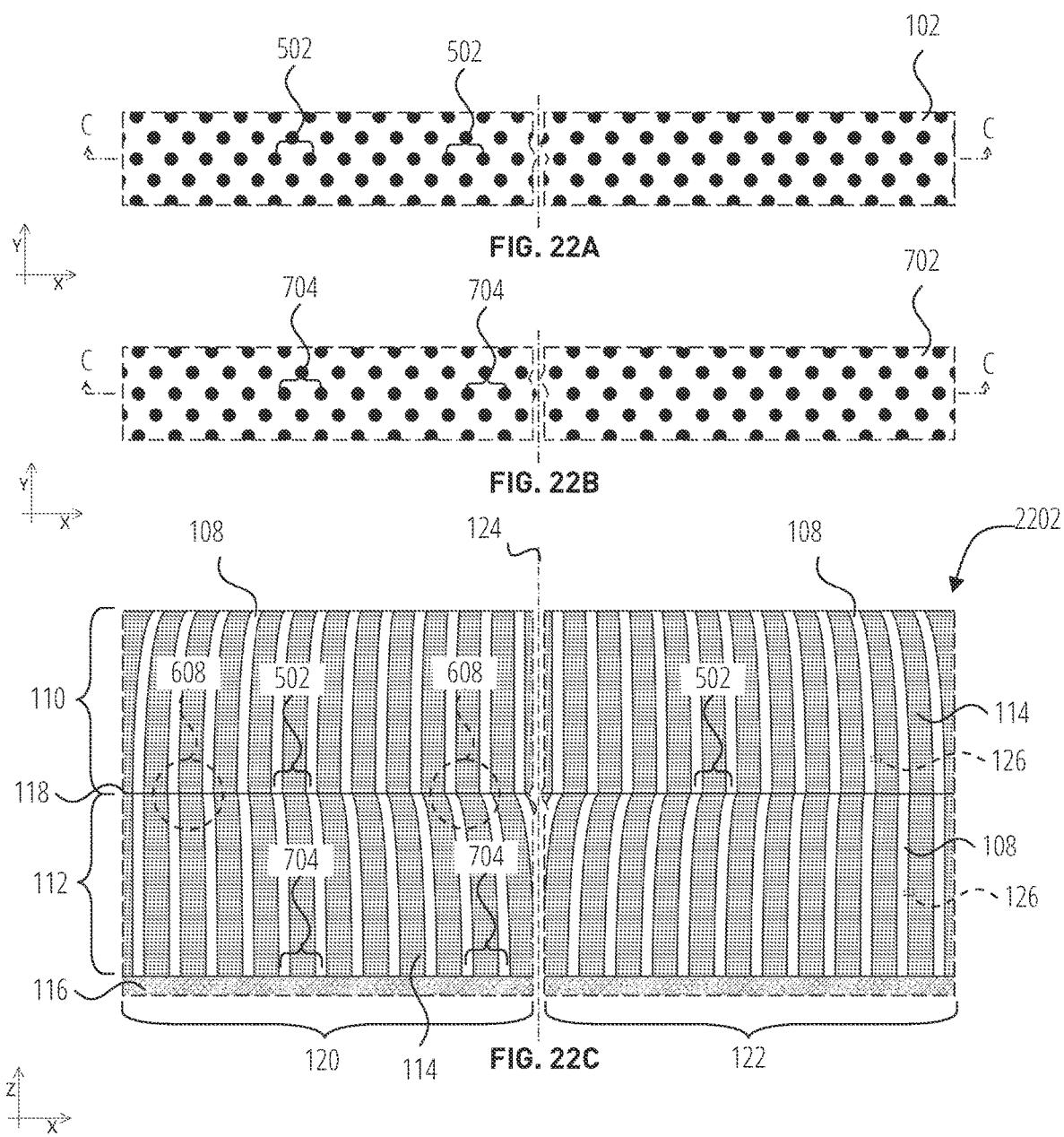

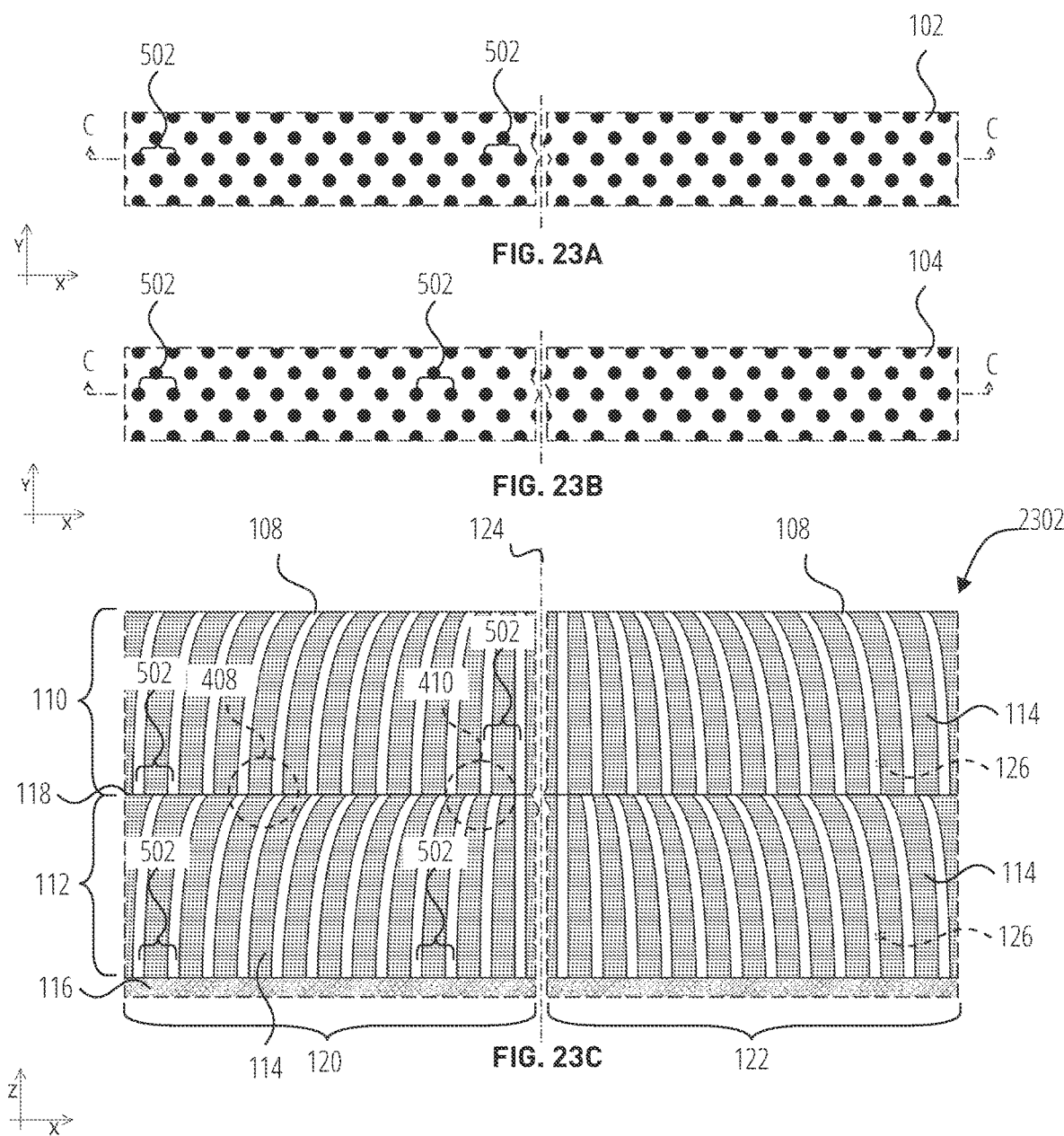

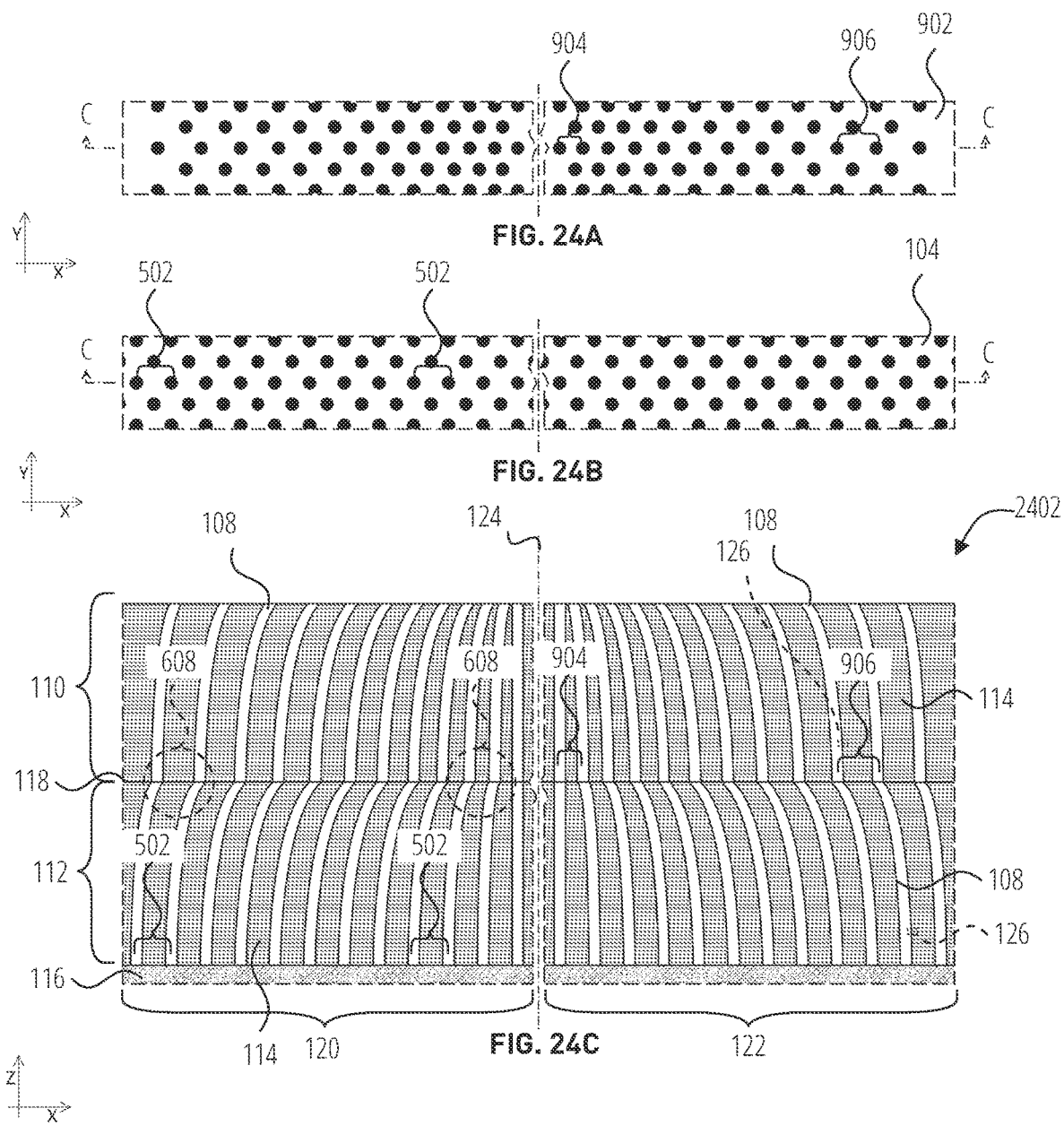

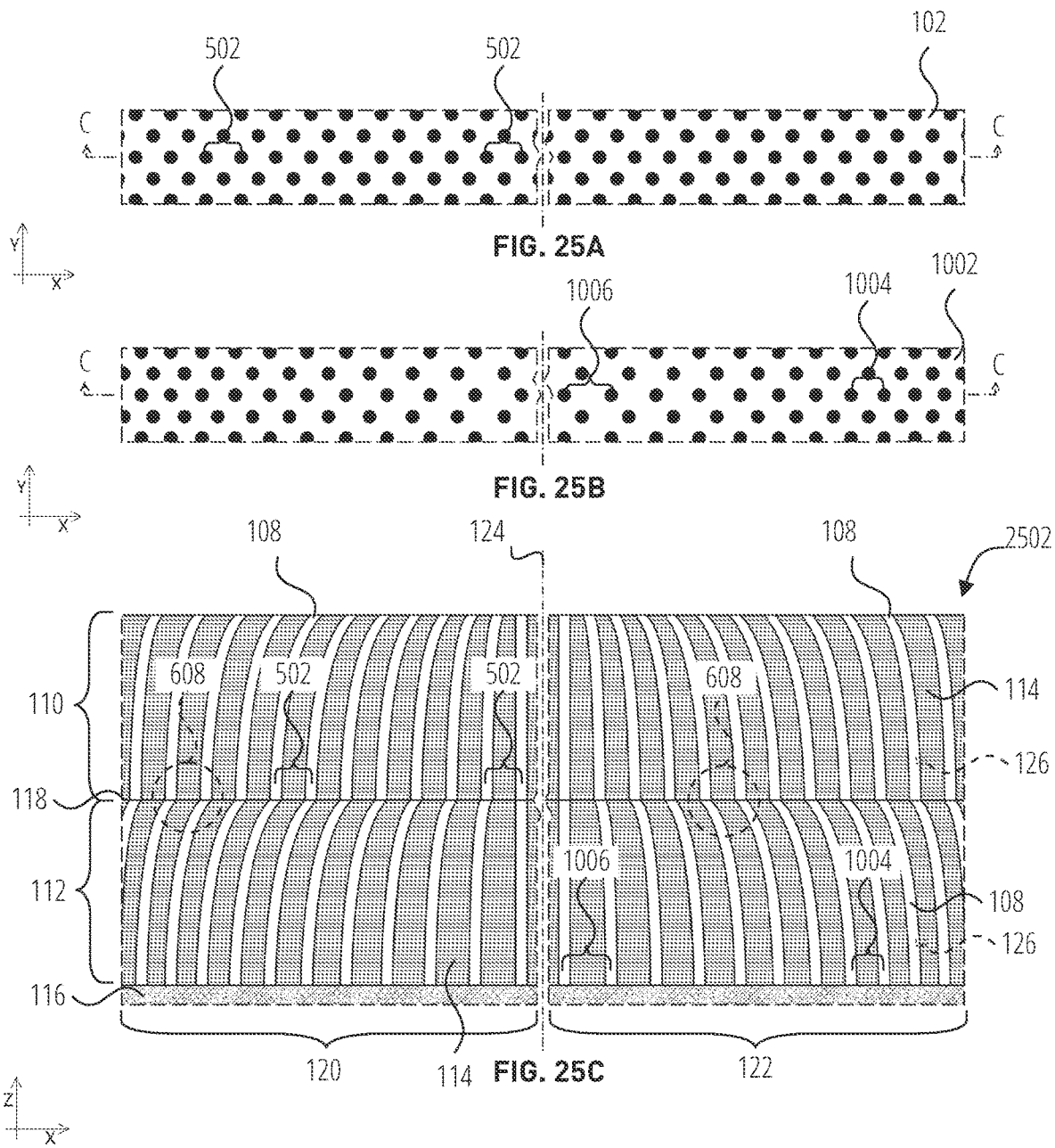

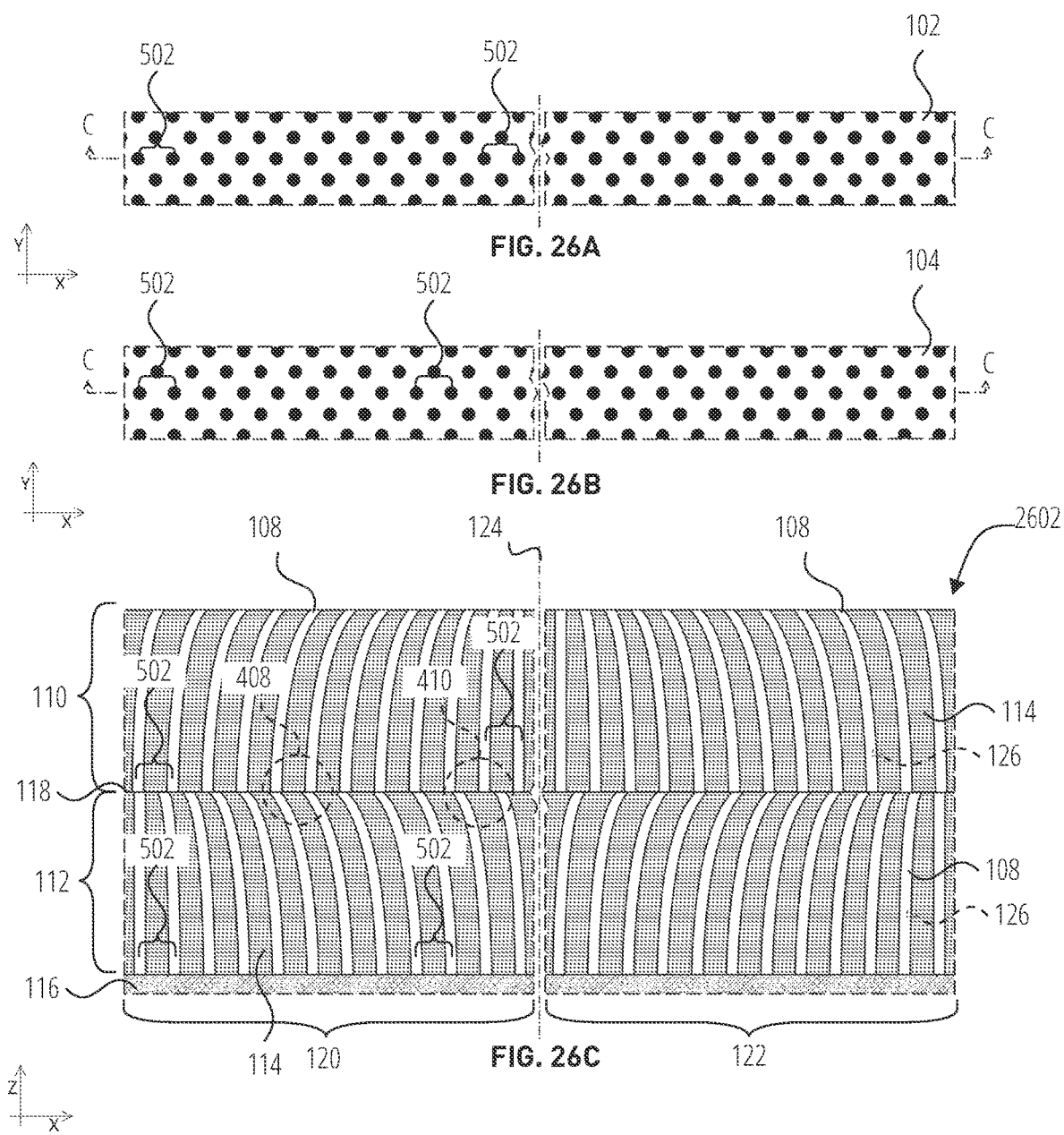

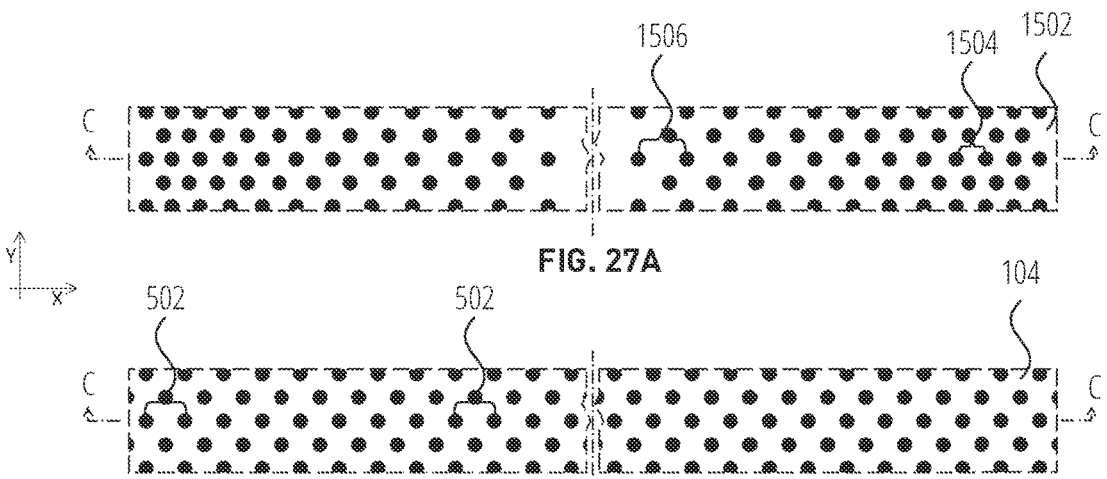
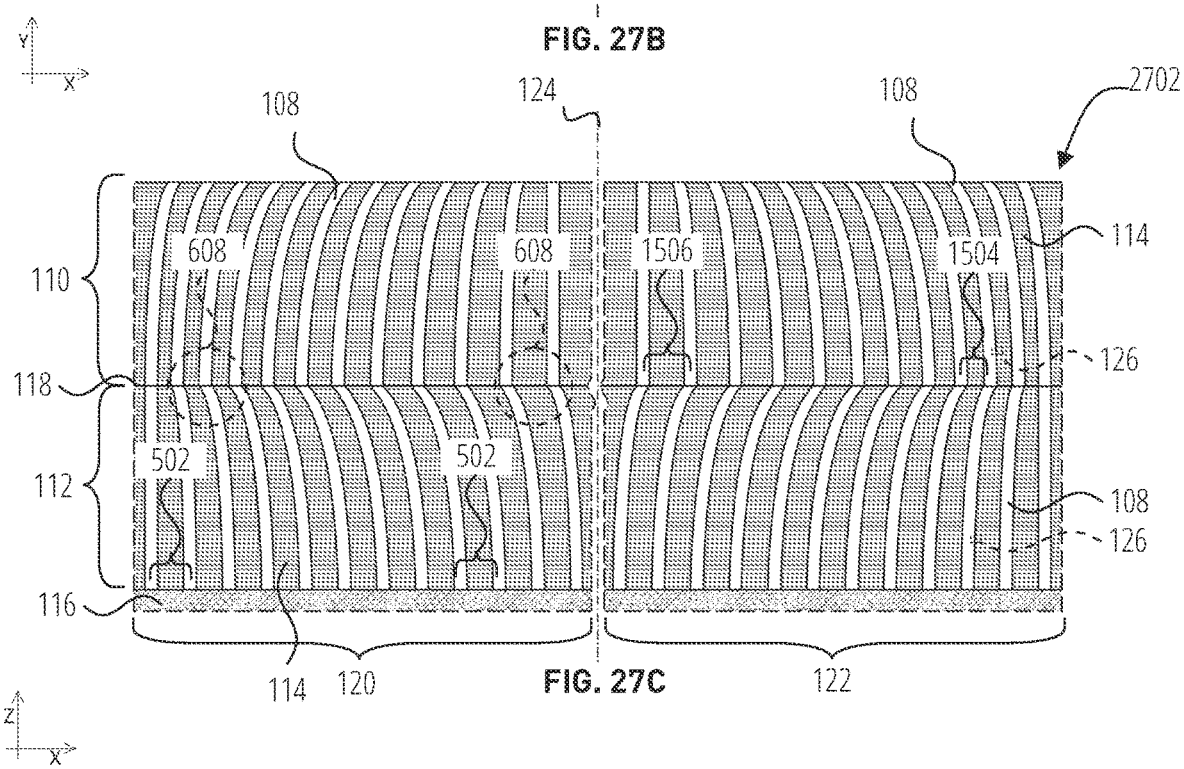

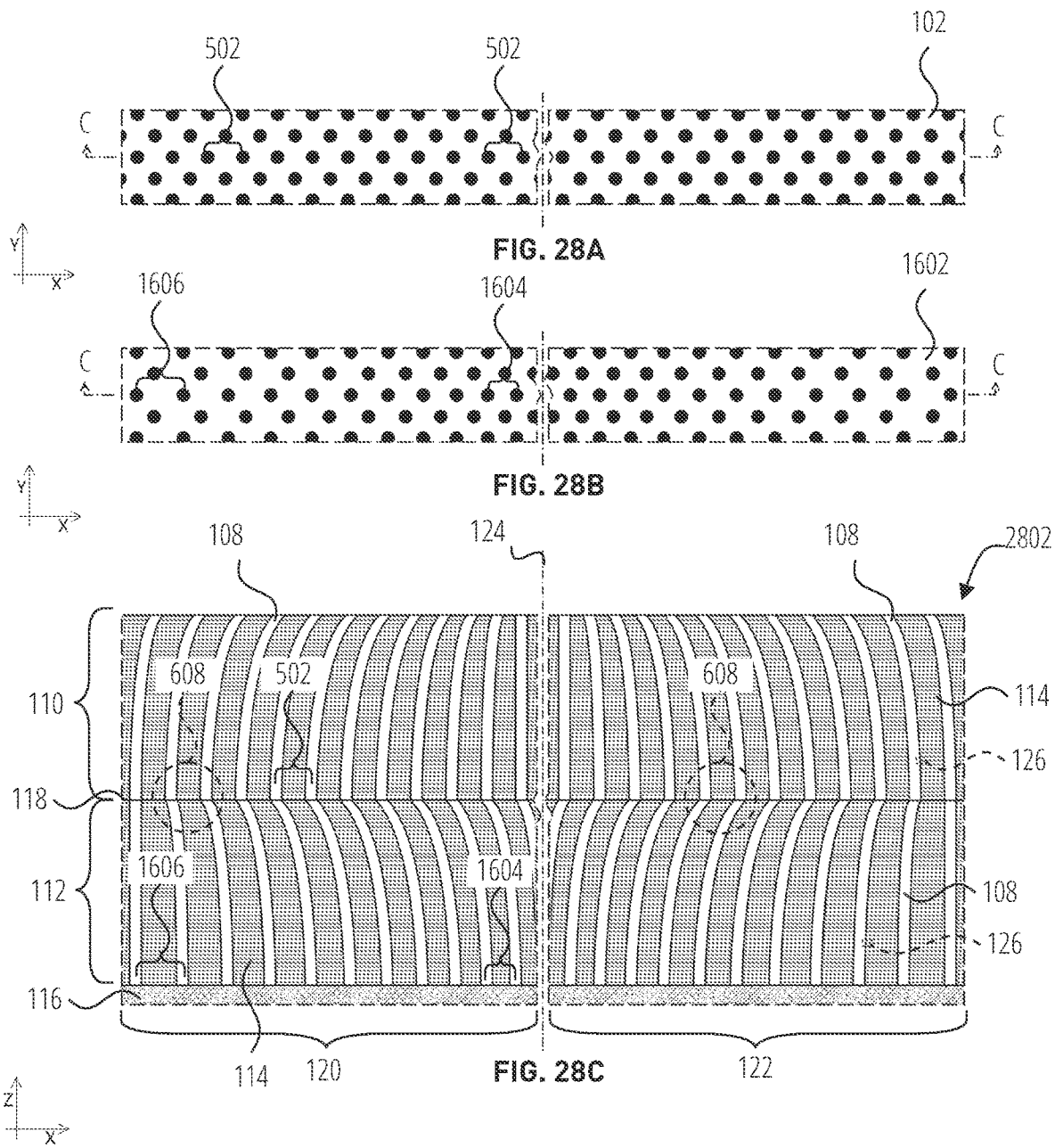

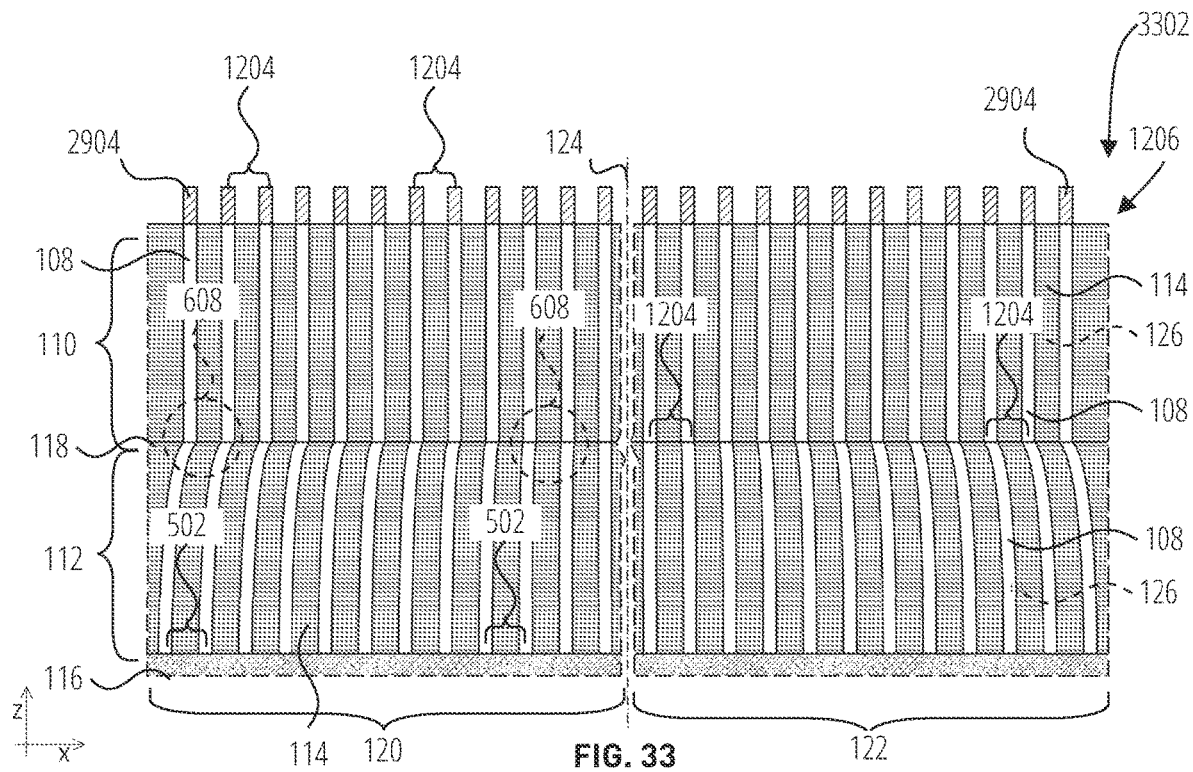
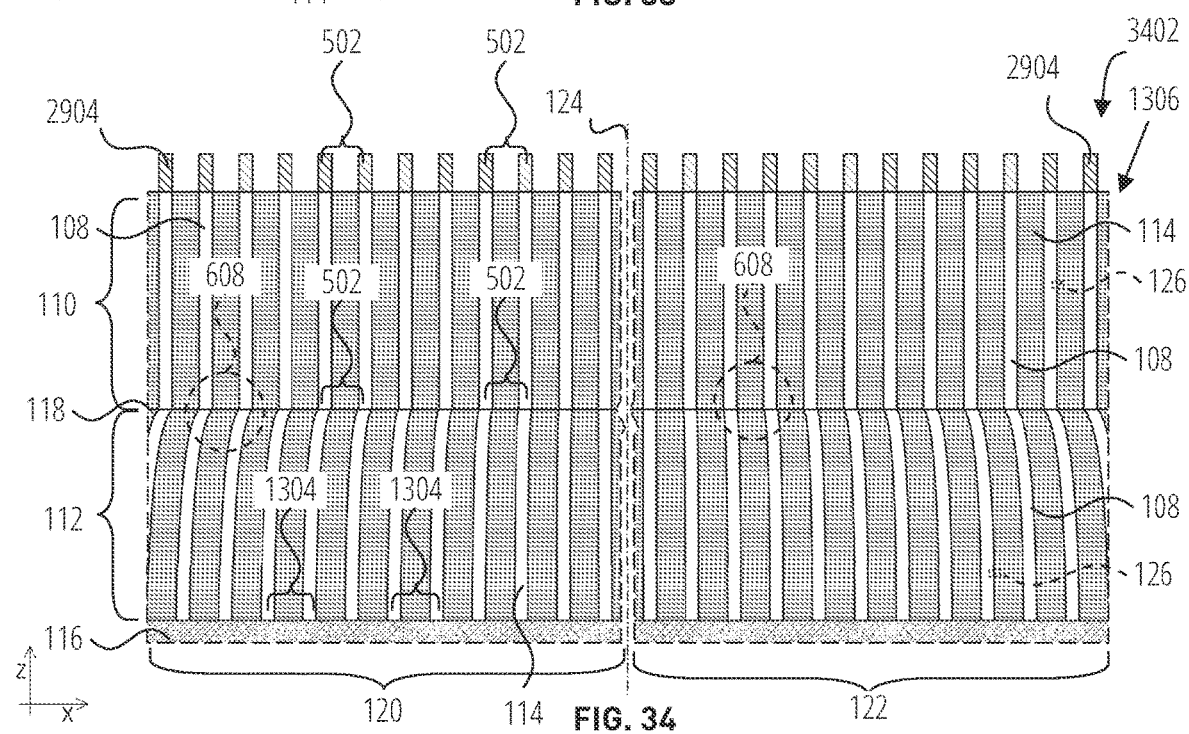

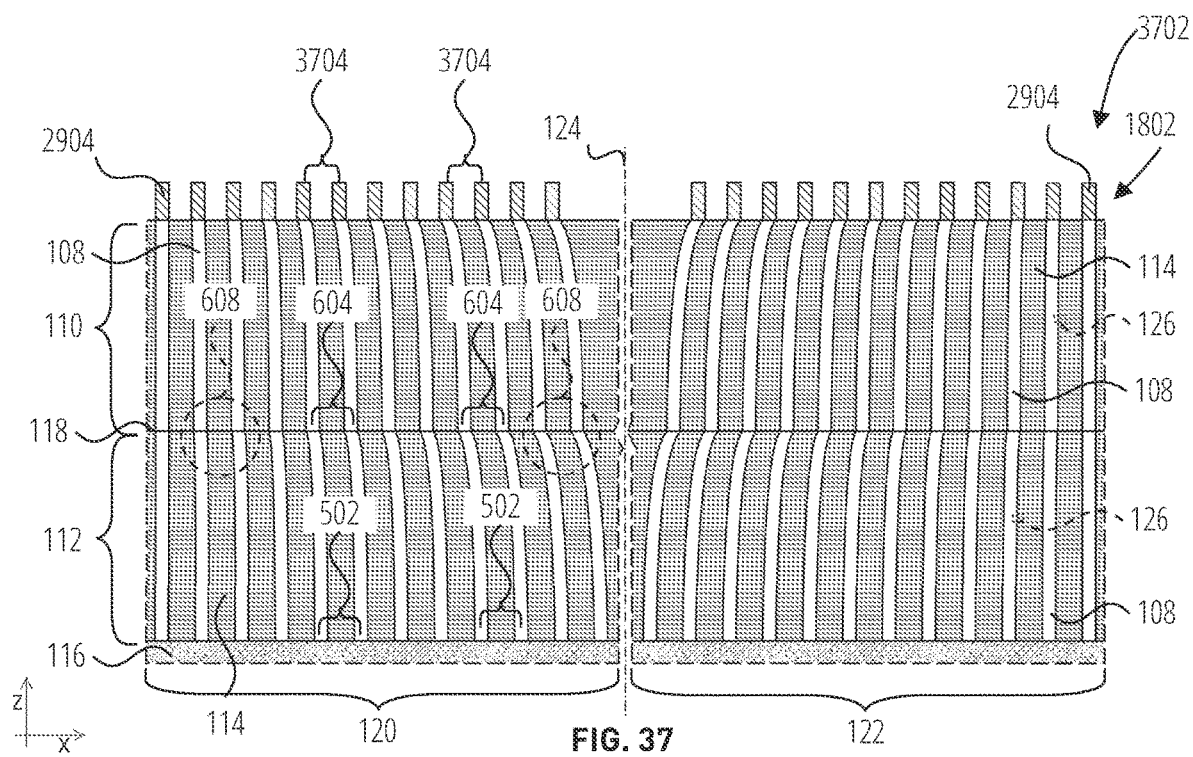
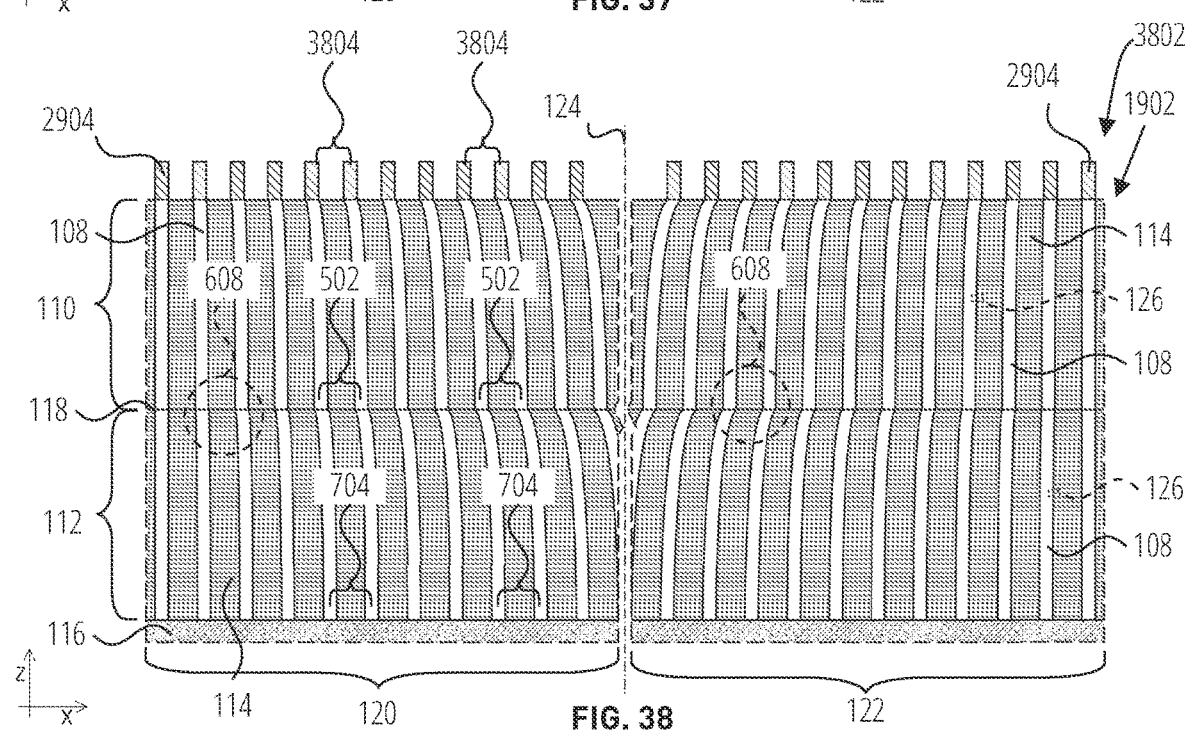

MICROELECTRONIC DEVICES WITH TIERED DECKS OF ALIGNED PILLARS EXHIBITING BENDING AND RELATED METHODS

CROSS-REFERENCE TO RELATED APPLICATION

This application is a continuation of U.S. patent application Ser. No. 17/016,002, filed Sep. 9, 2020, now U.S. Pat. No. 11,563,027, issued Jan. 24, 2023, the disclosure of which is hereby incorporated in its entirety herein by this reference.

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

Forming 3D NAND memory devices tends to present challenges. For example, differing residual stresses at various dispositions along a wafer, or relative to a particular feature being constructed on the wafer, may result in some features, intended to be truly vertical, bending away from true vertical, leading to misalignments, missed connections, or other fabrication problems with regard to subsequently formed features. Such misalignments, missed connections, or the like may ultimately cause device failure. Thus, reliably fabricating the features of microelectronic devices, such as 3D NAND memory devices, presents challenges.

BRIEF DESCRIPTION OF THE DRAWINGS

FIG. 1A and FIG. 1B are partial, plan, schematic illustrations of reticle patterns, and FIG. 1C is a cross-sectional, elevational, schematic illustration of an idealized microelectronic device structure, wherein pillars of an upper deck of the structure of FIG. 1C are formed using the reticle pattern of FIG. 1A, and wherein pillars of a lower deck of the structure of FIG. 1C are formed using the reticle pattern of FIG. 1B.

FIG. 5A and FIG. 5B are partial, plan, schematic illustrations of reticle patterns, and FIG. 5C is a cross-sectional, elevational, schematic illustration of a microelectronic device structure, wherein pillars of an upper deck of the structure of FIG. 5C are formed using the reticle pattern of FIG. 5A, and wherein pillars of a lower deck of the structure of FIG. 5C are formed using the reticle pattern of FIG. 5B, the microelectronic device structure exhibiting an observable misalignment of the pillars of the upper deck to the pillars of the lower deck.

FIG. 6A and FIG. 6B are partial, plan, schematic illustrations of reticle patterns, and FIG. 6C is a cross-sectional, elevational, schematic illustration of a microelectronic device structure, wherein the reticle pattern of FIG. 6A is tailored according to the observed pillar misalignment of the microelectronic device structure of FIG. 5C, wherein the pillars of an upper deck of the structure of FIG. 6C are formed using the reticle pattern of FIG. 6A, and wherein pillars of a lower deck of the structure of FIG. 6C are formed using the reticle pattern of FIG. 6B, the microelectronic device structure exhibiting alignment of the pillars of the upper deck to the pillars of the lower deck, in accordance with embodiments of the disclosure.

FIG. 7A and FIG. 7B are partial, plan, schematic illustrations of reticle patterns, and FIG. 7C is a cross-sectional, elevational, schematic illustration of a microelectronic device structure, wherein the reticle pattern of FIG. 7B is tailored according to the observed pillar misalignment of the microelectronic device structure of FIG. 5C, wherein the pillars of an upper deck of the structure of FIG. 7C are formed using the reticle pattern of FIG. 7A, and wherein pillars of a lower deck of the structure of FIG. 7C are formed using the reticle pattern of FIG. 7B, the microelectronic device structure exhibiting alignment of the pillars of the upper deck to the pillars of the lower deck, in accordance with embodiments of the disclosure.

FIG. 8A and FIG. 8B are partial, plan, schematic illustrations of reticle patterns, and FIG. 8C is a cross-sectional, elevational, schematic illustration of a microelectronic device structure, wherein pillars of an upper deck of the structure of FIG. 8C are formed using the reticle pattern of FIG. 8A, and wherein pillars of a lower deck of the structure of FIG. 8C are formed using the reticle pattern of FIG. 8B, the microelectronic device structure exhibiting an observable misalignment of the pillars of the upper deck to the pillars of the lower deck.

FIG. 9A and FIG. 9B are partial, plan, schematic illustrations of reticle patterns, and FIG. 9C is a cross-sectional, elevational, schematic illustration of a microelectronic device structure, wherein the reticle pattern of FIG. 9A is tailored according to the observed pillar misalignment of the microelectronic device structure of FIG. 8C, wherein the pillars of an upper deck of the structure of FIG. 9C are formed using the reticle pattern of FIG. 9A, and wherein pillars of a lower deck of the structure of FIG. 9C are formed using the reticle pattern of FIG. 9B, the microelectronic device structure exhibiting alignment of the pillars of the upper deck to the pillars of the lower deck, in accordance with embodiments of the disclosure.

FIG. 10A and FIG. 10B are partial, plan, schematic illustrations of reticle patterns, and FIG. 10C is a cross-sectional, elevational, schematic illustration of a microelectronic device structure, wherein the reticle pattern of FIG. 10B is tailored according to the observed pillar misalignment of the microelectronic device structure of FIG. 8C, the pillars of an upper deck of the structure of FIG. 10C are formed using the reticle pattern of FIG. 10A, and wherein pillars of a lower deck of the structure of FIG. 10C are formed using the reticle pattern of FIG. 10B, the microelectronic device structure exhibiting alignment of the pillars of the upper deck to the pillars of the lower deck, in accordance with embodiments of the disclosure.

FIG. 11A and FIG. 11B are partial, plan, schematic illustrations of reticle patterns, and FIG. 11C is a cross-sectional, elevational, schematic illustration of a microelectronic device structure, wherein pillars of an upper deck of the structure of FIG. 11C are formed using the reticle pattern of FIG. 11A, and wherein pillars of a lower deck of the structure of FIG. 11C are formed using the reticle pattern of FIG. 11B, the microelectronic device structure exhibiting an observable misalignment of the pillars of the upper deck to the pillars of the lower deck.

FIG. 12A and FIG. 12B are partial, plan, schematic illustrations of reticle patterns, and FIG. 12C is a cross-sectional, elevational, schematic illustration of a microelectronic device structure, wherein the reticle pattern of FIG. 12A is tailored according to the observed pillar misalignment of the microelectronic device structure of FIG. 11C, wherein the pillars of an upper deck of the structure of FIG. 12C are formed using the reticle pattern of FIG. 12A, and wherein pillars of a lower deck of the structure of FIG. 12C are formed using the reticle pattern of FIG. 12B, the microelectronic device structure exhibiting alignment of the pillars of the upper deck to the pillars of the lower deck, in accordance with embodiments of the disclosure.

FIG. 13A and FIG. 13B are partial, plan, schematic illustrations of reticle patterns, and FIG. 13C is a cross-sectional, elevational, schematic illustration of a microelectronic device structure, wherein the reticle pattern of FIG. 13B is tailored according to the observed pillar misalignment of the microelectronic device structure of FIG. 11C, the pillars of an upper deck of the structure of FIG. 13C are formed using the reticle pattern of FIG. 13A, and wherein pillars of a lower deck of the structure of FIG. 13C are formed using the reticle pattern of FIG. 13B, the microelectronic device structure exhibiting alignment of the pillars of the upper deck to the pillars of the lower deck, in accordance with embodiments of the disclosure.

FIG. 14A and FIG. 14B are partial, plan, schematic illustrations of reticle patterns, and FIG. 14C is a cross-sectional, elevational, schematic illustration of a microelectronic device structure, wherein pillars of an upper deck of the structure of FIG. 14C are formed using the reticle pattern of FIG. 14A, and wherein pillars of a lower deck of the structure of FIG. 14C are formed using the reticle pattern of FIG. 14B, the microelectronic device structure exhibiting an observable misalignment of the pillars of the upper deck to the pillars of the lower deck.

FIG. 17A and FIG. 17B are partial, plan, schematic illustrations of reticle patterns, and FIG. 17C is a cross-sectional, elevational, schematic illustration of a microelectronic device structure, wherein pillars of an upper deck of the structure of FIG. 17C are formed using the reticle pattern of FIG. 17A, and wherein pillars of a lower deck of the structure of FIG. 17C are formed using the reticle pattern of FIG. 17B, the microelectronic device structure exhibiting an observable misalignment of the pillars of the upper deck to the pillars of the lower deck.

FIG. 18A and FIG. 18B are partial, plan, schematic illustrations of reticle patterns, and FIG. 18C is a cross-sectional, elevational, schematic illustration of a microelectronic device structure, wherein the reticle pattern of FIG. 18A is tailored according to the observed pillar misalignment of the microelectronic device structure of FIG. 17C, wherein the pillars of an upper deck of the structure of FIG. 18C are formed using the reticle pattern of FIG. 18A, and wherein pillars of a lower deck of the structure of FIG. 18C are formed using the reticle pattern of FIG. 18B, the microelectronic device structure exhibiting alignment of the pillars of the upper deck to the pillars of the lower deck, in accordance with embodiments of the disclosure.

FIG. 19A and FIG. 19B are partial, plan, schematic illustrations of reticle patterns, and FIG. 19C is a cross-sectional, elevational, schematic illustration of a microelectronic device structure, wherein the reticle pattern of FIG. 19B is tailored according to the observed pillar misalignment of the microelectronic device structure of FIG. 17C, the pillars of an upper deck of the structure of FIG. 19C are formed using the reticle pattern of FIG. 19A, and wherein pillars of a lower deck of the structure of FIG. 19C are formed using the reticle pattern of FIG. 19B, the microelectronic device structure exhibiting alignment of the pillars of the upper deck to the pillars of the lower deck, in accordance with embodiments of the disclosure.

FIG. 20A and FIG. 20B are partial, plan, schematic illustrations of reticle patterns, and FIG. 20C is a cross-sectional, elevational, schematic illustration of a microelectronic device structure, wherein pillars of an upper deck of the structure of FIG. 20C are formed using the reticle pattern of FIG. 20A, and wherein pillars of a lower deck of the structure of FIG. 20C are formed using the reticle pattern of FIG. 20B, the microelectronic device structure exhibiting an observable misalignment of the pillars of the upper deck to the pillars of the lower deck.

FIG. 21A and FIG. 21B are partial, plan, schematic illustrations of reticle patterns, and FIG. 21C is a cross-sectional, elevational, schematic illustration of a microelectronic device structure, wherein the reticle pattern of FIG. 21A is tailored according to the observed pillar misalignment of the microelectronic device structure of FIG. 20C, wherein the pillars of an upper deck of the structure of FIG. 21C are formed using the reticle pattern of FIG. 21A, and wherein pillars of a lower deck of the structure of FIG. 21C are formed using the reticle pattern of FIG. 21B, the microelectronic device structure exhibiting alignment of the pillars of the upper deck to the pillars of the lower deck, in accordance with embodiments of the disclosure.

FIG. 22A and FIG. 22B are partial, plan, schematic illustrations of reticle patterns, and FIG. 22C is a cross-sectional, elevational, schematic illustration of a microelectronic device structure, wherein the reticle pattern of FIG. 22B is tailored according to the observed pillar misalignment of the microelectronic device structure of FIG. 20C, the pillars of an upper deck of the structure of FIG. 22C are formed using the reticle pattern of FIG. 22A, and wherein pillars of a lower deck of the structure of FIG. 22C are formed using the reticle pattern of FIG. 22B, the microelectronic device structure exhibiting alignment of the pillars of the upper deck to the pillars of the lower deck, in accordance with embodiments of the disclosure.

FIG. 23A and FIG. 23B are partial, plan, schematic illustrations of reticle patterns, and FIG. 23C is a cross-sectional, elevational, schematic illustration of a microelectronic device structure, wherein pillars of an upper deck of the structure of FIG. 23C are formed using the reticle pattern of FIG. 23A, and wherein pillars of a lower deck of the structure of FIG. 23C are formed using the reticle pattern of FIG. 23B, the microelectronic device structure exhibiting an observable misalignment of the pillars of the upper deck to the pillars of the lower deck.

FIG. 24A and FIG. 24B are partial, plan, schematic illustrations of reticle patterns, and FIG. 24C is a cross-sectional, elevational, schematic illustration of a microelectronic device structure, wherein the reticle pattern of FIG. 24A is tailored according to the observed pillar misalignment of the microelectronic device structure of FIG. 23C, wherein the pillars of an upper deck of the structure of FIG. 24C are formed using the reticle pattern of FIG. 24A, and wherein pillars of a lower deck of the structure of FIG. 24C are formed using the reticle pattern of FIG. 24B, the microelectronic device structure exhibiting alignment of the pillars of the upper deck to the pillars of the lower deck, in accordance with embodiments of the disclosure.

FIG. 25A and FIG. 25B are partial, plan, schematic illustrations of reticle patterns, and FIG. 25C is a cross-sectional, elevational, schematic illustration of a microelectronic device structure, wherein the reticle pattern of FIG. 25B is tailored according to the observed pillar misalignment of the microelectronic device structure of FIG. 23C, the pillars of an upper deck of the structure of FIG. 25C are formed using the reticle pattern of FIG. 25A, and wherein pillars of a lower deck of the structure of FIG. 25C are formed using the reticle pattern of FIG. 25B, the microelectronic device structure exhibiting alignment of the pillars of the upper deck to the pillars of the lower deck, in accordance with embodiments of the disclosure.

FIG. 26A and FIG. 26B are partial, plan, schematic illustrations of reticle patterns, and FIG. 26C is a cross-sectional, elevational, schematic illustration of a microelectronic device structure, wherein pillars of an upper deck of the structure of FIG. 26C are formed using the reticle pattern of FIG. 26A, and wherein pillars of a lower deck of the structure of FIG. 26C are formed using the reticle pattern of FIG. 26B, the microelectronic device structure exhibiting an observable misalignment of the pillars of the upper deck to the pillars of the lower deck.

FIG. 27A and FIG. 27B are partial, plan, schematic illustrations of reticle patterns, and FIG. 27C is a cross-sectional, elevational, schematic illustration of a microelectronic device structure, wherein the reticle pattern of FIG. 27A is tailored according to the observed pillar misalignment of the microelectronic device structure of FIG. 26C, wherein the pillars of an upper deck of the structure of FIG. 27C are formed using the reticle pattern of FIG. 27A, and wherein pillars of a lower deck of the structure of FIG. 27C are formed using the reticle pattern of FIG. 27B, the microelectronic device structure exhibiting alignment of the pillars of the upper deck to the pillars of the lower deck, in accordance with embodiments of the disclosure.

FIG. 28A and FIG. 28B are partial, plan, schematic illustrations of reticle patterns, and FIG. 28C is a cross-sectional, elevational, schematic illustration of a microelectronic device structure, wherein the reticle pattern of FIG. 28B is tailored according to the observed pillar misalignment of the microelectronic device structure of FIG. 26C, the pillars of an upper deck of the structure of FIG. 28C are formed using the reticle pattern of FIG. 28A, and wherein pillars of a lower deck of the structure of FIG. 28C are formed using the reticle pattern of FIG. 28B, the microelectronic device structure exhibiting alignment of the pillars of the upper deck to the pillars of the lower deck, in accordance with embodiments of the disclosure.

FIG. 33 is a cross-sectional, elevational, schematic illustration of a microelectronic device structure, including an array of bit contacts formed in a pattern tailored for alignment to upper surfaces of the pillars of the upper deck of the microelectronic device structure of FIG. 12C, in accordance with embodiments of the disclosure.

FIG. 34 is a cross-sectional, elevational, schematic illustration of a microelectronic device structure, including an array of bit contacts formed in a pattern tailored for alignment to upper surfaces of the pillars of the upper deck of the microelectronic device structure of FIG. 13C, in accordance with embodiments of the disclosure.

FIG. 37 is a cross-sectional, elevational, schematic illustration of a microelectronic device structure, including an array of bit contacts formed in a pattern tailored for alignment to upper surfaces of the pillars of the upper deck of the microelectronic device structure of FIG. 18C, in accordance with embodiments of the disclosure.

FIG. 38 is a cross-sectional, elevational, schematic illustration of a microelectronic device structure, including an array of bit contacts formed in a pattern tailored for alignment to upper surfaces of the pillars of the upper deck of the microelectronic device structure of FIG. 19C, in accordance with embodiments of the disclosure.

DETAILED DESCRIPTION

Figures 2A, 2B:
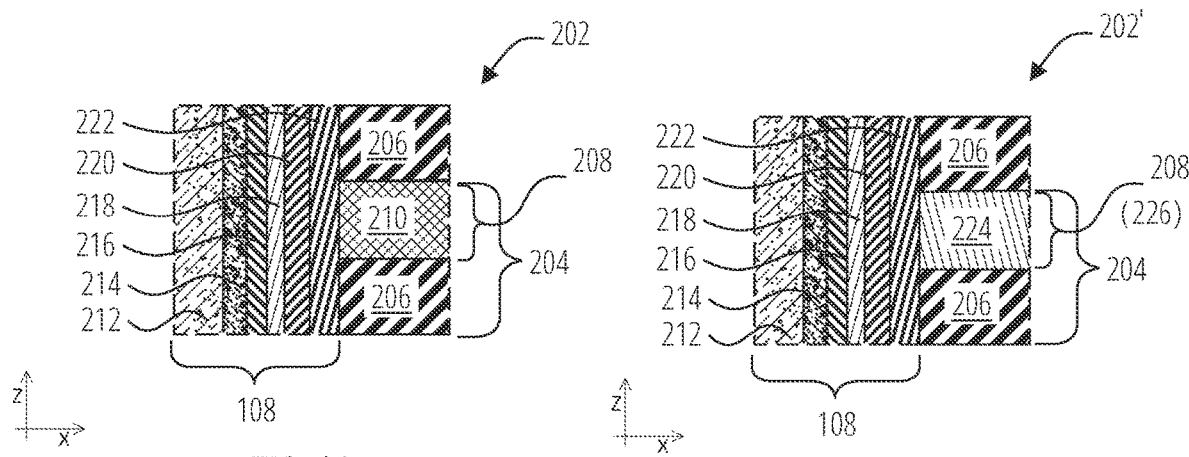
FIG. 2A through FIG. 2E are cross-sectional, elevational, schematic illustrations of memory cells, in accordance with embodiments of the disclosure, the illustrated areas each corresponding to boxed areas of any one or more of FIG. 1C, FIG. 4, FIG. 5C through FIG. 28C (with respect to the "C" figures thereof), and FIG. 29 through FIG. 44.

Structures (e.g., microelectronic device structures), apparatus (e.g., microelectronic devices), and systems (e.g., electronic systems), in accordance with embodiments of the disclosure, include multiple decks of pillars that extend through a respective stack of vertically alternating conductive structures and insulative structures arranged in tiers. Along an interface between an upper deck and a lower deck, the pillars of the lower deck align with respective, vertically adjacent pillars of the upper deck. This alignment is achieved despite the pillars of, e.g., the lower deck exhibiting some bending, even bending that is not consistent across the array of pillars in the lower deck. To enable the alignment of vertically adjacent pillars, the reticle used for forming the pillars of one or more of the decks is tailored according to observed misalignment, or observed pillar bending, from one or more prior-fabricated structures. The tailored reticle—to be used to form the pillars of at least one of the decks-includes a pattern that defines a different "pillar density" (i.e., a different number of pillars, per unit of horizontal area of the respective structure or portion of the structure (e.g., array)) than the pillar density defined by another reticle to be used to form a vertically adjacent deck. The differing pillar densities enable the pillars of the vertically adjacent decks to be formed in alignment with one another, even if the pillars of one or more of the decks exhibit bending or other structural variation from a consistent, true vertical orientation.

As used herein, the term "density" when referring to a particular type of feature, means and includes the number of such features per unit of horizontal area of the structure that includes such features. For example, the term "pillar density" means and includes the number of pillars per unit of horizontal area of the structure (e.g., microelectronic device structure) that includes such pillars. As another example, the term "pattern feature density" means and includes the number of pattern features per unit of horizontal area of the structure (e.g., reticle) that includes such pattern features.

As described herein, the "spacing" and "density" of a structure feature (e.g., a pattern feature, a pillar, a conductive structure) relative to another such structure is with respect to at least lower elevations of such structures. For example, the pillars of an array (e.g., series) may be described as being "spaced" substantially evenly and/or having a substantially consistent pillar density if at least the base of each of the pillars is approximately an equal distance from its respective neighbor(s) as the other pillars of the array, even if bending of one or more of the pillars causes such one or more pillars to bend nearer to or further from its neighbors in upper elevations of the pillars.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along a horizontal plane (e.g., at a certain elevation, if identified), defining a maximum distance, along such plane, of the material or structure in question. For example, a "width" of a structure, that is at least partially hollow, is the horizontal dimension between outermost edges or sidewalls of the structure, such as an outer diameter for a hollow, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"-when referring to a parameter, property, or condition of one structure, material, feature, or portion thereof in comparison to the parameter, property, or condition of another such structure, material, feature, or portion of such same aforementioned structure, material, or feature-means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X vertical distance from a feature, despite the two structures being at different elevations along the feature. As another example, one structuring having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1A schematically illustrates an upper deck reticle 102, and FIG. 1B schematically illustrates a lower deck reticle 104, each of which may be used to form a microelectronic device structure 106 (e.g., a memory device structure, such as a 3D NAND memory device structure, for an apparatus (e.g., a memory device, such as a 3D NAND memory device), which may be included in a system), a hypothetical idealized illustration of which is shown in FIG. 1C. The cross-section of FIG. 1C corresponds to the reticle patterns along section lines C-C of FIG. 1A and FIG. 1B. More particularly, the upper deck reticle 102 of FIG. 1A may be used to form (e.g., etch) an array of openings for pillars 108 of an upper deck 110 of the microelectronic device structure 106 of FIG. 1C, and the lower deck reticle 104 of FIG. 1B may be used to form (e.g., etch) another array of openings for pillars 108 of the lower deck 112 of the microelectronic device structure 106 of FIG. 1C.

The openings for the pillars may be etched through stack structures 114 that are supported by one or more base structure(s) 116. The base structure(s) 116, below the stack structures 114, may include one or more substrates or other base materials (e.g., polysilicon structure(s), conductive structure(s)). For example, in some embodiments, the stack structures 114 (and the decks, including the lower deck 112) may be formed over a source material that may be formed of and include, e.g., a semiconductor material doped with one of P-type conductivity materials (e.g., polysilicon doped with at least one P-type dopant (e.g., boron ions)) or N-type conductive materials (e.g., polysilicon doped with at least one N-type dopant (e.g., arsenic ions, phosphorous ions, antimony ions)).

Each of the stack structures 114 includes vertically alternating insulative structures and other structures (e.g., sacrificial structures, conductive structures) arranged in tiers, as discussed further below. To form the microelectronic device structure 106, the stack structure 114 of the lower deck 112 may be formed over the base structure(s) 116 by, e.g., alternating formation (e.g., deposition) of insulative material(s) and other material(s) (e.g., sacrificial material(s), conductive material(s)). Then, the lower deck reticle 104 may be used to form (e.g., etch) pillar openings through the stack structure 114 of the lower deck 112, according to the pattern of pattern features (e.g., circles) defined by the lower deck reticle 104. For example, the lower deck reticle 104 may be used to form (e.g., etch) openings in a hardmask with the openings corresponding to the arrangement of pattern features (e.g., circles) of the lower deck reticle 104. The openings of the hardmask may then be formed (e.g., etched) into the stack structure 114 of the lower deck 112 to form pillar openings with the same respective arrangement of pillar openings corresponding to the arrangement of pattern features (e.g., circles) of the lower deck reticle 104. Within the pillar openings of the lower deck 112, the materials of the pillars 108 may then be formed.

The upper deck 110 may then be formed over the lower deck 112. For example, the stack structure 114 of the upper deck 110 may be formed over the stack structure 114 and the pillars 108 of the lower deck 112. Then, the upper deck reticle 102 may be used to form (e.g., etch) pillar openings through the stack structure 114 of the upper deck 110 (e.g., in a same manner as described above with respect to the lower deck 112), according to the arrangement of pattern features (e.g., circles) defined by the upper deck reticle 102. Within the pillar openings of the upper deck 110, the materials of the pillars 108 of the upper deck 110 may then be formed.

Ideally, the pillar openings (and therefore the resulting pillars 108) of the lower deck 112 would exhibit the same pattern defined by the lower deck reticle 104, and the pillar openings (and resulting pillars 108) of the upper deck 110 would exhibit the same pattern defined by the upper deck reticle 102. As such, if the upper deck reticle 102 and the lower deck reticle 104 define the same pattern of openings, as illustrated in FIG. 1A and FIG. 1B, and if the pillars 108 are truly vertically oriented, then the pillars 108 of the upper deck 110 would perfectly align with the pillars 108 of the lower deck 112. Therefore, along an interface 118 between the upper deck 110 and the lower deck 112, the lower surface of the pillars 108 of the upper deck 110 would fully align with the upper surfaces of the pillars 108 of the lower deck 112. Moreover, this perfect alignment of the pillars 108 of the upper deck 110 with the pillars 108 of the lower deck 112 would be consistent across the whole of the pillar array, regardless of where located along the horizontal dimensions of the microelectronic device structure 106. For example, it may be expected that the pillars 108 of both the upper deck 110 and the lower deck 112 may be truly vertical and in perfect alignment in both a left portion 120 and a right portion 122 of the microelectronic device structure 106, regardless of what additional features or structures may be disposed between, such as in an area adjacent line 124.

With such hypothetical, idealized fabrication of the microelectronic device structure 106, the pattern (e.g., arrangement of pattern features, such as the illustrate circles) of the upper deck reticle 102 may be the same pattern as that of the lower deck reticle 104. Therefore, the same reticle may be used as both the upper deck reticle 102 and the lower deck reticle 104. Moreover, the pattern of the formed arrays of pillars 108 may be the same, in horizontal cross-section, as the pattern (e.g., of circles) defined by each of the reticles (e.g., the upper deck reticle 102 and the lower deck reticle 104) at any elevation of the pillars 108 through the upper deck 110 and the lower deck 112. Accordingly, the upper surface of each of the pillars 108 wholly vertically overlaps with the lower surface of that pillar 108, and vertically adjacent pillars 108 also wholly vertically overlap or underlap one another. However, due to inherent limitations of microelectronic device fabrication, the hypothetical, idealized, perfectly vertical pillar structures may not be actualized. Apparatus and methods of embodiments, disclosed herein, nonetheless enable alignment of vertically adjacent pillars 108 in a multi-deck microelectronic device structure.

With more particular reference to the materials and substructures of the pillars 108 and the stack structures 114, subsequent figures illustrate, in enlarged views, embodiments of such materials and substructures, represented by boxes 126 of FIG. 1C. It should be noted that the particular locations for the boxes 126 illustrated in FIG. 1C, and in subsequent illustrations of microelectronic device structures, are merely representational for any area where one of the pillars 108 adjoins the stack structures 114. For example, the boxes 126 may be at an area of a memory cell of the microelectronic device structure 106. That is, strings of memory cells may vertically extend (e.g., in the Z-axis direction) through the stack structures 114, and the strings may each individually comprise multiple memory cells substantially aligned with one another along elevations of the stack structures 114. Horizontally adjacent strings of the memory cells may be separated from each other by, for example, the stack structures 114.

FIG. 2A through FIG. 2E illustrates, in enlarged views, memory cells 202 of a microelectronic device structure (e.g., the microelectronic device structure 106 of FIG. 1C), in accordance with some embodiments of the disclosure. FIG. 2A is a simplified enlarged view of boxes 126 of FIG. 1C, illustrating the memory cell 202 in the vicinity of at least one tier 204 of an insulative structure 206 vertically adjacent another structure 208 including and formed of at least one other material 210.

The insulative structures 206 may be formed of and include at least one electrically insulative material, such as one or more of the insulative material(s) discussed above (e.g., a dielectric oxide material, such as silicon dioxide). The insulative material(s) of the insulative structures 206 may be the same or different than other insulative material(s) of the memory cell 202 and/or of the microelectronic device structure (e.g., the microelectronic device structure 106 of FIG. 1C).

The other material 210 of the other structures 208 may be formed of and include at least one material of a different composition than the neighboring insulative structures 206. For example, the other material 210 of the other structures 208 may be formed of and include one or more conductive material, such as a conductive metal-based material (as described further below, e.g., in embodiments in which the microelectronic device structure (e.g., the microelectronic device structure 106 of FIG. 1C) is formed via a so-called "replacement gate" process), or such as a conductive semiconductor-based material (as described further below, e.g., in embodiments in which the microelectronic device structure (e.g., the microelectronic device structure 106 of FIG. 1C) is formed in a so-called "floating gate" configuration).

In embodiments in which the microelectronic device structure (e.g., the microelectronic device structure 106 of FIG. 1C) is formed by a replacement gate process, the materials of a respective deck of the stack structures 114 (FIG. 1C) may initially be formed by alternately forming (e.g., depositing) the insulative material(s) of the insulative structures 206 and sacrificial material(s) as the other material 210 of the other structures 208. For example, the sacrificial material(s) may be formed of and include, e.g., silicon nitride. After forming the stack structures 114 (FIG. 1C), of a first deck (e.g., the lower deck 112 (FIG. 1C)), with the insulative and sacrificial materials, the pillar openings may be formed (e.g., etched) using the lower deck reticle 104 (FIG. 1), as described above.

Pillar materials may be formed in the etched pillar openings to form the pillars 108. The pillar materials may (e.g., of each pillar 108 and, therefore, of each memory cell 202) may include at least an insulative material 212 and a channel material 214.

The insulative material 212 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 212 comprises silicon dioxide.

The channel material 214 may be formed of and include one or more of a semiconductor material (e.g., at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 214 includes amorphous silicon or polysilicon. In some embodiments, the channel material 214 comprises a doped semiconductor material.

The insulative material 212 may be horizontally adjacent the channel material 214. In some embodiments, such as that of FIG. 2A, a tunnel dielectric material 216 (also referred to as a "tunneling dielectric material") may be horizontally adjacent the channel material 214, a memory material 218 may be horizontally adjacent the tunnel dielectric material 216, a dielectric blocking material 220 (also referred to as a "charge blocking material") may be horizontally adjacent the memory material 218, and a dielectric barrier material 222 may be horizontally adjacent the dielectric blocking material 220.

The tunnel dielectric material 216 may be formed of and include a dielectric material through which charge tunneling can be performed under suitable electrical bias conditions, such as through hot-carrier injection or by Fowler-Nordheim tunneling induced charge transfer. The tunnel dielectric material 216 may be formed of and include one or more of silicon oxide, silicon nitride, silicon oxynitride, dielectric metal oxides (e.g., aluminum oxide and hafnium oxide), dielectric metal oxynitride, dielectric metal silicates, alloys thereof, and/or combinations thereof. In some embodiments, the tunnel dielectric material 216 comprises silicon dioxide or silicon oxynitride.

The memory material 218 may comprise a charge trapping material or a conductive material. The memory material 218 may be formed of and include one or more of silicon nitride, silicon oxynitride, polysilicon (e.g., doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 218 comprises silicon nitride.

The dielectric blocking material 220 may be formed of and include a dielectric material such as, for example, one or more of an oxide (e.g., silicon dioxide), a nitride (e.g., silicon nitride), and an oxynitride (e.g., silicon oxynitride), or another material. In some embodiments, the dielectric blocking material 220 comprises silicon oxynitride.

In some embodiments the tunnel dielectric material 216, the memory material 218, and the dielectric blocking material 220 together may form a structure configured to trap a charge, such as, for example, an oxide-nitride-oxide (ONO) structure. In some such embodiments, the tunnel dielectric material 216 comprises silicon dioxide, the memory material 218 comprises silicon nitride, and the dielectric blocking material 220 comprises silicon dioxide.

The dielectric barrier material 222 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride).

In this and/or other embodiments of the disclosure, the pillar materials may be sequentially formed (e.g., deposited) in the pillar openings (e.g., the openings formed according to the pattern defined by a reticle) from outer-most material (e.g., the dielectric barrier material 222, according to the embodiment of FIG. 2A) to inner-most material (e.g., the insulative material 212).

After forming the pillar materials (and therefore the pillars 108) of the lower deck 112 (FIG. 1C), the other stack structure 114 of the upper deck 110 (FIG. 1C) may be formed with alternating insulative material(s) of the insulative structures 206 and sacrificial material(s) as the other material 210 of the other structures 208. Then, the pillar openings for the upper deck 110 may be formed (e.g., etched) using the upper deck reticle 102 (FIG. 1A), as described above, and additional portions of the pillar materials may be formed in the pillar openings of the upper deck 110 (FIG. 1C).

After forming the pillars 108 of both the lower deck 112 (FIG. 1C) and the upper deck 110 (FIG. 1C), the sacrificial material(s) (e.g., the other material 210), and therefore the other structures 208 may be substantially removed (e.g., exhumed), and as illustrated in FIG. 2B replaced with one or more conductive material(s) 224 to form memory cells 202' of the microelectronic device structure (e.g., the microelectronic device structure 106 (FIG. 1C)) with vertically alternating insulative structures 206 and other structures 208, wherein the other structures 208 are formed as conductive structures 226. Accordingly, the microelectronic device structure (e.g., the microelectronic device structure 106 of FIG. 1C) may be formed by a replacement gate process, wherein FIG. 2A and FIG. 2B illustrate various stages in the method of fabrication.

In other embodiments, in which the microelectronic device structure (e.g., the microelectronic device structure 106 of FIG. 1C) is formed with "floating gates," the other material(s) 210 of FIG. 2A may be formed initially as the conductive material(s) 224 with one or more semiconductive material (e.g., doped polysilicon). Therefore, the other structures 208 may be free, or substantially free, of sacrificial material, and the removal (e.g., exhumation) and replacement of materials may be avoided after forming the pillars 108. Accordingly, the microelectronic device structure (e.g., the microelectronic device structure 106 of FIG. 1C) may be formed by a floating gate process, wherein FIG. 2B illustrates a stage in the method of fabrication, and the conductive material(s) 224 is formed of and includes polysilicon directly vertically adjacent neighboring insulative structures 206.

Whether the memory cells 202 (FIG. 2A), and therefore the microelectronic device structures (e.g., the microelectronic device structures 106 (FIG. 1C)), are formed with replacement gates (e.g., to form the memory cells 202' (FIG. 2B)) or with floating gates, each of the formed memory cells 202 (e.g., the memory cell 202 of FIG. 2A, the memory cell 202' of FIG. 2B, or the memory cell of any others of FIG. 2C through FIG. 2E) may be located at an intersection of one of the other structures 208 (e.g., of one of the tiers 204 of the stack structure 114 (FIG. 1C)) and one of the pillars 108 vertically extending through the stack structure 114 (FIG. 1C), the pillars 108 including at least the channel material 214.

In some embodiments, the formed memory cells 202 (FIG. 2A) (e.g., memory cells 202' (FIG. 2B)) include the dielectric channel material 214 horizontally interposed between the insulative material 212 and the tiers 204 of the stack structures 114 (FIG. 1C). In some embodiments of memory cells, such as with the memory cell 202' of FIG. 2B, the dielectric barrier material 222 may be horizontally adjacent one of the levels of the other structures 208 (e.g., one of the conductive structures 226) of one of the tiers 204 of the stack structure 114. The channel material 214 may be horizontally interposed between the insulative material 212 and the tunnel dielectric material 216; the tunnel dielectric material 216 may be horizontally interposed between the channel material 214 and the memory material 218; the memory material 218 may be horizontally interposed between the tunnel dielectric material 216 and the dielectric blocking material 220; the dielectric blocking material 220 may be horizontally interposed between the memory material 218 and the dielectric barrier material 222; and the dielectric barrier material 222 may be horizontally interposed between the dielectric blocking material 220 and the level of conductive structure 226.

Figures 2C, 2D:
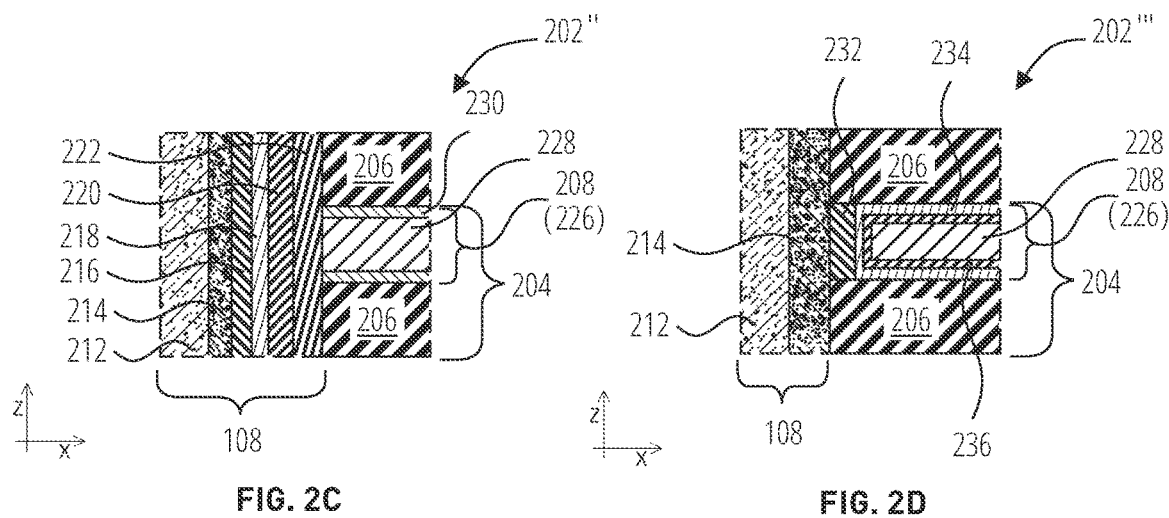

Although the memory cells (e.g., the memory cell 202 of FIG. 2A and the memory cell 202' of FIG. 2B) have been described and illustrated as having a particular structure and composition, the disclosure is not so limited. FIG. 2C is a simplified, cross-sectional, elevational, enlargement of boxes 126 of FIG. 1C, illustrating a memory cell 202" in accordance with embodiments of the disclosure, wherein the microelectronic device structure (e.g., the microelectronic device structure 106 of FIG. 1C) is formed by a replacement gate process. One or more (e.g., all) of the memory cells 202 of FIG. 2A and/or the memory cells 202' of FIG. 2B may be replaced with the memory cell 202" of FIG. 2C. With reference to FIG. 2C, the memory cell 202" may include multiple conductive materials within the conductive structures 226 (e.g., within the other structures 208) of the tiers 204. For example, the conductive structures 226 may include a conductive material 228 within a conductive liner material 230. During the replacement gate process, after removal (e.g., exhumation) of the sacrificial material of the other structures 208, the conductive liner material 230 may be formed first, on exposed surfaces of the vertically adjacent insulative structures 206, and then the conductive material 228 formed vertically between portions of the conductive liner material 230. The conductive liner material 230 may comprise, for example, a seed material enabling the subsequent formation of the conductive material 228. The conductive liner material 230 may be formed of and include, for example, a metal (e.g., titanium, tantalum), a metal nitride (e.g., tungsten nitride, titanium nitride, tantalum nitride), or another material. In some embodiments, the conductive liner material 230 comprises titanium nitride.

In other embodiments, the conductive liner material 230 is not included, and the conductive material may be formed directly adjacent to and in physical contact with the insulative structures 206, such with the conductive material(s) 224 of the memory cell 202' of FIG. 2B, as discussed above.

With reference to FIG. 2D, illustrated in simplified cross-section is a memory cell 202'" in accordance with additional embodiments of the disclosure. One or more (e.g., all) of the memory cell 202 of FIG. 2A, the memory cell 202' of FIG. 2B, and/or the memory cell 202" of FIG. 2C may be replaced with the memory cell 202'" of FIG. 2D. The memory cell 202'" may include the insulative material 212 and the channel material 214, as described above, and may further include a first dielectric material 232 (e.g., a tunnel dielectric material) horizontally adjacent the channel material 214. A second dielectric material 234 (e.g., a charge trapping material) may be horizontally adjacent the first dielectric material 232, and a third dielectric material 236 (e.g., a charge blocking material) may be horizontally adjacent the second dielectric material 234 and the conductive material 228. In some embodiments, the first dielectric material 232 comprises an oxide material (e.g., silicon dioxide), the second dielectric material 234 comprises a nitride material (e.g., silicon nitride), and the third dielectric material 236 comprises an oxide material (e.g., silicon dioxide). For clarity, in FIG. 2D, the conductive liner material 230 (FIG. 2C) is not illustrated around the conductive material 228; however, in some embodiments, the memory cell 202'" may further include such conductive liner material 230.

Figure 2E:
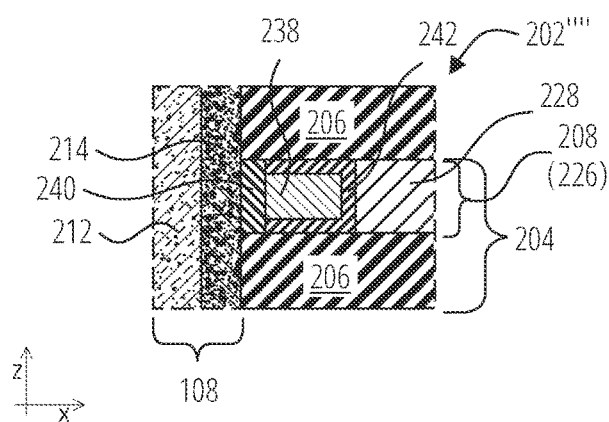

With reference to FIG. 2E, illustrated in simplified cross-section is a memory cell 202"", in accordance with additional embodiments of the disclosure, wherein the memory cell 202"" may be configured as a so-called "floating gate" memory cell. One or more (e.g., all) of the memory cell 202 of FIG. 2A, the memory cell 202' of FIG. 2B, the memory cell 202" of FIG. 2C, and/or the memory cell 202'" may be replaced with the memory cell 202"" of FIG. 2E. In addition to the insulative material 212 and the channel material 214, the memory cell 202"" may include an electrode structure 238, which may be referred to as a "floating gate." The electrode structure 238 may comprise an electrically conductive material, such as, e.g., polysilicon and/or one or more of the materials described with respect to conductive material 228 (e.g., tungsten). The memory cell 202"" may further include a dielectric material 240, which may be referred to as a "gate dielectric" material. The dielectric material 240 may comprise, for example, one or more of the materials described above with reference to the tunnel dielectric material 216. In some embodiments, the dielectric material 240 comprises silicon dioxide. Another dielectric material 242 may be located around portions of the electrode structure 238. The other dielectric material 242 may comprise one or more of the materials described above with reference to the tunnel dielectric material 216. In some embodiments, the other dielectric material 242 has the same material composition as the dielectric material 240. The other dielectric material 242 may be located between the electrode structure 238 and the conductive material 228. For clarity, in FIG. 2E, the conductive liner material 230 (FIG. 2C) is not illustrated around the conductive material 228. However, it will be understood that in some embodiments, the memory cell 202"" may include the conductive liner material 230.

With returned reference to FIG. 1C, it may be intended that-using the upper deck reticle 102 of FIG. 1A and the lower deck reticle 104 of FIG. 1B-forms each of the pillars 108 of the upper deck 110 and the lower deck 112, respectively, with identical and consistent form in a true vertical orientation, as illustrated. However, differences in neighboring material stresses due to, e.g., differences in neighboring structures or the lack of neighboring structures (e.g., near edges of a device structure), may result in some of the pillars 108 experiencing different material strains than experienced by others of the pillars 108. For example, with reference to FIG. 3, pillars in regions along an edge (e.g., periphery) of a die 302 (e.g., in left peripheral edge region 304, in right peripheral edge region 306), may exhibit more bending than do pillars further from the edge.

Pillar bending may not necessarily be isolated to only peripheral edge regions of a die (e.g., the die 302). For example, with reference to FIG. 4, one or more portions of the die or other device structure may include—in addition to pillar array regions (e.g., in left portion 120) regions with features other than pillar arrays, such as a staircase region 402 with at least one staircase structure 404 having steps 406 defined by lateral ends of at least some of the tiers 204 (FIG. 2A through FIG. 2E) of the stack structures 114 of the decks (e.g., the upper deck 110 and/or the lower deck 112). In some embodiments, each step 406 of the staircase structure 404 may be defined by lateral ends of one of the insulative structures 206 (FIG. 2) and one of the other structures 208 (FIG. 2A through FIG. 2E) (e.g., one of the conductive structures 226 (FIG. 2B through FIG. 2E)). However, the disclosure is not so limited, and the steps 406 may be defined by more than one of the insulative structures 206 and one of the other structures 208 (e.g., one of the conductive structures 226).

Figure 3:
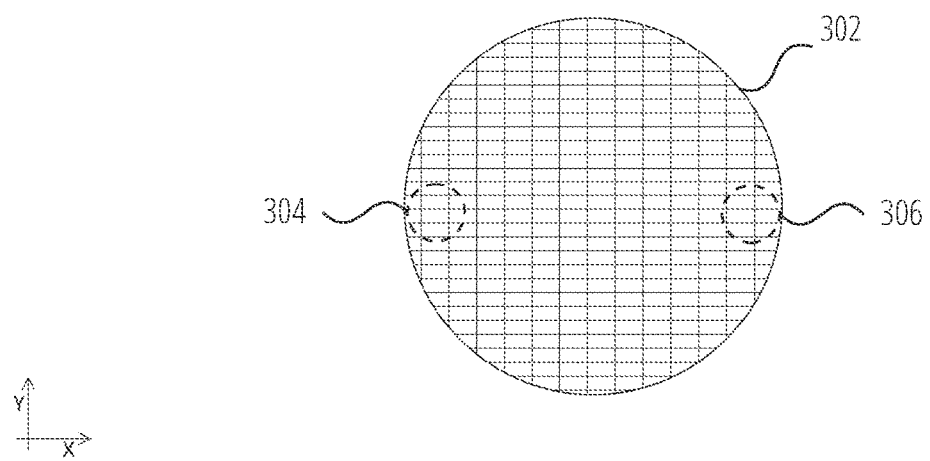
FIG. 3 is a top plan, schematic illustration of a die on which have been fabricated microelectronic device structures, in accordance with embodiments of the disclosure.
Figure 4:
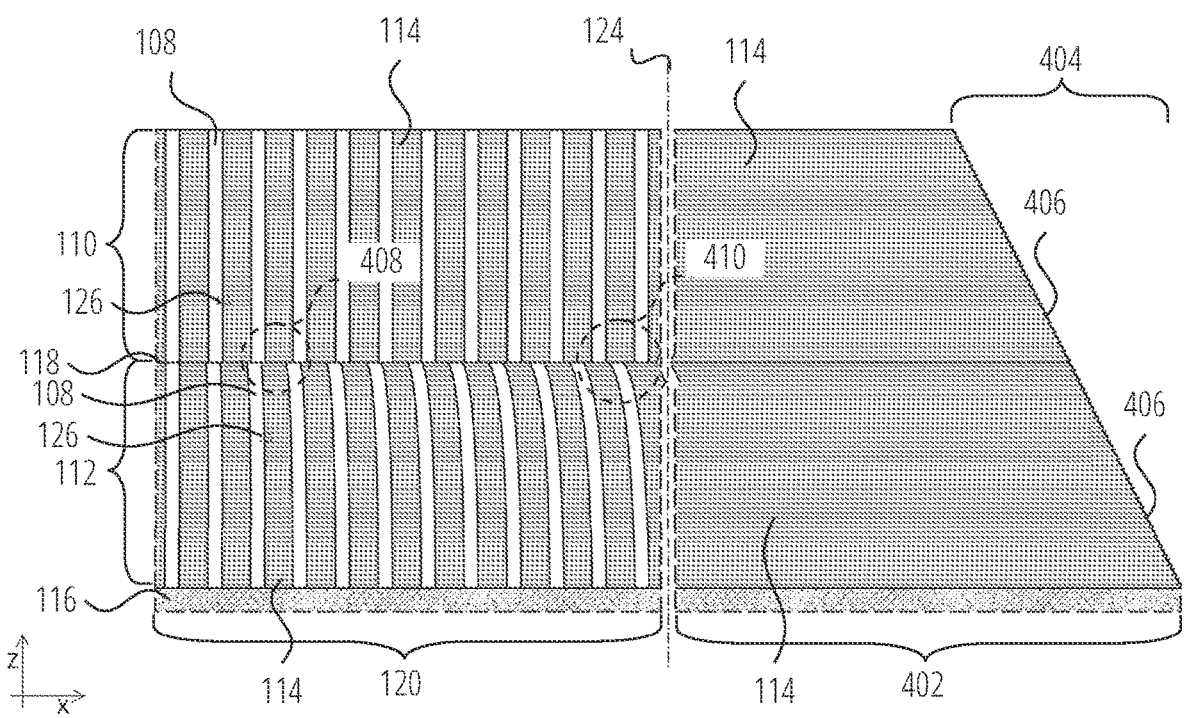
FIG. 4 is a cross-sectional, elevational, schematic illustration of a microelectronic device structure, wherein a memory cell region with multiple decks of pillars is adjacent a staircase region.

Due to inherent material residual stresses or other imbalances experienced by the pillars 108 nearest the staircase region 402 (or other non-pillar-array features of the die 302 (FIG. 3), e.g., the peripheral edge of the die 302)—compared to pillars 108 further from the staircase region 402 (or other non-pillar-array features of the die 302 (FIG. 3)) and more central to the array of pillars—may exhibit a greater amount of bending. For example, as illustrated in FIG. 4, pillars 108 more distal from the staircase region 402 may exhibit less bending (e.g., through the vertical height of the pillars 108) compared to pillars 108 more proximal to the staircase region 402. Subsequently formed pillars, such as the pillars 108 of the upper deck 110, may therefore lead to the pillars 108 of the upper deck 110 being misaligned relative to the pillars 108 of the lower deck 112. Moreover, the amount of misalignment between respective, vertically adjacent pillars 108 may vary over the width of the pillar array portion. For example, vertically adjacent pillars 108 distal from the staircase region 402 may exhibit less misalignment, e.g., at area 408, compared to vertically adjacent pillars 108 proximal to the staircase region 402, e.g., at area 410. This variation in amount of pillar bending, and therefore amount of pillar misalignment along the interface 118 between the upper deck 110 and the lower deck 112, increases the challenge of resolving pillar misalignment across the whole of the pillar array and, e.g., across the whole of the die 302 (FIG. 3).

The apparatus and methods disclosed herein, in accordance with embodiments of the disclosure, may ensure substantial alignment, of vertically adjacent pillars 108, along interfaces (e.g., the interface 118) of multi-deck microelectronic device structures, even when some of the pillars 108 exhibit a variety of pillar bending amounts through a portion of the pillar array.

In the figures discussed further below, left portions 120 and right portions 122 of microelectronic device structures are illustrated on respective sides of a line 124, wherein the line 124 may represent a non-pillar-array type feature (e.g., a staircase region, such as the staircase region 402 of FIG. 4), and/or the outer sides of the illustrated structures (e.g., the sides distal from the line 124), may alternatively represent a non-pillar-array type feature (e.g., an edge of a die, such as a peripheral edge of the die 302 of FIG. 3). In some embodiments, the line 124 and/or distal edges of the illustrated structures may otherwise represent a continuation of the pillar array that includes the illustrated pillars 108. In some embodiments, the line 124 may represent a centerline of the die 302 (FIG. 3) on which the illustrated structures are fabricated.

With reference to FIG. 5A through FIG. 5C, the upper deck reticle 102 and the lower deck reticle 104 may be used to form arrays of pillars 108 of a multi-deck structure. The upper deck reticle 102 and the lower deck reticle 104 may each define a pattern of substantially evenly spaced pattern features (e.g., circles), e.g., spaced a first distance 502, for pillar openings to be formed. In some embodiments, the upper deck reticle 102 and the lower deck reticle 104 may define the same pattern and/or may be the same physical reticle apparatus that can be used for each of the decks of a microelectronic device structure 504 to be formed. Whether the same apparatus or different apparatus, the lower deck reticle 104 may be used to form the pillars 108 of the lower deck 112, and the upper deck reticle 102 may be used to form the pillars 108 of the upper deck 110 of the microelectronic device structure 504.

It may be that some of the pillars 108 of the pillar array of the lower deck 112, such as the pillars 108 nearest an edge of the array and/or nearest a non-pillar-feature (e.g., which may be represented by line 124) may exhibit a greater amount of pillar bending, e.g., in upper elevations of the pillar 108, than pillars 108 furthest from such edge or other feature (e.g., furthest from line 124).

The subsequently formed pillars 108 of the upper deck 110 may therefore be more aligned in some areas (e.g., area 408) than in others (e.g., area 410), and the amount of misalignment may vary (e.g., increase, decrease, or otherwise change in amount) across the respective portion (e.g., the left portion 120, the right portion 122). Therefore, even if the lower elevations of the pillars 108 of the lower deck 112 are spaced distance 502, in accordance with the lower deck reticle 104, and even if at least the lower elevations of the pillars 108 of the upper deck 110 are spaced distance 502, in accordance with the upper deck reticle 102, the bottom surfaces of the pillars 108 of the upper deck 110 may or may not be in alignment with the upper surfaces of the pillars 108 of the lower deck 112 with which there was intended to be a surface-to-surface contact along the interface 118.

By fabricating structures such as the microelectronic device structure 504 of FIG. 5C one or more times, using "initial" reticles (e.g., upper deck reticle 102, lower deck reticle 104), the amount and variation of misalignment across the interface 118, may be observed and learned. Based on the observed and learned misalignment information, one or more "tailored" reticles may be designed, fabricated, and/or otherwise provided for re-fabricating the microelectronic device structure with vertical alignment of the pillars along the interface 118, even with some of the pillars of one or more of the decks of the multi-deck structure, exhibiting a variety of bending amounts.

In some embodiments, all of the decks of the multi-deck structure may be fabricated and the resulting pillar misalignment observed, using the initial reticles, before tailored reticles are designed, fabricated, and/or otherwise provided to fabricate a new embodiment of the multi-deck structure with improved alignment of vertically adjacent pillars. In other embodiments, fewer than all of the decks of the multi-deck structure may be fabricated and the resulting pillar misalignment observed, using the initial reticle(s), before tailored reticles are designed, fabricated, and/or otherwise provided to fabricate the multi-deck structure with improved pillar alignment. For example, both the lower deck 112 and the upper deck 110 of the microelectronic device structure 504 of FIG. 5C may be fabricated, one or more times, and the pillar misalignment measured across whatever portions (e.g., the left portion 120, the right portion 122) of the microelectronic device structure 504 exhibit pillar bending, with the misalignment measurement being, e.g., a lateral distance along the interface 118 between a lateral center of an upper surface of each pillar 108 of the lower deck 112 and a lateral center of a lower surface of a respective pillar 108 of the upper deck 110. In other embodiments, the lower deck 112 may be fabricated, one or more times, and the pillar misalignment measured across the portions (e.g., the left portion 120, the right portion 122) exhibiting pillar bending, without yet fabricating the upper deck 110. In such embodiments, the misalignment measurement may be based on, e.g., a lateral distance along the interface 118 between a lateral center of an upper surface of each pillar 108 of the lower deck 112 and the intended location for the lateral center of the pillar 108 based on the distance 502 defined by the initial reticle used to form the pillar array of the lower deck 112 (e.g., the lower deck reticle 104).

After fabricating at least one deck (e.g., the lower deck 112) of the multi-deck structure, e.g., the microelectronic device structure 504, and observing and determining the pillar misalignment across at least whatever portion(s) exhibit pillar bending, the reticle pattern for at least one of the decks—whether a deck in which pillars exhibit pillar bending or one in which pillars do not exhibit pillar bending—may be redesigned with a pattern (e.g., for pillar openings) tailored to account for the observed pillar misalignment.

For example, based on the observed pillar misalignment from fabricating, one or more times, the microelectronic device structure 504 of FIG. 5C, a tailored upper deck reticle 602, illustrated in FIG. 6A, may be designed, fabricated, or otherwise provided so that, upon re-refabricating the pillars 108 of the lower deck 112 using the lower deck reticle 104, fabricating the pillars 108 of the upper deck 110 using the tailored upper deck reticle 602 enables consistent pillar-to-pillar alignment along the interface 118, as illustrated in FIG. 6C. More particularly, because the pillars 108 of the lower deck 112 exhibit pillar bending away from line 124, with the pillar bending consistently decreasing across the left portion 120 and the right portion 122 the further the pillar 108 is from the line 124, compressing the arrangement of pattern features toward outer edges of the tailored upper deck reticle 602—such that the pattern features are substantially evenly spaced by a distance 604 that is less than the evenly spaced distance 502 of the lower deck reticle 104—the pillars 108 of the upper deck 110 may be formed with consistent alignment along the interface 118 to the pillars 108 of the lower deck 112, as indicated at areas 608. Notably, at the lesser distance 604 compared to distance 502, the pattern features of the tailored upper deck reticle 602 are more densely arranged (e.g., compressed) relative to the pattern features of the lower deck reticle 104. Therefore, along the horizontal area of the upper deck 110 that includes the array of pillars 108, the upper deck 110 has a greater pillar density compared to the pillar density of the horizontal area of the lower deck 112 that includes a corresponding array of pillars 108.

In other embodiments, rather than—or in addition to— tailoring the pattern of the lower deck reticle, the pattern of the upper deck reticle may be tailored to accommodate for pillar bending in the lower deck 112. For example, with reference to FIG. 7A through FIG. 7C, the same upper deck reticle 102 may be used along with a tailored lower deck reticle 702—defining an expanded arrangement of pattern features, substantially evenly spaced at distance 704 that is greater than the distance 502 used for the upper deck reticle 102—to form a microelectronic device structure 706 with aligned vertically adjacent pillars 108. Accordingly, the pattern features of the tailored lower deck reticle 702 may be less densely arranged that the pattern features of the upper deck reticle 102. Correspondingly, along the horizontal area of the lower deck 112 that includes the array of pillars 108, the lower deck 112 has a lower pillar density compared to the pillar density of the horizontal area of the upper deck 110 that includes the corresponding array of pillars 108.

With reference to FIG. 8A through FIG. 8C, in some embodiments, the observed pillar bending using initial reticles (e.g., upper deck reticle 102 of FIG. 8A, lower deck reticle 104 of FIG. 8B) may be more inwardly directed, toward line 124 (e.g., toward a non-array feature of the apparatus), as in a microelectronic device structure 802 of FIG. 8C, than outwardly directed as in FIG. 5C. Nonetheless, from observing pillar misalignment resulting from fabricating, one or more times, the microelectronic device structure 802, one or more of the reticles may be redesigned, re-fabricated, or otherwise provided to enable future fabrication of the multi-deck structure with improved pillar alignment.

As illustrated in the microelectronic device structure 802 of FIG. 8C, lower elevations of each of the pillars 108 may be substantially evenly spaced at distance 502, corresponding to the distance 502 defined by the initial reticles (e.g., the upper deck reticle 102 of FIG. 8A, the lower deck reticle of FIG. 8B). However, the pillars 108 of, e.g., the lower deck 112 may exhibit significant pillar bending in some areas (e.g., area 408) and less pillar bending in other areas (e.g., area 410), which may lead to vertically adjacent pillars 108 being misaligned (e.g., at area 410) or aligned with unintended pillars 108 of the vertically adjacent deck (e.g., at area 408).

To enable improved pillar-to-pillar alignment of vertically adjacent pillars—without necessitating amelioration of the pillar bending exhibited by the pillars 108 of the lower deck 112—a tailored upper deck reticle 902, as illustrated in FIG. 9A, may be designed, fabricated, or otherwise provided to tailor the arrangement of the pattern features thereof—and therefore the resulting arrangement and density of the pillars 108 of the upper deck 110, to that which is defined by and results from use of the lower deck reticle 104 (FIG. 9B) to form the pillars 108 of the lower deck 112. For example, the tailored upper deck reticle 902 may define an arrangement of pattern features (e.g., circles) with progressing density. That is, pattern features nearest outer edges of the tailored upper deck reticle 902 may be less densely spaced (e.g., at distance 906, which is greater than distance 502 of the lower deck reticle 104) than pattern features furthest from the outer edges of the tailored upper deck reticle 902, which may be more densely spaced (e.g., at distance 904, which is less than distance 502 of the lower deck reticle 104). Using such tailored upper deck reticle 902 to form the pillars 108 of the upper deck 110, the upper deck 110 may have a pillar array with progressing pillar density, increasing in pillar density with lateral distance relative to the line 124. Nonetheless, because the progressed pattern feature density of the tailored upper deck reticle 902 is tailored to the pillar bending exhibited by the pillars 108 of the lower deck 112—based on the prior-fabricated and prior-observed microelectronic device structure 802 of FIG. 8C—a resulting microelectronic device structure 908 (FIG. 9C), fabricated using the tailored upper deck reticle 902 includes aligned, vertically adjacent pillars 108 along the interface 118 between the upper deck 110 and the lower deck 112 (see areas 608), even though lower elevations of the pillars 108 of the lower deck 112 are substantially evenly spaced at distance 502 while upper elevations of the pillars 108 of the lower deck 112 (and at least the lower elevations of the pillars 108 of the upper deck 110) are progressively more densely spaced, relative to the line 124, including spacing at distance 904 proximal to the line 124 and spacing at distance 906 distal from the line 124.

With reference to FIG. 10A through FIG. 10C, illustrated is the upper deck reticle 102, which may or may not be specifically tailored in light of prior structure fabrications; and a tailored lower deck reticle 1002 with a progression of pattern feature density that increases toward outer edges of the tailored lower deck reticle 1002. Therefore, pattern features nearer outer edges of the tailored lower deck reticle 1002 may be at a distance 1004 that is less than the distance 502 at which the pattern features of the upper deck reticle 102 are substantially evenly spaced, while pattern features further from outer edges of the tailored lower deck reticle 1002 may be at a distance 1006 that is greater than the distance 502. Using the tailored lower deck reticle 1002 of FIG. 10B and the upper deck reticle 102 of FIG. 10A, a microelectronic device structure 1008 of FIG. 10B may be fabricated with improved alignment of vertically adjacent pillars 108, even with the pillars 108 of the lower deck 112 exhibiting varying degrees of pillar bending and a progression of pillar density (e.g., at least in lower elevations of the lower deck 112) with increased lateral distance from the line 124, and even with the pillars 108 of the upper deck 110 being substantially evenly spaced and of consistent pillar density throughout the pillar array of the upper deck 110.

With reference to FIG. 11A through FIG. 11C, illustrated is a microelectronic device structure 1102, which may be fabricated using the upper deck reticle 102 and the lower deck reticle 104 with substantially even pattern feature density, at distance 502. From one or more fabrications of the microelectronic device structure 1102 of FIG. 11C, it may be observed that pillar bending and pillar misalignment gradually increases, in upper elevations of the pillars 108 of the lower deck 112, with increased distance from the line 124 (see area 408 compared to area 410), even though lower elevations of the pillars 108 of both the lower deck 112 and the upper deck 110 may be substantially evenly spaced at distance 502.

With reference to FIG. 12A through FIG. 12C, illustrated is a tailored upper deck reticle 1202 with a compressed pattern feature density, relative to that of the lower deck reticle 104. For example, the pattern features of the tailored upper deck reticle 1202 may be compressed—relative to the arrangement of pattern features in the initial reticle (e.g., the upper deck reticle 102 of FIG. 11A) and/or relative to the arrangement of pattern features in the lower deck reticle 104—away from outer edges of the tailored upper deck reticle 1202, with substantially even spacing at distance 1204, which may be less than the distance 502 at which the pattern features of the lower deck reticle 104 are substantially evenly spaced. Using the tailored upper deck reticle 1202 of FIG. 12A and the lower deck reticle 104 of FIG. 12B, a microelectronic device structure 1206 may be fabricated with improved alignment of vertically adjacent pillars 108, even with the pillars 108 of the lower deck 112 exhibiting varying degrees of pillar bending and a lower pillar density (e.g., at least in lower elevations of the pillar array portion of the lower deck 112) compared to the pillars 108 of the upper deck 110.

With reference to FIG. 13A through FIG. 13C, illustrated is the upper deck reticle 102 (e.g., the initial reticle used to form at least the upper deck 110 of the microelectronic device structure 1102 of FIG. 11C, from which pillar misalignment was observed and measured), and a tailored lower deck reticle 1302 with an expanded arrangement of pattern features, which may be substantially evenly spaced at a distance 1304 that may be greater than the distance 502 at which the pattern features of the upper deck reticle 102 are substantially evenly spaced. Thus, the pattern feature density of the tailored lower deck reticle 1302 is less than the pattern feature density of the upper deck reticle 102. Using the upper deck reticle 102 of FIG. 13A and the tailored lower deck reticle 1302 of FIG. 13B, a microelectronic device structure 1306 may be fabricated with improved alignment of vertically adjacent pillars 108, even with the pillars 108 of the lower deck 112 exhibiting varying degrees of pillar bending and a lower pillar density (e.g., at least in lower elevations of the pillar array portion of the lower deck 112) compared to the pillars 108 of the upper deck 110.

With reference to FIG. 14A through FIG. 14C, using the upper deck reticle 102 and the lower deck reticle 104 with pattern features substantially evenly spaced at distance 502, a resulting microelectronic device structure 1402 may exhibit varying amounts of pillar bending and misalignment across the pillar array portions of the lower deck 112, such as with outwardly bending pillars 108.

Figures 15A, 15B, 15C:
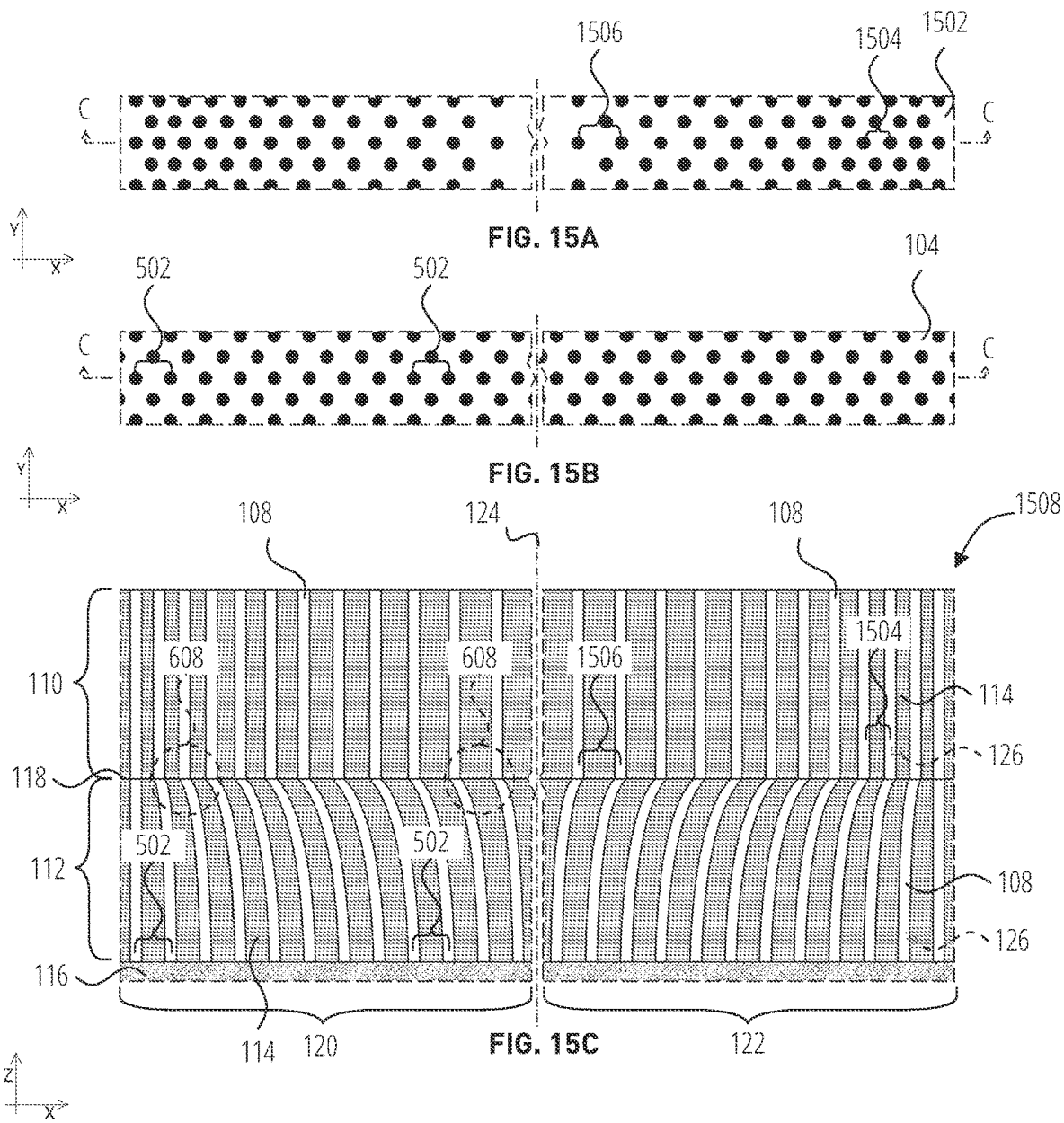
FIG. 15A and FIG. 15B are partial, plan, schematic illustrations of reticle patterns.
FIG. 15C is a cross-sectional, elevational, schematic illustration of a microelectronic device structure, wherein the reticle pattern of FIG. 15A is tailored according to the observed pillar misalignment of the microelectronic device structure of FIG. 14C, wherein the pillars of an upper deck of the structure of FIG. 15C are formed using the reticle pattern of FIG. 15A, and wherein pillars of a lower deck of the structure of FIG. 15C are formed using the reticle pattern of FIG. 15B, the microelectronic device structure exhibiting alignment of the pillars of the upper deck to the pillars of the lower deck, in accordance with embodiments of the disclosure.

With reference to FIG. 15A through FIG. 15C, a tailored upper deck reticle 1502 may be configured—in light of the observed pillar misalignment from fabricating the microelectronic device structure 1402 of FIG. 14C one or more times—with an arrangement of pattern features that is progressively more density nearer outer edges of the tailored upper deck reticle 1502. For example, pattern features nearer an outer edge of the tailored upper deck reticle 1502 may be spaced at a lateral distance 1504 that is less than the distance 502 for substantially evenly spacing pattern features in the lower deck reticle 104, while pattern features further the outer edge of the tailored upper deck reticle 1502 may be spaced at a lateral distance 1506 that is greater than the distance 502 used in the lower deck reticle 104. Using the tailored upper deck reticle 1502 of FIG. 15A and the lower deck reticle 104 of FIG. 15B, a microelectronic device structure 1508 may be fabricated with improved alignment of vertically adjacent pillars 108, even with the pillars 108 of the lower deck 112 exhibiting varying degrees of pillar bending and a substantially consistent pillar density and substantially even pillar spacing (e.g., at least in lower elevations of the pillar array portion of the lower deck 112) compared to the pillars 108 of the upper deck 110 being progressively less densely arranged proximal to the line 124 than distal from the line 124.

Figure 16A:
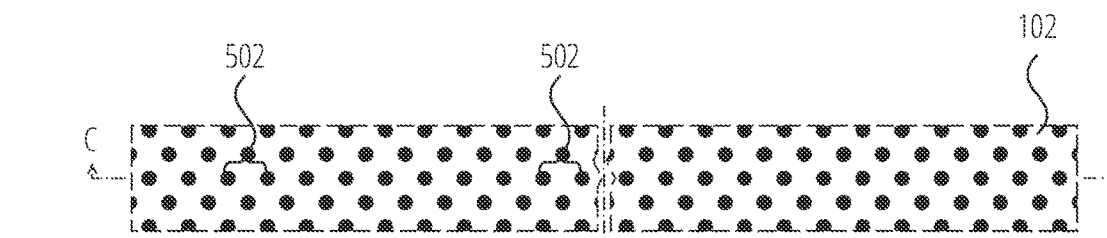
FIG. 16A and FIG. 16B are partial, plan, schematic illustrations of reticle patterns.
Figure 16B:
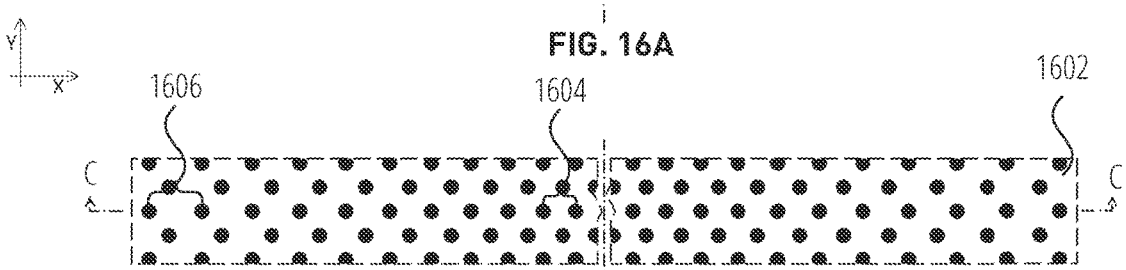
Figure 16C:
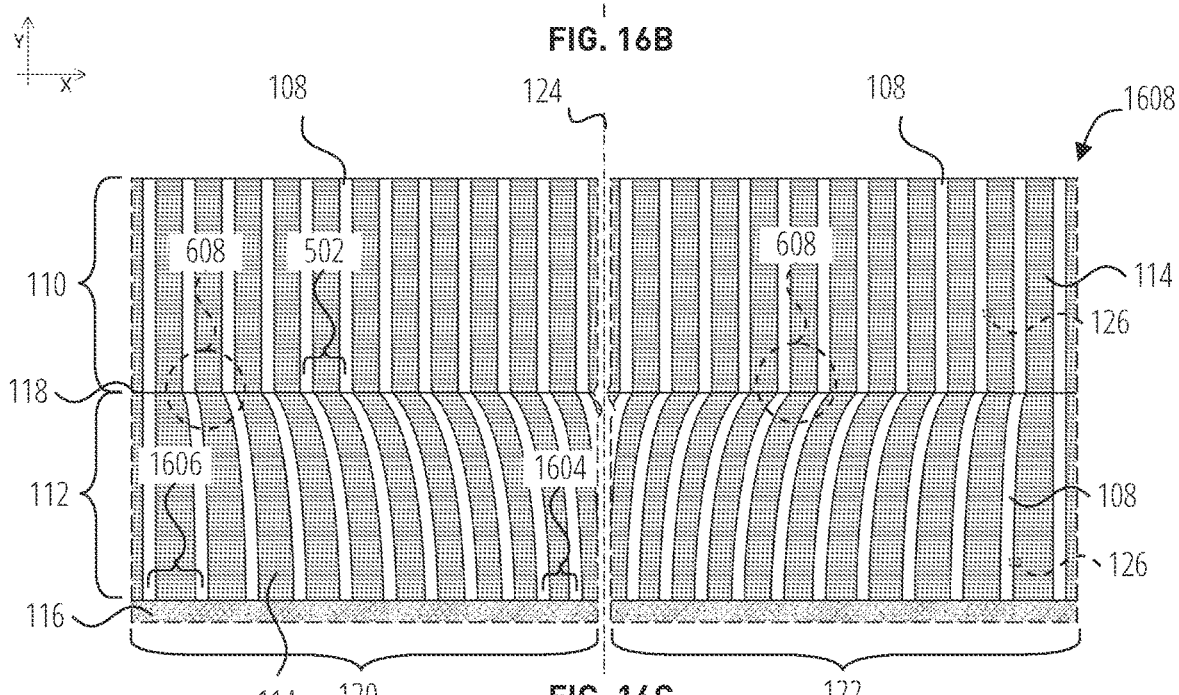
FIG. 16C is a cross-sectional, elevational, schematic illustration of a microelectronic device structure, wherein the reticle pattern of FIG. 16B is tailored according to the observed pillar misalignment of the microelectronic device structure of FIG. 14C, the pillars of an upper deck of the structure of FIG. 16C are formed using the reticle pattern of FIG. 16A, and wherein pillars of a lower deck of the structure of FIG. 16C are formed using the reticle pattern of FIG. 16B, the microelectronic device structure exhibiting alignment of the pillars of the upper deck to the pillars of the lower deck, in accordance with embodiments of the disclosure.

Alternatively or additionally, the observed pillar misalignment from the microelectronic device structure 1402 of FIG. 14C may, additionally or alternatively, be ameliorated—with reference to FIG. 16A through FIG. 16C—by tailoring the pattern features for a tailored lower deck reticle 1602, with a progressively expanding pattern feature density, with decreased lateral distance from a respective outer edge of the tailored lower deck reticle 1602, even while leaving the pattern features of the upper deck reticle 102 substantially evenly spaced at distance 502. For example, in the tailored lower deck reticle 1602, pattern features further from the outer edge may be spaced at a distance 1604 that is less than distance 502, while pattern features nearer to the outer edge may be spaced at a distance 1606 that is greater than distance 502. A resulting microelectronic device structure 1608 may have improved pillar alignment along the interface 118 between the lower deck 112 and the upper deck 110, even with the pillar density in the lower deck 112 varying (e.g., at least in lower elevations of the pillars 108 of the lower deck 112)—with progressively lower pillar density with increased lateral distance from the line 124—across the pillar array of the lower deck 112, while the pillar density in the upper deck 110 is substantially consistent (e.g., at least in lower elevations of the pillars 108 of the upper deck 110) across the pillar array of the upper deck 110.

While the microelectronic device structures of FIG. 5C through FIG. 16C illustrate upper decks 110 with substantially vertical pillars 108, in other embodiments, the pillars 108 of the upper deck 110 may also exhibit pillar bending in upper elevations thereof. Such pillar bending in the pillars 108 of the upper deck 110 may be the same or different as the pillar bending exhibited by the pillars 108 of the lower deck 112. Nonetheless, because the pillars 108 are to align (e.g., be in physical contact with one another) along the interface 118 between the upper deck 110 and the lower deck 112, essentially only the relative disposition of the lower elevations of the pillars 108 of the upper deck 110 and the upper elevations of the pillars 108 of the lower deck 112 are, alone, determinative of the tailoring implemented in the reticle(s) to improve alignment of the vertically adjacent pillars 108.

For example, with reference to FIG. 17A through FIG. 17C, use of the upper deck reticle 102 and the lower deck reticle 104 to form a microelectronic device structure 1702 may result in the pillars 108 of the lower deck 112 exhibiting varying degrees of pillar bending outwardly away from line 124 and may also result in the pillars 108 of the upper deck 110 exhibiting substantially the same varying degrees of pillar bending outwardly away from line 124. With reference to FIG. 18A through FIG. 18C, the tailored upper deck reticle 602, described above with respect to FIG. 6A through FIG. 6C, may then be used with the lower deck reticle 104, to form a microelectronic device structure 1802 with the same improved pillar alignment along the interface 118 as described above with respect to FIG. 6C, but with the pillars 108 of the upper deck 110 exhibiting inward (e.g., toward line 124) pillar bending (e.g., in upper elevations thereof) that decreases with increased lateral distance from line 124. Alternatively, with reference to FIG. 19A through FIG. 19C, the upper deck reticle 102 and the tailored lower deck reticle 702 (described above with respect to FIG. 7A through FIG. 7C) may be used to form a microelectronic device structure 1902 with the same improved pillar alignment along the interface 118 as described above with respect to FIG. 7C, but with the pillars 108 of the upper deck 110 exhibiting inward pillar bending (e.g., in upper elevations thereof) that decreases with increased lateral distance from line 124.

As another example, with reference to FIG. 20A through FIG. 20C, use of the upper deck reticle 102 and the lower deck reticle 104 to form a microelectronic device structure 2002 may result in the pillars 108 of the lower deck 112 exhibiting varying degrees of pillar bending outwardly away from line 124 and may also result in the pillars 108 of the upper deck 110 exhibiting varying degrees of pillar bending inwardly toward line 124. With reference to FIG. 21A through FIG. 21C, the tailored upper deck reticle 602, described above with respect to FIG. 6A through FIG. 6C, may then be used with the lower deck reticle 104, to form a microelectronic device structure 2102 with the same improved pillar alignment along the interface 118 as described above with respect to FIG. 6C, but with the pillars 108 of the upper deck 110 exhibiting inward pillar bending (e.g., in upper elevations thereof) that increases with increased lateral distance from line 124. Alternatively, with reference to FIG. 22A through FIG. 22C, the upper deck reticle 102 and the tailored lower deck reticle 702 (described above with respect to FIG. 7A through FIG. 7C) may be used to form a microelectronic device structure 2202 with the same improved pillar alignment along the interface 118 as described above with respect to FIG. 7C, but with the pillars 108 of the upper deck 110 exhibiting inward pillar bending (e.g., in upper elevations thereof) that increases with increased lateral distance from line 124.

As a further example, with reference to FIG. 23A through FIG. 23C, use of the upper deck reticle 102 and the lower deck reticle 104 to form a microelectronic device structure 2302 may result in the pillars 108 of the lower deck 112 exhibiting varying degrees of pillar bending inwardly toward line 124 and may also result in the pillars 108 of the upper deck 110 exhibiting substantially the same varying degrees of pillar bending inwardly toward line 124. With reference to FIG. 24A through FIG. 24C, the tailored upper deck reticle 902, described above with respect to FIG. 9A through FIG. 9C, may then be used with the lower deck reticle 104, to form a microelectronic device structure 2402 with the same improved pillar alignment along the interface 118 as described above with respect to FIG. 9C, but with the pillars 108 of the upper deck 110 exhibiting inward (e.g., toward line 124) pillar bending (e.g., in upper elevations thereof) that increases with increased lateral distance from line 124. Alternatively, with reference to FIG. 25A through FIG. 25C, the upper deck reticle 102 and the tailored lower deck reticle 1002 (described above with respect to FIG. 10A through FIG. 10C) may be used to form a microelectronic device structure 2502 with the same improved pillar alignment along the interface 118 as described above with respect to FIG. 10C, but with the pillars 108 of the upper deck 110 exhibiting inward pillar bending (e.g., in upper elevations thereof) that increases with increased lateral distance from line 124.

As still a further example, with reference to FIG. 26A through FIG. 26C, use of the upper deck reticle 102 and the lower deck reticle 104 to form a microelectronic device structure 2602 may result in the pillars 108 of the lower deck 112 exhibiting varying degrees of pillar bending outwardly away from line 124 and may also result in the pillars 108 of the upper deck 110 exhibiting varying degrees of pillar bending inwardly toward line 124. With reference to FIG. 27A through FIG. 27C, the tailored upper deck reticle 1502, described above with respect to FIG. 15A through FIG. 15C, may then be used with the lower deck reticle 104, to form a microelectronic device structure 2702 with the same improved pillar alignment along the interface 118 as described above with respect to FIG. 15C, but with the pillars 108 of the upper deck 110 exhibiting inward pillar bending (e.g., in upper elevations thereof) that varies (e.g., first increasing then decreasing) with increased lateral distance from line 124. Alternatively, with reference to FIG. 28A through FIG. 28C, the upper deck reticle 102 and the tailored lower deck reticle 1602 (described above with respect to FIG. 16A through FIG. 16C) may be used to form a microelectronic device structure 2802 with the same improved pillar alignment along the interface 118 as described above with respect to FIG. 16C, but with the pillars 108 of the upper deck 110 exhibiting inward pillar bending (e.g., in upper elevations thereof) that varies (e.g., first increasing then decreasing) with increased lateral distance from line 124.

While the illustrated microelectronic device structures described above include two decks (e.g., the upper deck 110 and the lower deck 112) with pillar arrays of differing pillar density and at least one tailored reticle to enable improved pillar alignment along one interface (e.g., the interface 118 between the upper deck 110 and the lower deck 112), the same methods and apparatus described above may be implemented to improve feature-to-feature (e.g., pillar-to-pillar, pillar-to-contact) alignment with additional decks (e.g., a third deck above the upper deck 110) or additional features of the microelectronic device structures.

Figure 29:
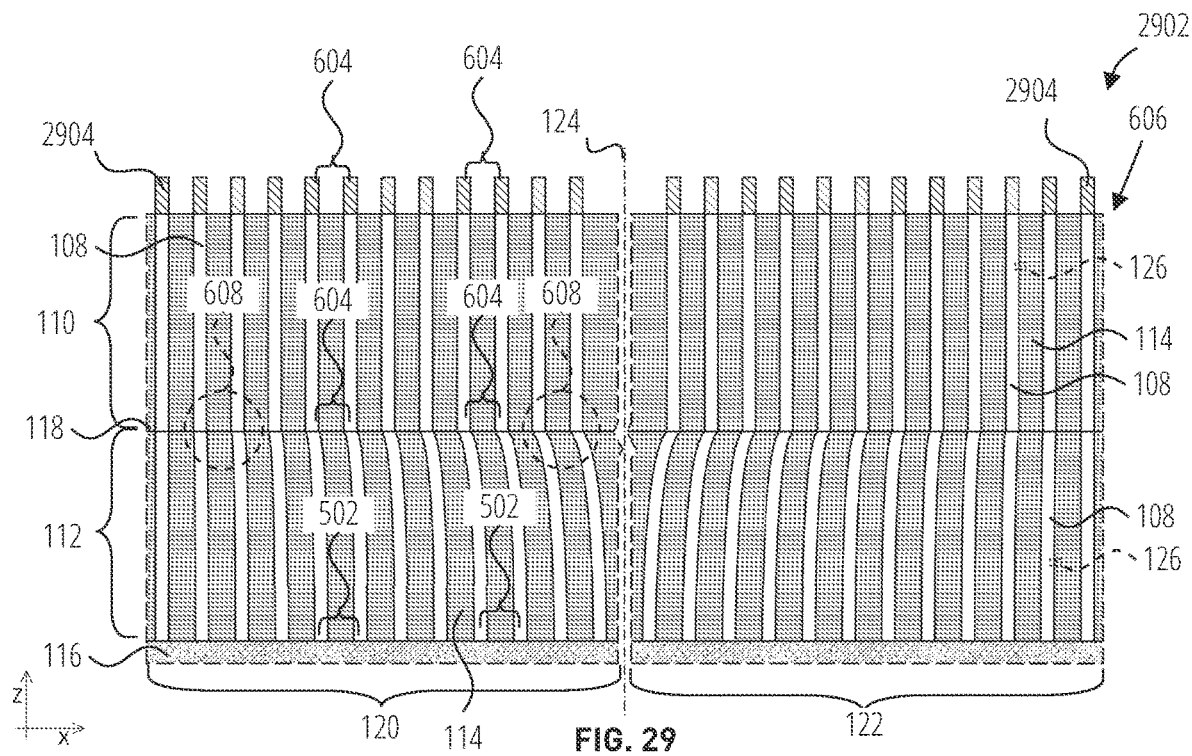
FIG. 29 is a cross-sectional, elevational, schematic illustration of a microelectronic device structure, including an array of bit contacts formed in a pattern tailored for alignment to upper surfaces of the pillars of the upper deck of the microelectronic device structure of FIG. 6C, in accordance with embodiments of the disclosure.
Figure 30:
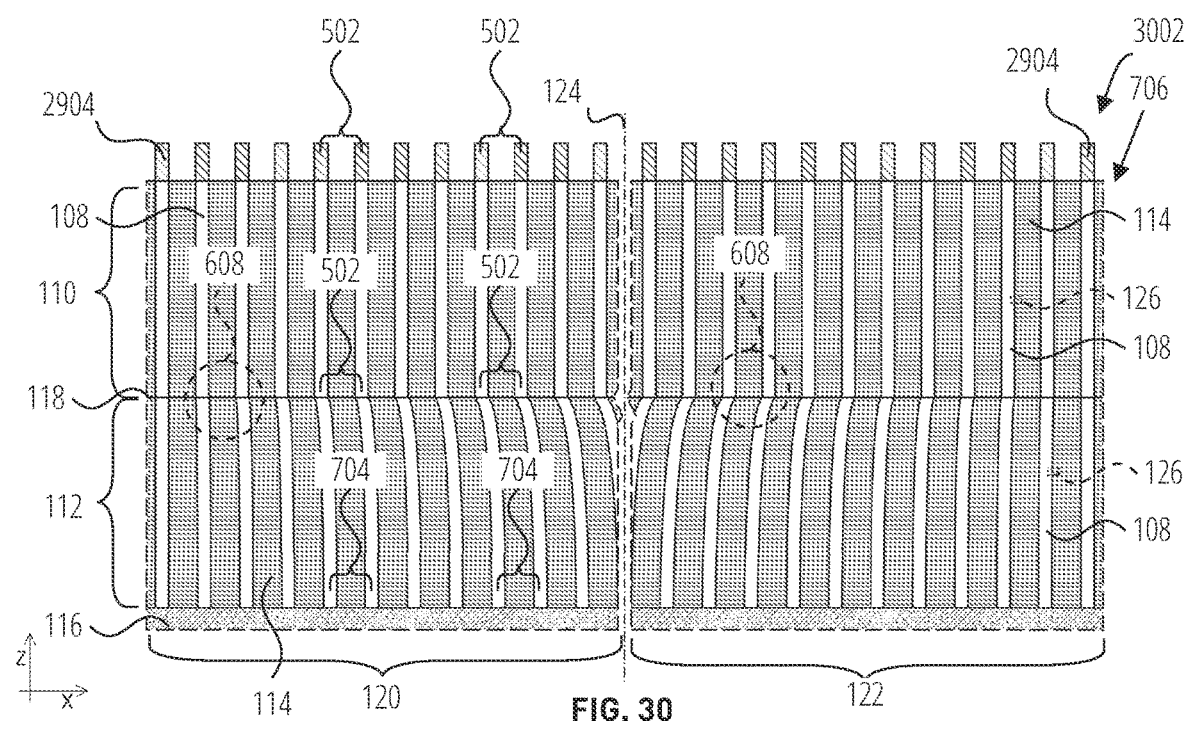
FIG. 30 is a cross-sectional, elevational, schematic illustration of a microelectronic device structure, including an array of bit contacts formed in a pattern tailored for alignment to upper surfaces of the pillars of the upper deck of the microelectronic device structure of FIG. 7C, in accordance with embodiments of the disclosure.

For example, with reference to FIG. 29, a microelectronic device structure 2902 may be formed to include an array of conductive contacts 2904 (e.g., bit contacts) patterned (e.g., formed) with an arrangement of the conductive contacts 2904 substantially matching an arrangement of upper surfaces of the pillars 108 of the upper deck 110 of, e.g., the microelectronic device structure 606 of FIG. 6C. Alternatively, with reference to FIG. 30, a microelectronic device structure 3002 may be formed to include an array of the conductive contacts 2904 patterned with an arrangement substantially matching that of the upper surfaces of the pillars 108 of the upper deck 110 of, e.g., the microelectronic device structure 706 of FIG. 7C. Accordingly, the microelectronic device structure 2902 of FIG. 29 and/or the microelectronic device structure 3002 of FIG. 30 may include an array of pillars 108 in the lower deck 112 that exhibits a different feature density (e.g., a lesser pillar density) than a feature density of both an array of pillars 108 in the upper deck 110 and an array of conductive contacts 2904 above the upper deck 110.

Figure 31:
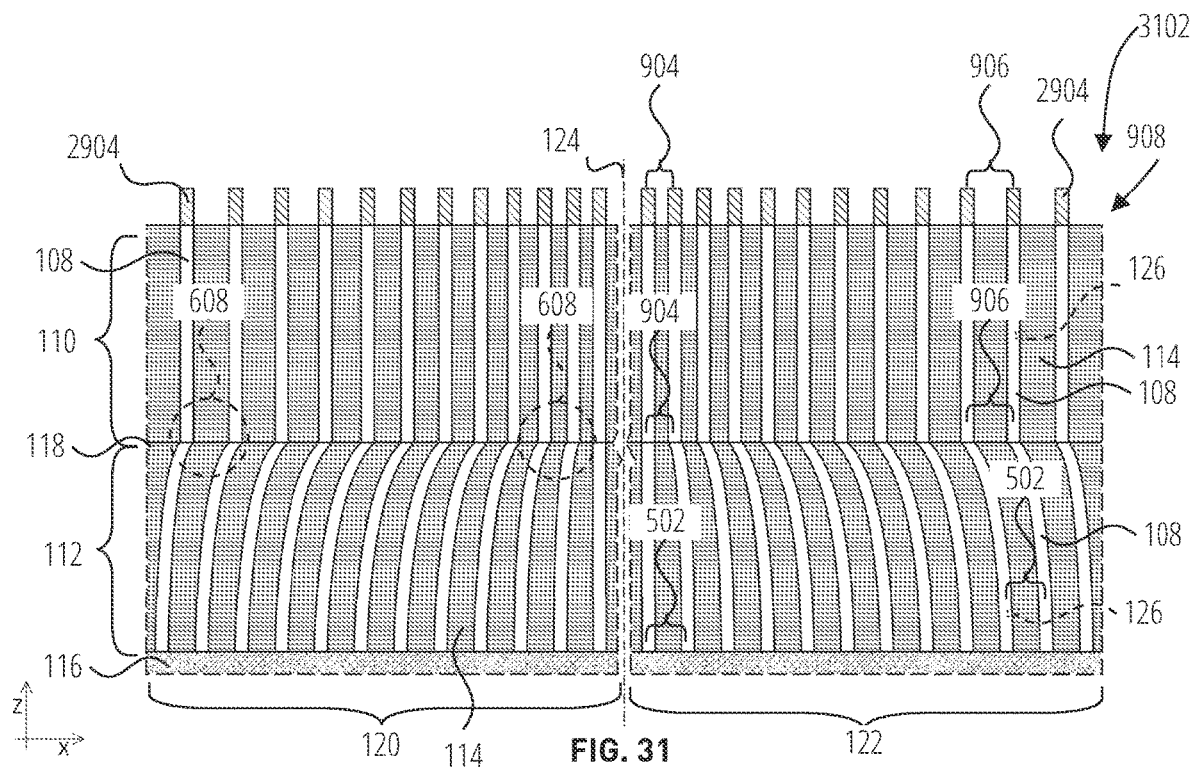
FIG. 31 is a cross-sectional, elevational, schematic illustration of a microelectronic device structure, including an array of bit contacts formed in a pattern tailored for alignment to upper surfaces of the pillars of the upper deck of the microelectronic device structure of FIG. 9C, in accordance with embodiments of the disclosure.
Figure 32:
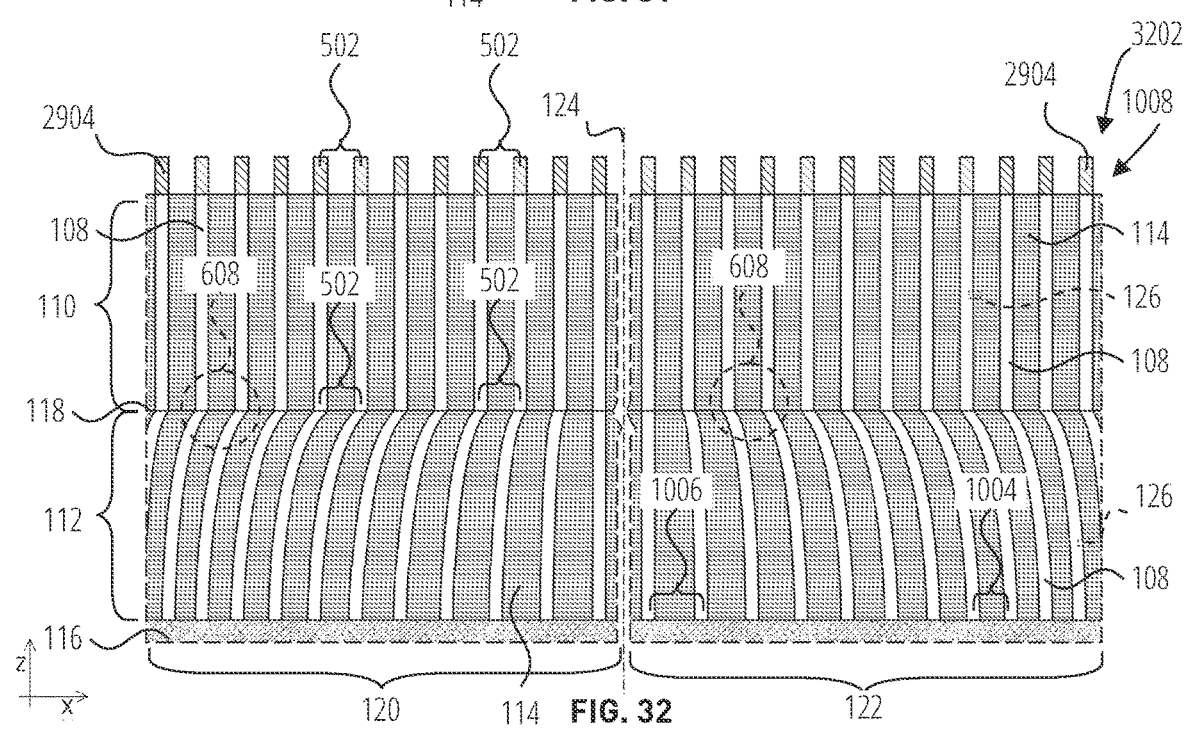
FIG. 32 is a cross-sectional, elevational, schematic illustration of a microelectronic device structure, including an array of bit contacts formed in a pattern tailored for alignment to upper surfaces of the pillars of the upper deck of the microelectronic device structure of FIG. 10C, in accordance with embodiments of the disclosure.

For another example, with reference to FIG. 31, a microelectronic device structure 3102 may be formed to include an array of the conductive contacts 2904 patterned with an arrangement substantially matching a previously observed arrangement of upper surfaces of the pillars 108 of the upper deck 110 of, e.g., the microelectronic device structure 908 (FIG. 9C). Alternatively, with reference to FIG. 32, a microelectronic device structure 3202 may be formed to include an array of the conductive contacts 2904 patterned with an arrangement substantially matching that of the upper surfaces of the pillars 108 of the upper deck 110 of, e.g., the microelectronic device structure 1008 (FIG. 10C). Accordingly, the microelectronic device structure 3102 of FIG. 31 and/or the microelectronic device structure 3202 of FIG. 32 may include multiple decks, each including an array of pillars 108, with a pillar density of at least one of the decks progressively varying (e.g., with decreasing pillar density with increased lateral distance from line 124, as with the upper deck 110 of FIG. 31, and as with increasing pillar density with increased lateral distance from line 124, as with the lower deck 112 of FIG. 32) across at least a portion of the respective pillar array, while the pillar density of a vertically adjacent deck is substantially consistent across the respective pillar array, at least in lower elevations of the pillars 108 (e.g., as with the lower deck 112 of FIG. 31; as with the upper deck 110 of FIG. 32). In such structures, the feature density of the conductive contacts 2904 may be either progressively varying (e.g., with decreasing feature density with increased lateral distance from line 124, as in FIG. 31) or may be substantially consistent across the respective array of the conductive contacts 2904 (e.g., as in FIG. 32), but at least differs from the pillar density of one of the decks of the structure.

With reference to FIG. 33, a microelectronic device structure 3302 may be formed to include an array of the conductive contacts 2904 patterned with an arrangement substantially matching that of the upper surfaces of the pillars 108 of the upper deck 110 of, e.g., the microelectronic device structure 1206 of FIG. 12C. Alternatively, with reference to FIG. 34, a microelectronic device structure 3402 may be formed to include an array of the conductive contacts 2904 patterned with an arrangement substantially matching that of the upper surfaces of the pillars 108 of the upper deck 110 of, e.g., the microelectronic device structure 1306 of FIG. 13C. Accordingly, the microelectronic device structure 3302 of FIG. 33 and/or the microelectronic device structure 3402 of FIG. 34 may include multiple decks, each including an array of pillars 108, wherein the pillars 108 are substantially evenly spaced across the respective array, but wherein a pillar density of the pillar array of the lower deck 112 is less than the pillar density of the pillar array of the upper deck 110 and less than the feature density of the conductive contacts 2904 of the conductive contact array.

Figure 35:
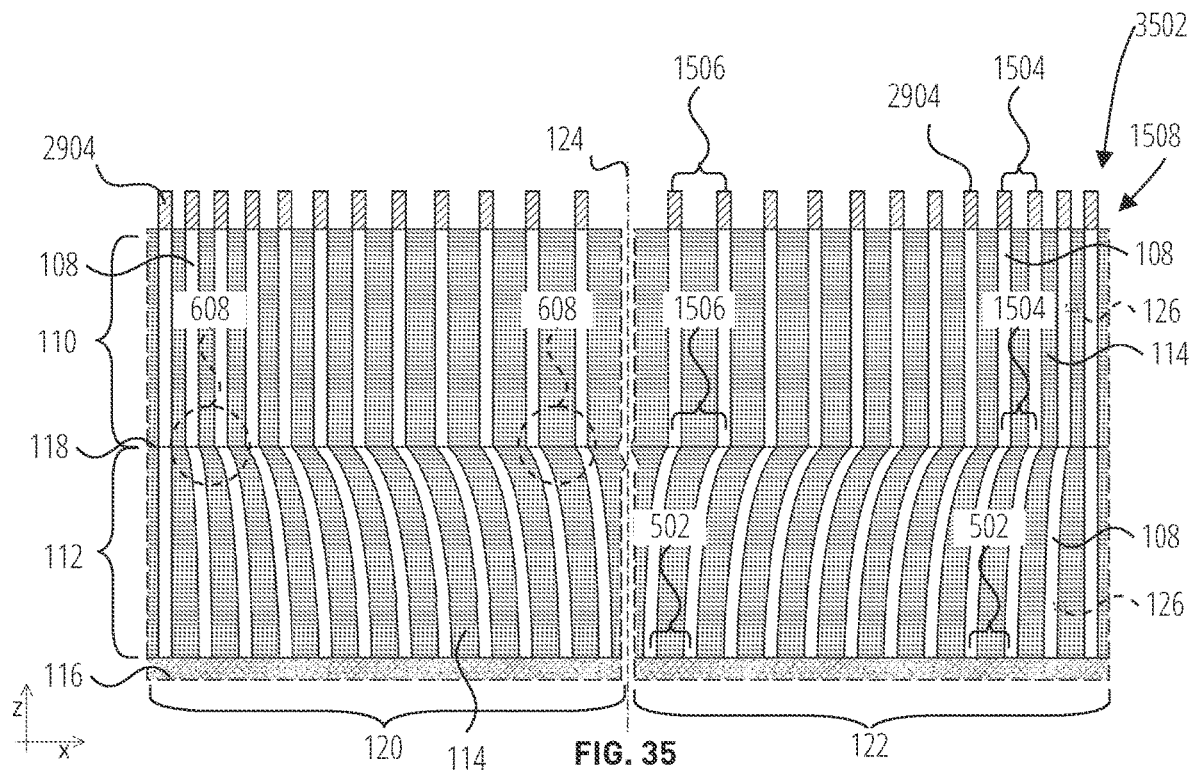
FIG. 35 is a cross-sectional, elevational, schematic illustration of a microelectronic device structure, including an array of bit contacts formed in a pattern tailored for alignment to upper surfaces of the pillars of the upper deck of the microelectronic device structure of FIG. 15C, in accordance with embodiments of the disclosure.
Figure 36:
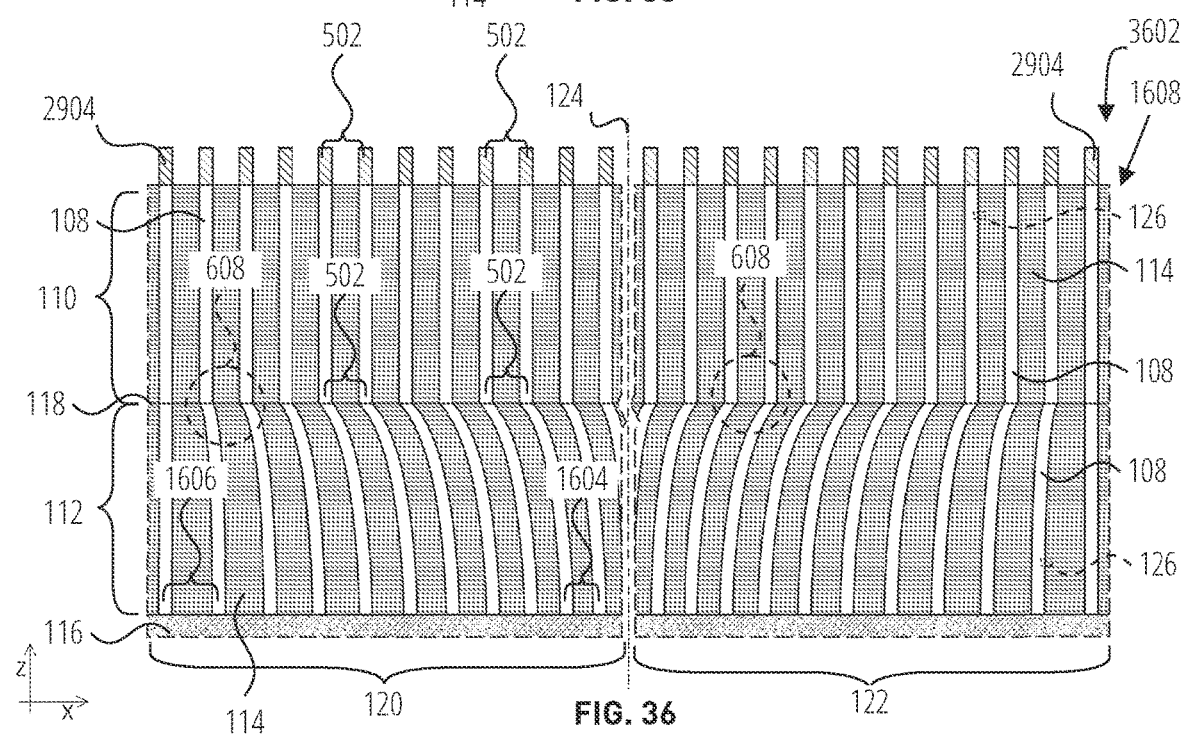
FIG. 36 is a cross-sectional, elevational, schematic illustration of a microelectronic device structure, including an array of bit contacts formed in a pattern tailored for alignment to upper surfaces of the pillars of the upper deck of the microelectronic device structure of FIG. 16C, in accordance with embodiments of the disclosure.

With reference to FIG. 35, a microelectronic device structure 3502 may be formed to include an array of the conductive contacts 2904 patterned with an arrangement substantially matching a previously observed arrangement of upper surfaces of the pillars 108 of the upper deck 110 of, e.g., the microelectronic device structure 1508 of FIG. 15C. Alternatively, with reference to FIG. 36, a microelectronic device structure 3602 may be formed to include an array of the conductive contacts 2904 patterned with an arrangement substantially matching that of the upper surfaces of the pillars 108 of the upper deck 110 of, e.g., the microelectronic device structure 1608 of FIG. 16C. Accordingly, the microelectronic device structure 3502 of FIG. 35 and/or the microelectronic device structure 3602 of FIG. 36 may include multiple decks, each including an array of pillars 108, with a pillar density of at least one of the decks progressively varying (e.g., with increasing pillar density (e.g., at least with respect to lower elevations of the pillars 108) with increased lateral distance from line 124, as with the upper deck 110 of FIG. 35; with decreasing pillar density with increased lateral distance from line 124, as with the lower deck 112 of FIG. 36) across at least a portion of the respective pillar array, while the pillar density of a vertically adjacent deck is substantially consistent across the respective pillar array, at least in lower elevations of the pillars 108 (e.g., as with the lower deck 112 of FIG. 35; as with the upper deck 110 of FIG. 36). In such structures, the feature density of the conductive contacts 2904 may be either progressively varying (e.g., with increasing feature density with increased lateral distance from line 124, as in FIG. 35) or may be substantially consistent across the respective array of the conductive contacts 2904 (e.g., as in FIG. 36), but at least differs from the pillar density of one of the decks of the structure.

With reference to FIG. 37, a microelectronic device structure 3702 may be formed to include an array of the conductive contacts 2904 patterned with an arrangement substantially matching that of the upper surfaces of the pillars 108 of the upper deck 110 of, e.g., the microelectronic device structure 1802 of FIG. 18C, such that the conductive contacts 2904 may be substantially evenly spaced at distance 3704, with a substantially consistent feature density across the array of the conductive contacts 2904. In light of pillar bending of exhibited by the pillars 108 of the upper deck 110, the distance 3704 of the spacing of the conductive contacts 2904 may be less than the distance 604 of the spacing of the pillars 108 of the upper deck 110, and therefore also less than the distance 502 of the spacing of the pillars 108 of the lower deck 112. Alternatively, with reference to FIG. 38, a microelectronic device structure 3802 may be formed to include an array of the conductive contacts 2904 patterned with an arrangement substantially matching that of the upper surfaces of the pillars 108 of the upper deck 110 of, e.g., the microelectronic device structure 1902 of FIG. 19C, such that the conductive contacts 2904 may be substantially evenly spaced at distance 3804, with a substantially consistent feature density across the array of conductive contacts 2904. The distance 3804 may be less than the distance 604, which may be less than distance 704. Accordingly, the microelectronic device structure 3702 of FIG. 37 and/or the microelectronic device structure 3802 of FIG. 38 may include multiple decks, each including an array of pillars 108, wherein the pillars 108 are substantially evenly spaced across the respective array, but wherein a pillar density of the pillars 108 of the lower deck is less than a pillar density of the pillars 108 of the upper deck 110, which is less than a feature density of the conductive contacts 2904, at least with respect to the lower elevations of the pillars 108 and the conductive contacts 2904.

Figure 39:
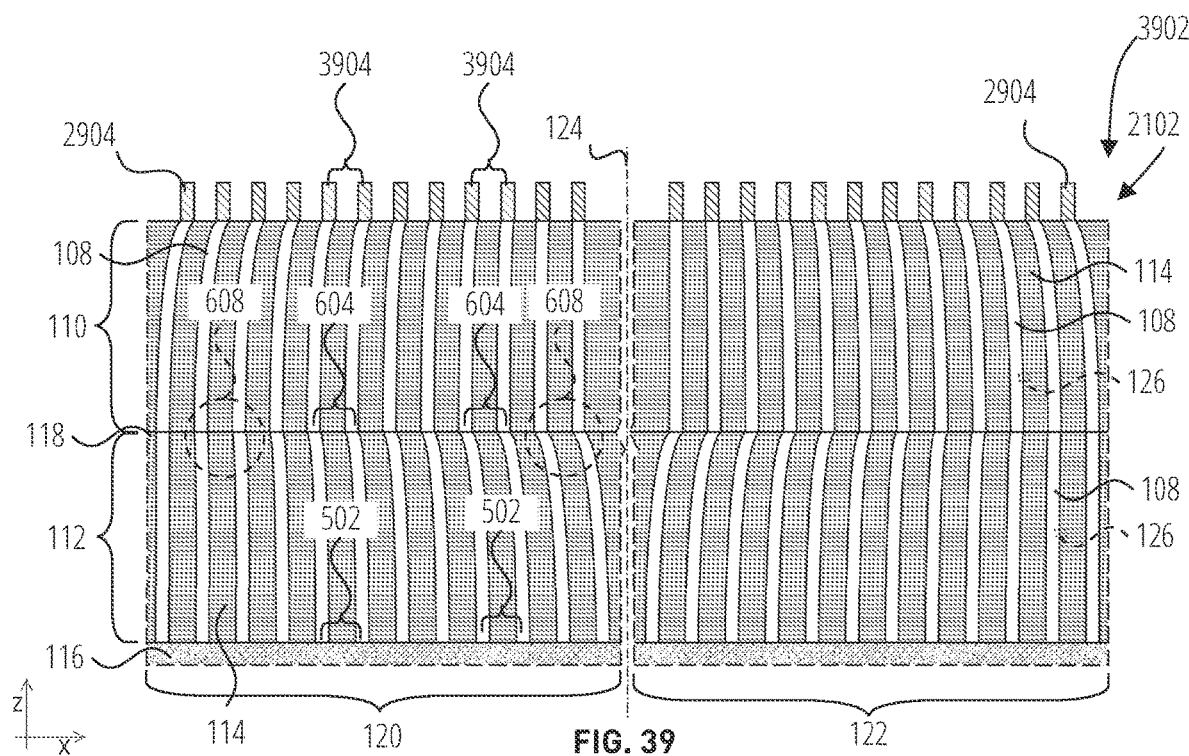
FIG. 39 is a cross-sectional, elevational, schematic illustration of a microelectronic device structure, including an array of bit contacts formed in a pattern tailored for alignment to upper surfaces of the pillars of the upper deck of the microelectronic device structure of FIG. 21C, in accordance with embodiments of the disclosure.
Figure 40:
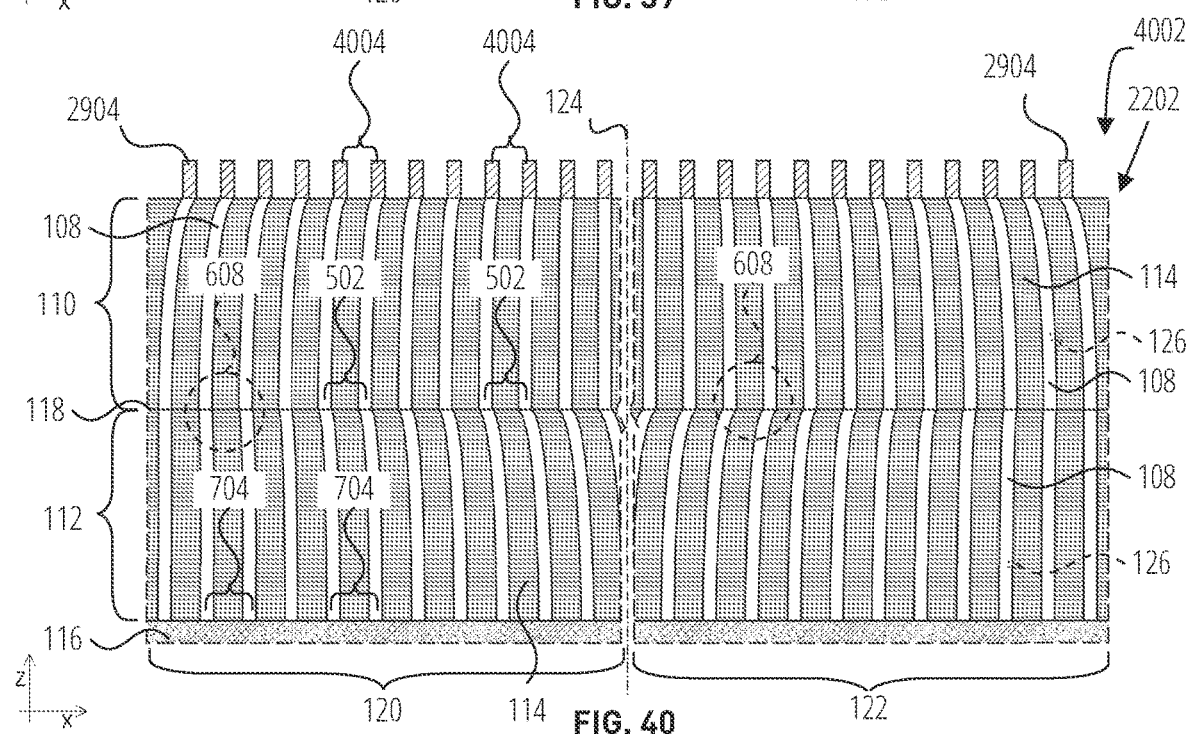
FIG. 40 is a cross-sectional, elevational, schematic illustration of a microelectronic device structure, including an array of bit contacts formed in a pattern tailored for alignment to upper surfaces of the pillars of the upper deck of the microelectronic device structure of FIG. 22C, in accordance with embodiments of the disclosure.

As another example, with reference to FIG. 39, a microelectronic device structure 3902 may be formed to include an array of the conductive contacts 2904 patterned with an arrangement substantially matching that of the upper surfaces of the pillars 108 of the upper deck 110 of, e.g., the microelectronic device structure 2102 of FIG. 21C, such that the conductive contacts 2904 may be substantially evenly spaced at distance 3904, with a substantially consistent feature density across the array of the conductive contacts 2904. The distance 3904 may be less than the distance 604, which may be less than the distance 502. Alternatively, with reference to FIG. 40, a microelectronic device structure 4002 may be formed to include an array of the conductive contacts 2904 patterned with an arrangement substantially matching that of the upper surfaces of the pillars 108 of the upper deck 110 of, e.g., the microelectronic device structure 2202 of FIG. 22C, such that the conductive contacts 2904 may be substantially evenly spaced at distance 4004, with a substantially consistent feature density across the array of conductive contacts 2904. The distance 4004 may be less than the distance 502, which may be less than distance 704. Accordingly, like the microelectronic device structure 3702 of FIG. 37 and the microelectronic device structure 3802 of FIG. 38, the microelectronic device structure 3902 of FIG. 39 and/or the microelectronic device structure 4002 of FIG. 40 may include multiple decks, each including an array of pillars 108, wherein the pillars 108 are substantially evenly spaced across the respective array, but wherein a pillar density of the pillars 108 of the lower deck 112 is less than a pillar density of the pillars 108 of the upper deck 110, which is less than a feature density of the conductive contacts 2904, at least with respect to the lower elevations of the pillars 108 and the conductive contacts 2904.

Figure 41:
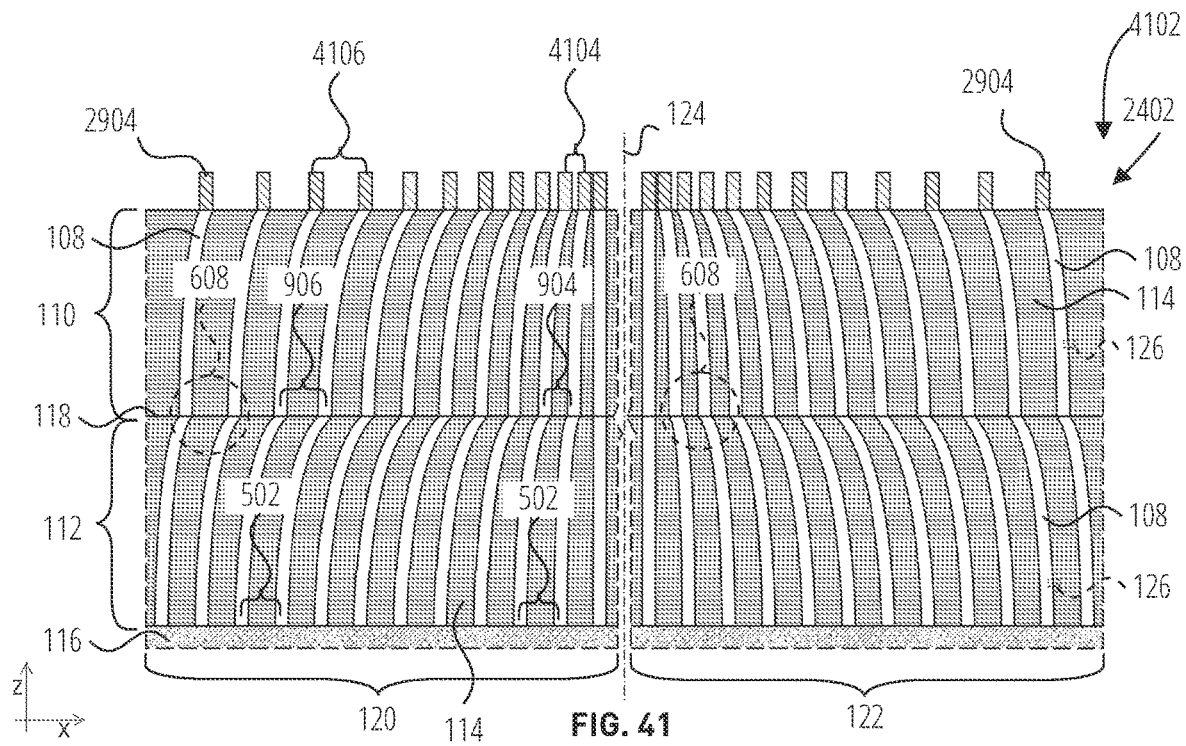
FIG. 41 is a cross-sectional, elevational, schematic illustration of a microelectronic device structure, including an array of bit contacts formed in a pattern tailored for alignment to upper surfaces of the pillars of the upper deck of the microelectronic device structure of FIG. 24C, in accordance with embodiments of the disclosure.
Figure 42:
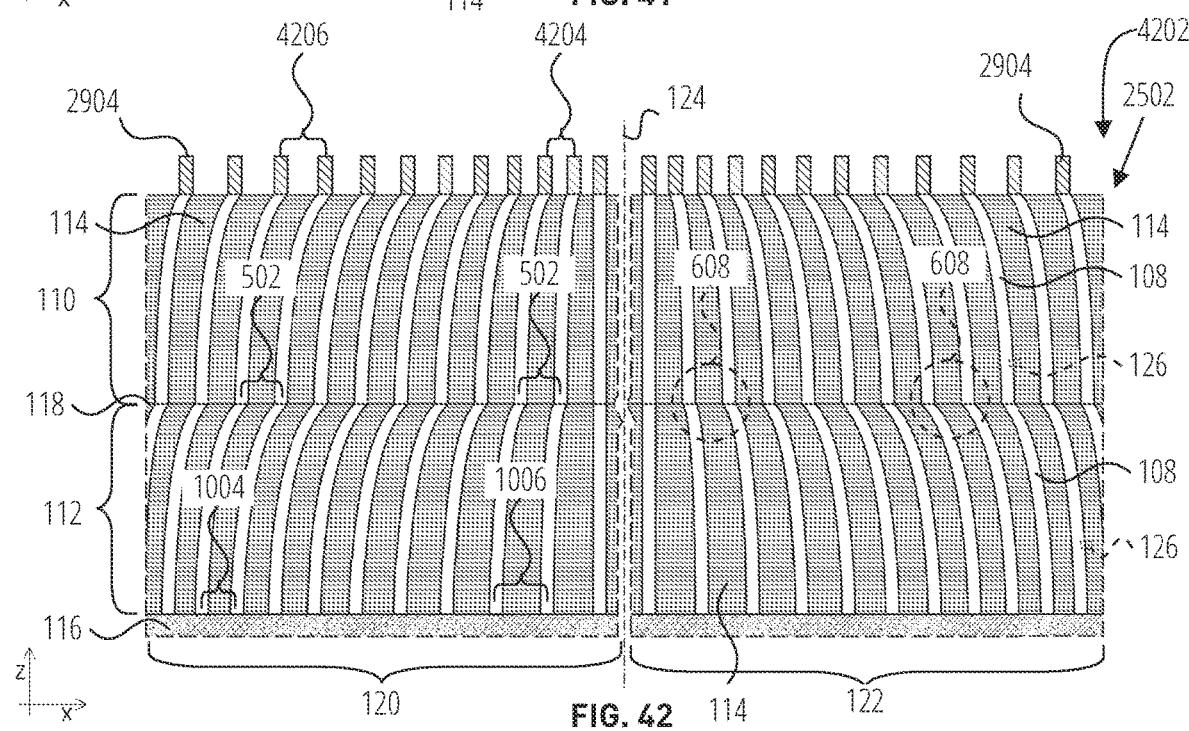
FIG. 42 is a cross-sectional, elevational, schematic illustration of a microelectronic device structure, including an array of bit contacts formed in a pattern tailored for alignment to upper surfaces of the pillars of the upper deck of the microelectronic device structure of FIG. 25C, in accordance with embodiments of the disclosure.

With reference to FIG. 41, a microelectronic device structure 4102 may be formed to include an array of the conductive contacts 2904 patterned with an arrangement substantially matching that of the upper surfaces of the pillars 108 of the upper deck 110 of, e.g., the microelectronic device structure 2402 of FIG. 24C, such that the conductive contacts 2904 may be arranged (e.g., laterally spaced) with a progressing pillar density that decreases with increasing lateral distance from line 124. Accordingly, conductive contacts 2904 proximal to the line 124 may be spaced a distance 4104 that is less than the distance 904 at which connecting pillars 108 in the upper deck 110 (e.g., "connecting" meaning in physical contact with) are spaced, which may be less than the distance 502 at which connecting pillars 108 in the lower deck 112 are spaced. Also accordingly, conductive contacts 2904 distal from the line 124 may be spaced a distance 4106 that is greater than the distance 906 at which connecting pillars 108 in the upper deck 110 are spaced, which may be greater than the distance 502 at which connecting pillars 108 in the lower deck 112 are spaced. Alternatively, with reference to FIG. 42, a microelectronic device structure 4202 may be formed to include an array of the conductive contacts 2904 patterned with an arrangement substantially matching that of the upper surfaces of the pillars 108 of the upper deck 110 of, e.g., the microelectronic device structure 2502 of FIG. 25C, such that the conductive contacts 2904 may be arranged (e.g., laterally spaced) with a progressing pillar density that decreases with increasing lateral distance from line 124. Accordingly, conductive contacts 2904 proximal to the line 124 may be spaced a distance 4204 that is less than the distance 502 at which connecting pillars 108 in the upper deck 110 are spaced, which may be less than the distance 1006 at which connecting pillars 108 of the lower deck 112 are spaced. Also accordingly, conductive contacts 2904 distal from the line 124 may be spaced a distance 4206 that is greater than the distance 502 at which connecting pillars 108 in the upper deck 110 are spaced, which may be greater than the distance 1004 at which connecting pillars 108 in the lower deck 112 are spaced. Therefore, the microelectronic device structure 4102 of FIG. 41 and/or the microelectronic device structure 4202 of FIG. 42 may include multiple decks, each including an array of pillars 108, wherein the pillars 108 are substantially evenly spaced across a respective array of at least one of the decks (e.g., the lower deck 112 of FIG. 41, the upper deck 110 of FIG. 42), but wherein the pillars 108 of at least one other of the decks (e.g., the upper deck 110 of FIG. 41, the lower deck 112 of FIG. 42) have progressed spacing with varying pillar density across the respective pillar array (e.g., with decreasing pillar density with increased lateral distance from line 124, in the upper deck 110 of FIG. 41; with increasing pillar density with increased lateral distance from line 124, in the lower deck 112 of FIG. 42), the conductive contacts 2904 array also having progressed spacing with varying feature density (e.g., decreased feature density with increased lateral distance from line 124, as with FIG. 41 and FIG. 42).

Figure 43:
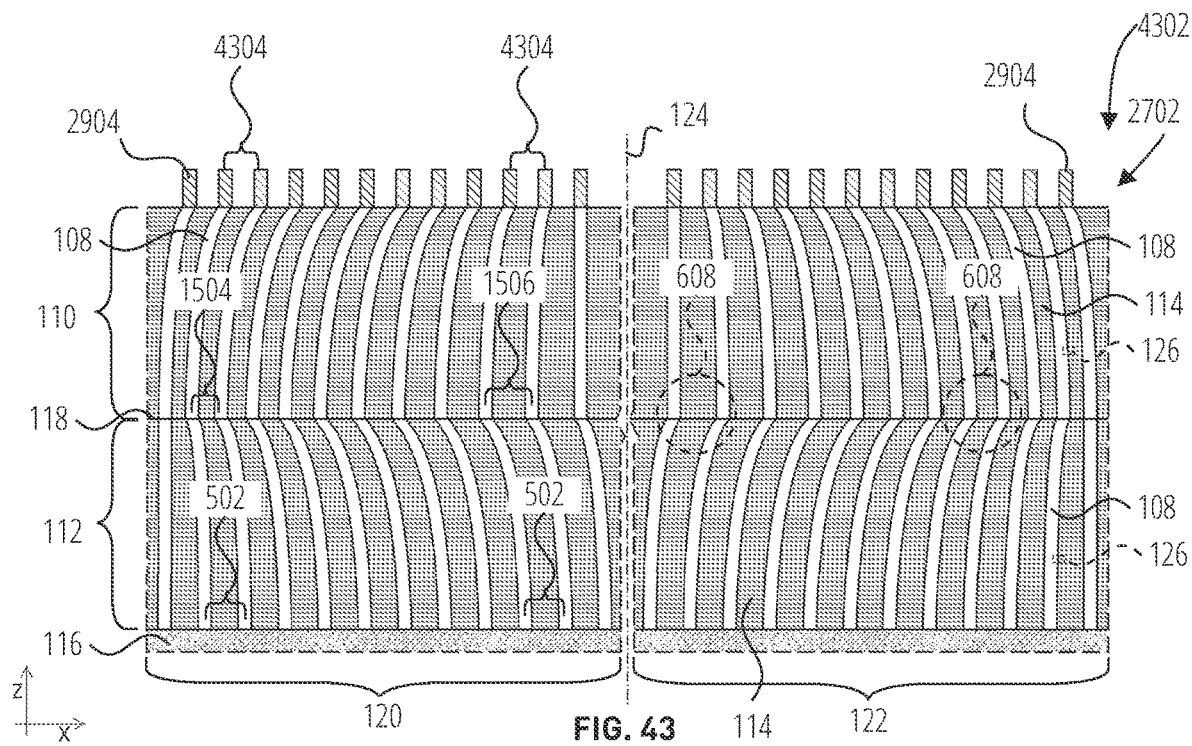
FIG. 43 is a cross-sectional, elevational, schematic illustration of a microelectronic device structure, including an array of bit contacts formed in a pattern tailored for alignment to upper surfaces of the pillars of the upper deck of the microelectronic device structure of FIG. 27C, in accordance with embodiments of the disclosure.
Figure 44:
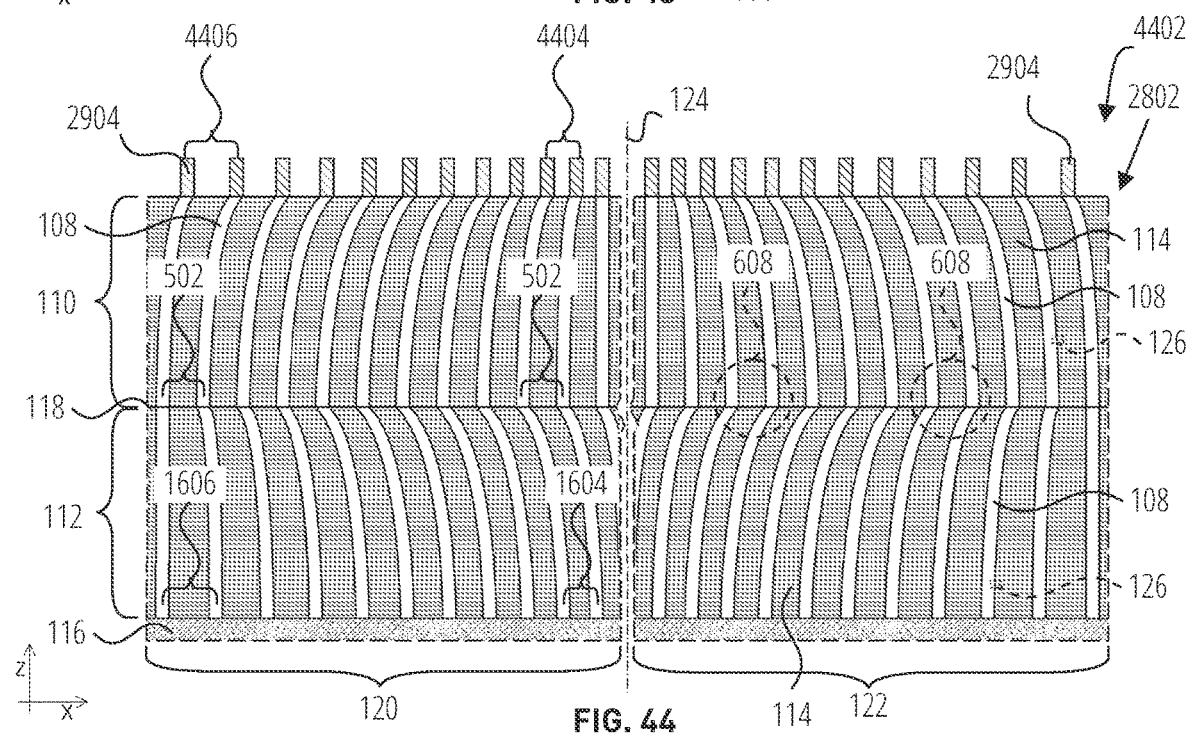
FIG. 44 is a cross-sectional, elevational, schematic illustration of a microelectronic device structure, including an array of bit contacts formed in a pattern tailored for alignment to upper surfaces of the pillars of the upper deck of the microelectronic device structure of FIG. 28C, in accordance with embodiments of the disclosure.

As additional examples, with reference to FIG. 43, a microelectronic device structure 4302 may be formed to include an array of the conductive contacts 2904 patterned with an arrangement substantially matching that of the upper surfaces of the pillars 108 of the upper deck 110 of, e.g., the microelectronic device structure 2702 of FIG. 27C, such that the conductive contacts 2904 may be arranged (e.g., laterally spaced) with a substantially consistent spacing of distance 4304. Because the pillars 108 of the upper deck 110 may be arranged with progressed spacing, in some areas of the array of the conductive contacts 2904, neighboring conductive contacts 2904 may be spaced closer together than (e.g., by distance 4304) than a distance (e.g., the distance 1506) at which neighboring connecting pillars 108 of the upper deck 110 are spaced, which may be a greater distance than the spacing (e.g., distance 502) at which neighboring connecting pillars 108 of the lower deck 112 are spaced. In other areas of the array of the conductive contacts 2904, neighboring conductive contacts 2904 may be spaced further apart from one another (e.g., by distance 4304) than a distance (e.g., the distance 1504) at which neighboring connecting pillars 108 of the upper deck 110 are spaced, which may be less than a distance (e.g., distance 502) at which neighboring connecting pillars 108 of the lower deck 112 are spaced. Alternatively, with reference to FIG. 44, a microelectronic device structure 4402 may be formed to include an array of the conductive contacts 2904 patterned with an arrangement substantially matching that of the upper surfaces of the pillars 108 of the upper deck 110 of, e.g., the microelectronic device structure 2802 of FIG. 28C, such that the conductive contacts 2904 may be arranged (e.g., laterally spaced) with a progressing pillar density that decreases with increasing lateral distance from line 124. Accordingly, conductive contacts 2904 proximal to the line 124 may be spaced a distance 4404 that is less than the distance 502 at which connecting pillars 108 in the upper deck 110 are spaced, which may be greater than the distance 1604 at which connecting pillars 108 of the lower deck 112 are spaced. Also accordingly, conductive contacts 2904 distal from the line 124 may be spaced a distance 4406 that is greater than the distance 502 at which connecting pillars 108 in the upper deck 110 are spaced, which may be less than the distance 1606 at which connecting pillars 108 in the lower deck 112 are spaced. Therefore, the microelectronic device structure 4302 of FIG. 43 and/or the microelectronic device structure 4402 of FIG. 44 may include multiple decks, each including an array of pillars 108, wherein the pillars 108 are substantially evenly spaced across a respective array of at least one of the decks (e.g., the lower deck 112 of FIG. 43, the upper deck 110 of FIG. 44), but wherein the pillars 108 of at least one other of the decks (e.g., the upper deck 110 of FIG. 43, the lower deck of FIG. 44) have progressed spacing with varying pillar density across the respective pillar array (e.g., with increasing pillar density with increased lateral distance from line 124, in the upper deck 110 of FIG. 43; with decreasing pillar density with increased lateral distance from line 124, in the lower deck 112 of FIG. 44). Correspondingly, the feature density of the array of the conductive contacts 2904 has a feature density that differs in type (e.g., substantially consistent feature density with substantially evenly spaced conductive contacts 2904, or progressed feature density with progressed or otherwise varying spacing of the conductive contacts 2904 across the array thereof, at least with respect to lower elevations of the conductive contacts 2904) from that of the connecting pillar array. For example, in FIG. 43, the array of the conductive contacts 2904 has a substantially consistent feature density with substantially even spacing at distance 4304, in contrast to the progressed pillar density and varying spacing (e.g., including distances 1504 and 1506) of the pillars 108 of the upper deck 110. As another example, in FIG. 44, the array of conductive contacts 2904 has a progressed feature density with progressed spacing (e.g., including distances 4404 and 4406), in contrast to the substantially consistent pillar density and substantially even spacing (e.g., at distance 502) of the pillars 108 of the upper deck 110.

Accordingly, disclosed is a microelectronic device comprising a lower deck and an upper deck. Each deck comprises a stack structure comprising a vertically alternating sequence of insulative structures and conductive structures arranged in tiers. A lower array of pillars extends through the stack structure of the lower deck. An upper array of pillars extends through the stack structure of the upper deck. The pillars of the lower array align with the pillars of the upper array, along an interface between the lower deck and the upper deck. At least at elevations comprising bases of the pillars, a pillar density of the lower array differs from a pillar density of the upper array.

Moreover, disclosed is a method of forming a microelectronic device, the method comprising forming a lower stack structure comprising a vertically alternating sequence of insulative structures and other structures arranged in tiers. A lower deck reticle, having a first pattern feature density, is used to form a lower array of pillars in the lower stack structure. An upper stack structure is formed over the lower stack structure. The upper stack structure comprises an additional vertically alternating sequence of additional insulative structures and additional other structures arranged in additional tiers. An upper deck reticle, having a second pattern feature density differing from the first pattern feature density, is used to form an upper array of pillars in the upper stack structure. The pillars of the upper array align with the pillars of the lower array along an interface between the lower stack structure and the upper stack structure.

According to embodiments of the disclosure, including embodiments described above, where pillar arrays are formed on either side of a non-pillar feature or to either side of the die 302 (FIG. 3)—such that line 124 may represent either the non-pillar feature or a centerline of the die 302, respectively—pillar bending exhibited in the left portion 120 may be substantially mirrored to pillar bending exhibited in the right portion 122. However, the disclosure is not so limited. In other embodiments, pillars 108 on opposite sides of the non-pillar feature (e.g., represented by line 124) may exhibit pillar bending in the same direction as one another. Accordingly, any illustrated left side portion 120 herein may be combined—in one or more embodiments—with any illustrated right side portion 122.

While the figures illustrate, and the embodiments described above discuss, spacing of pattern features (e.g., circles of reticles), pillars 108, and/or other features (e.g., the conductive contacts 2904) along an X-axis direction, reticle patterns—and therefore pillar spacing and other feature (e.g., conductive contact) spacing—may also or alternatively be tailored along a different horizontal direction, such as along a Y-axis direction, or both, to achieve the same results described above. Accordingly, a tailored reticle may compress, expand, or otherwise define pattern feature spacing that varies—compared to an initial reticle—in either or both of the X-axis direction and/or the Y-axis direction, with such tailoring further reflected in forming the corresponding deck of a microelectronic device structure.

Accordingly, disclosed is a microelectronic device comprising a lower deck and an upper deck overlying the lower deck. The lower deck comprises a first array of pillars comprising memory cells. The upper deck comprises a second array of pillars comprising additional memory cells. At least some of the pillars of the first array of pillars exhibit bending adjacent an interface between the lower deck and the upper deck. Along the interface, pillars of the second array of pillars align with pillars of the first array of pillars.

Figure 45:
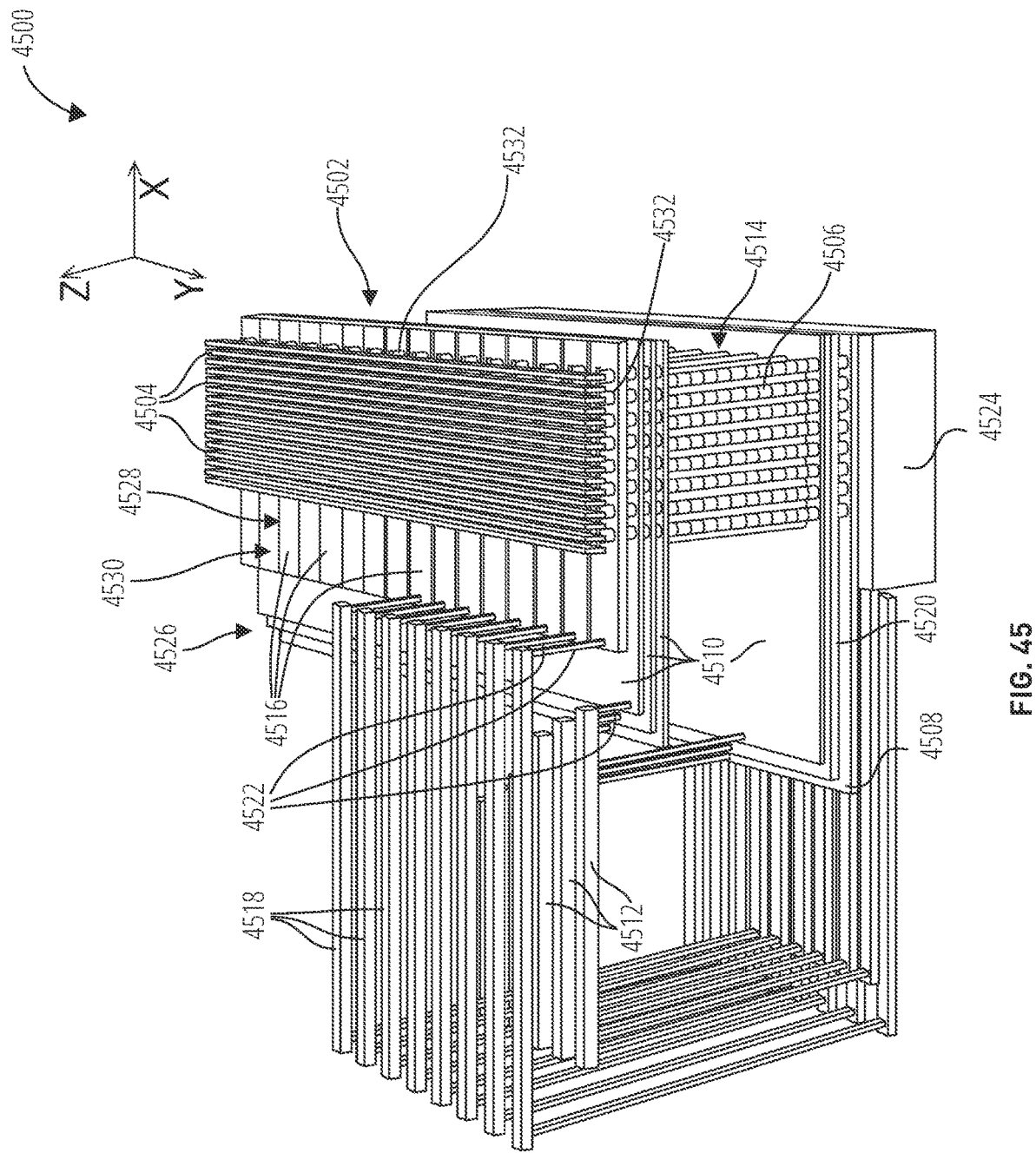
FIG. 45 is a partial, cutaway, perspective, schematic illustration of a microelectronic device, in accordance with embodiments of the disclosure.

With reference to FIG. 45, illustrated is a partial cutaway, perspective, schematic illustration of a portion of a microelectronic device 4500 (e.g., a memory device, such as a dual deck 3D NAND Flash memory device) including a microelectronic device structure 4502. The microelectronic device structure 4502 may be substantially similar to any of the above-described multi-deck microelectronic device structures with aligned pillars of pillar arrays having different pillar densities (e.g., the microelectronic device structure 606 (FIG. 6C), 706 (FIG. 7C), 908 (FIG. 9C), 1008 (FIG. 10C), 1206 (FIG. 12C), 1306 (FIG. 13C), 1508 (FIG. 15C), 1608 (FIG. 16C), 1802 (FIG. 18C), 1902 (FIG. 19C), 2102 (FIG. 21C), 2202 (FIG. 22C), 2402 (FIG. 24C), 2502 (FIG. 25C), 2702 (FIG. 27C), 2802 (FIG. 28C), 2902 (FIG. 29), 3002 (FIG. 30), 3102 (FIG. 31), 3202 (FIG. 32), 3302 (FIG. 33), 3402 (FIG. 34), 3502 (FIG. 35), 3602 (FIG. 36), 3702 (FIG. 37), 3802 (FIG. 38), 3902 (FIG. 39), 4002 (FIG. 40), 4102 (FIG. 41), 4202 (FIG. 42), 4302 (FIG. 43), 4402 (FIG. 44)) (hereinafter collectively referred to as "any of the disclosed microelectronic device structures with aligned multi-deck pillar arrays of differing pillar densities"), which may have been formed with at least one reticle defining a pattern tailored according to a previously observed pillar misalignment.

As illustrated in FIG. 45, the microelectronic device structure 4502 may include a staircase structure 4526 (e.g., staircase structure 404 of FIG. 4) defining contact regions for connecting access lines 4512 to conductive tiers 4510 (e.g., conductive layers, conductive plates, such as the conductive other structures 208 of FIG. 2A through FIG. 2E). The microelectronic device structure 4502 may include pillars 108 (e.g., FIG. 29) with vertical strings 4514 of memory cells 4506 (e.g., one or more of memory cell 202 (FIG. 2A), memory cell 202' (FIG. 2B), memory cell 202" (FIG. 2C), memory cell 202'" (FIG. 2D), and/or memory cell 20'''' (FIG. 2E)) that are coupled to each other in series. The pillars 108 with the vertical strings 4514 may extend at least somewhat vertically (e.g., in the Z-direction) and orthogonally relative to conductive tiers 4510, relative to data lines 4504, relative to a source tier 4508 (e.g., within the base structure(s) 116 (e.g., FIG. 29)), relative to access lines 4512, relative to first select gates 4516 (e.g., upper select gates, drain select gates (SGDs)), relative to select lines 4518, and/or relative to a second select gate 4520 (e.g., a lower select gate, a source select gate (SGS)). However, one or more of the pillars 108 (e.g., FIG. 29) with the vertical strings 4514 may exhibit bending in upper elevations. The first select gates 4516 may be horizontally divided (e.g., in the Y-direction) into multiple blocks 4530 horizontally separated (e.g., in the Y-direction) from one another by slits 4528.

Vertical conductive contacts 4522 may electrically couple components to each other, as illustrated. For example, the select lines 4518 may be electrically coupled to the first select gates 4516, and the access lines 4512 may be electrically coupled to the conductive tiers 4510. The microelectronic device 4500 may also include a control unit 4524 positioned under the memory array, which may include at least one of string driver circuitry, pass gates, circuitry for selecting gates, circuitry for selecting conductive lines (e.g., the data lines 4504, the access lines 4512), circuitry for amplifying signals, and circuitry for sensing signals. The control unit 4524 may be electrically coupled to the data lines 4504, the source tier 4508, the access lines 4512, the first select gates 4516, and/or the second select gates 4520, for example. In some embodiments, the control unit 4524 includes CMOS (complementary metal-oxide-semiconductor) circuitry. In such embodiments, the control unit 4524 may be characterized as having a "CMOS under Array" ("CuA") configuration.

The first select gates 4516 may extend horizontally in a first direction (e.g., the X-direction) and may be coupled to respective first groups of vertical strings 4514 of memory cells 4506 at a first end (e.g., an upper end) of the vertical strings 4514. The second select gate 4520 may be formed in a substantially planar configuration and may be coupled to the vertical strings 4514 at a second, opposite end (e.g., a lower end) of the vertical strings 4514 of memory cells 4506.

The data lines 4504 (e.g., bit lines) may extend horizontally in a second direction (e.g., in the Y-direction) that is at an angle (e.g., perpendicular) to the first direction in which the first select gates 4516 extend. The data lines 4504 may be coupled to respective second groups of the vertical strings 4514 at the first end (e.g., the upper end) of the vertical strings 4514. A first group of vertical strings 4514 coupled to a respective first select gate 4516 may share a particular vertical string 4514 with a second group of vertical strings 4514 coupled to a respective data line 4504. Thus, a particular vertical string 4514 may be selected at an intersection of a particular first select gate 4516 and a particular data line 4504. Accordingly, the first select gates 4516 may be used for selecting memory cells 4506 of the vertical strings 4514 of memory cells 4506.

The conductive tiers 4510 (e.g., word line plates) may extend in respective horizontal planes. The conductive tiers 4510 may be stacked vertically, such that each conductive tier 4510 is coupled to all of the vertical strings 4514 of memory cells 4506, and the vertical strings 4514 of the memory cells 4506 extend vertically—with one or more of the vertical strings 4514 possibly exhibiting some pillar bending-through the stack (e.g., stack structure 114 (e.g., FIG. 29)) of conductive tiers 4510. The conductive tiers 4510 may be coupled to or may form control gates of the memory cells 4506 to which the conductive tiers 4510 are coupled. Each conductive tier 4510 may be coupled to one memory cell 4506 of a particular vertical string 4514 of memory cells 4506.

The first select gates 4516 and the second select gates 4520 may operate to select a particular vertical string 4514 of the memory cells 4506 between a particular data line 4504 and the source tier 4508. Thus, a particular memory cell 4506 may be selected and electrically coupled to a data line 4504 by operation of (e.g., by selecting) the appropriate first select gate 4516, second select gate 4520, and conductive tier 4510 that are coupled to the particular memory cell 4506.

The staircase structure 4526 may be configured to provide electrical connection between the access lines 4512 and the conductive tiers 4510 through the vertical conductive contacts 4522. In other words, a particular level of the conductive tiers 4510 may be selected via one of the access lines 4512 that is in electrical communication with a respective one of the vertical conductive contacts 4522 in electrical communication with the particular conductive tier 4510.

The data lines 4504 may be electrically coupled to the vertical strings 4514 through conductive structures 4532 (e.g., the conductive contacts 2904 (e.g., FIG. 29)).

Figure 46:
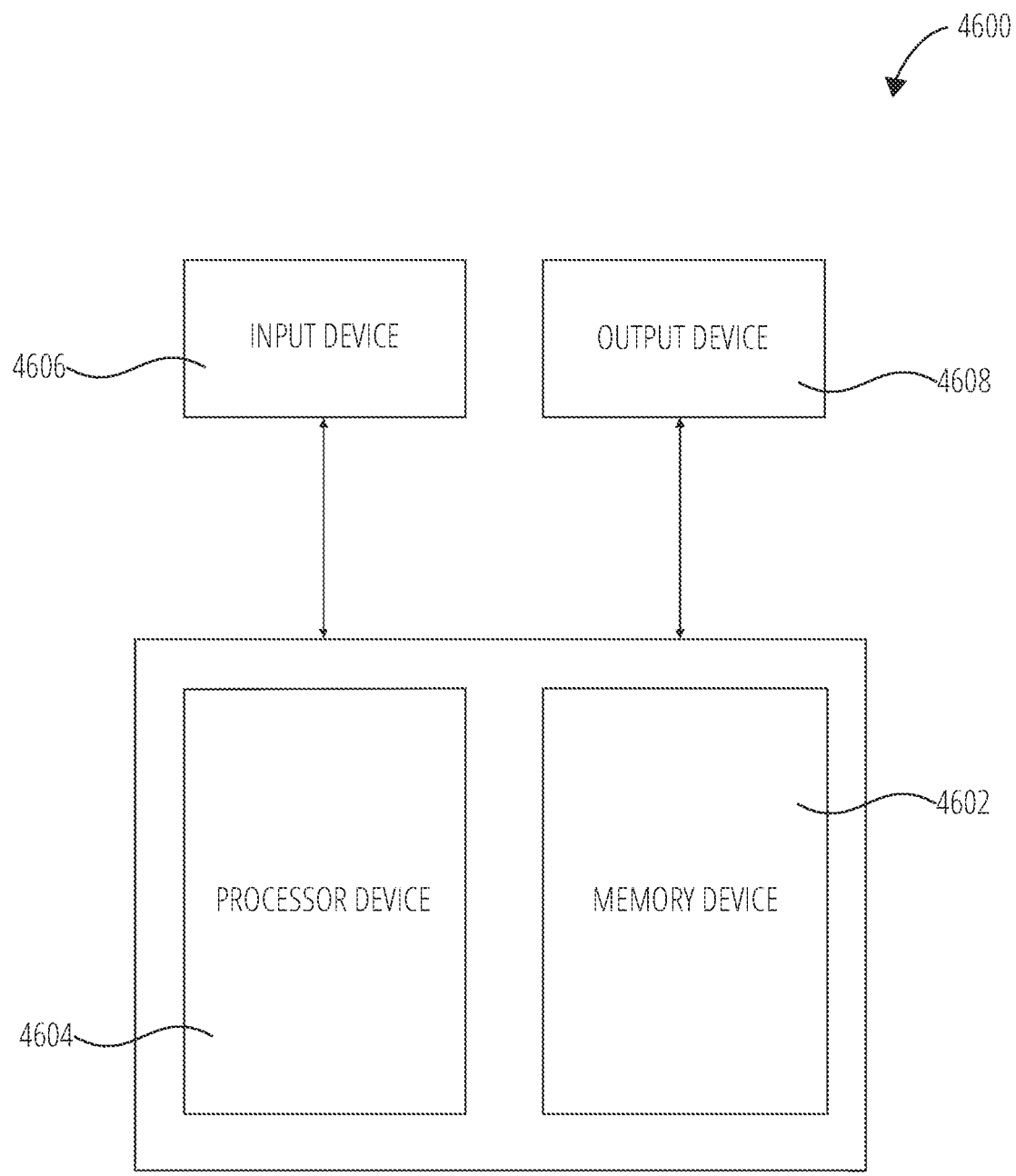
FIG. 46 is a block diagram of an electronic system, in accordance with embodiments of the disclosure.

Microelectronic devices (e.g., the microelectronic device 4500) including microelectronic device structures—such as any of the disclosed microelectronic device structures with aligned multi-deck pillar arrays of differing pillar densities—may be used in embodiments of electronic systems of the disclosure. For example, FIG. 46 is a block diagram of an electronic system 4600, in accordance with embodiments of the disclosure. The electronic system 4600 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 4600 includes at least one memory device 4602. The memory device 4602 may include, for example, one or more embodiment of a microelectronic device and/or structure previously described herein—such as any of the disclosed microelectronic device structures with aligned multi-deck pillar arrays of differing pillar densities—with structures formed according to embodiments previously described herein.

The electronic system 4600 may further include at least one electronic signal processor device 4604 (often referred to as a "microprocessor"). The processor device 4604 may, optionally, include an embodiment of a microelectronic device and/or a microelectronic device structure previously described herein, such as any of the disclosed microelectronic device structures with aligned multi-deck pillar arrays of differing pillar densities, or such as the microelectronic device 4500 of FIG. 45. The electronic system 4600 may further include one or more input devices 4606 for inputting information into the electronic system 4600 by a user, such as, for example, a mouse or other pointing device, a keyboard, a touchpad, a button, or a control panel. The electronic system 4600 may further include one or more output devices 4608 for outputting information (e.g., visual or audio output) to a user such as, for example, a monitor, a display, a printer, an audio output jack, a speaker, etc. In some embodiments, the input device 4606 and the output device 4608 may comprise a single touchscreen device that can be used both to input information into the electronic system 4600 and to output visual information to a user. The input device 4606 and the output device 4608 may communicate electrically with one or more of the memory device 4602 and the electronic signal processor device 4604.

Figure 47:
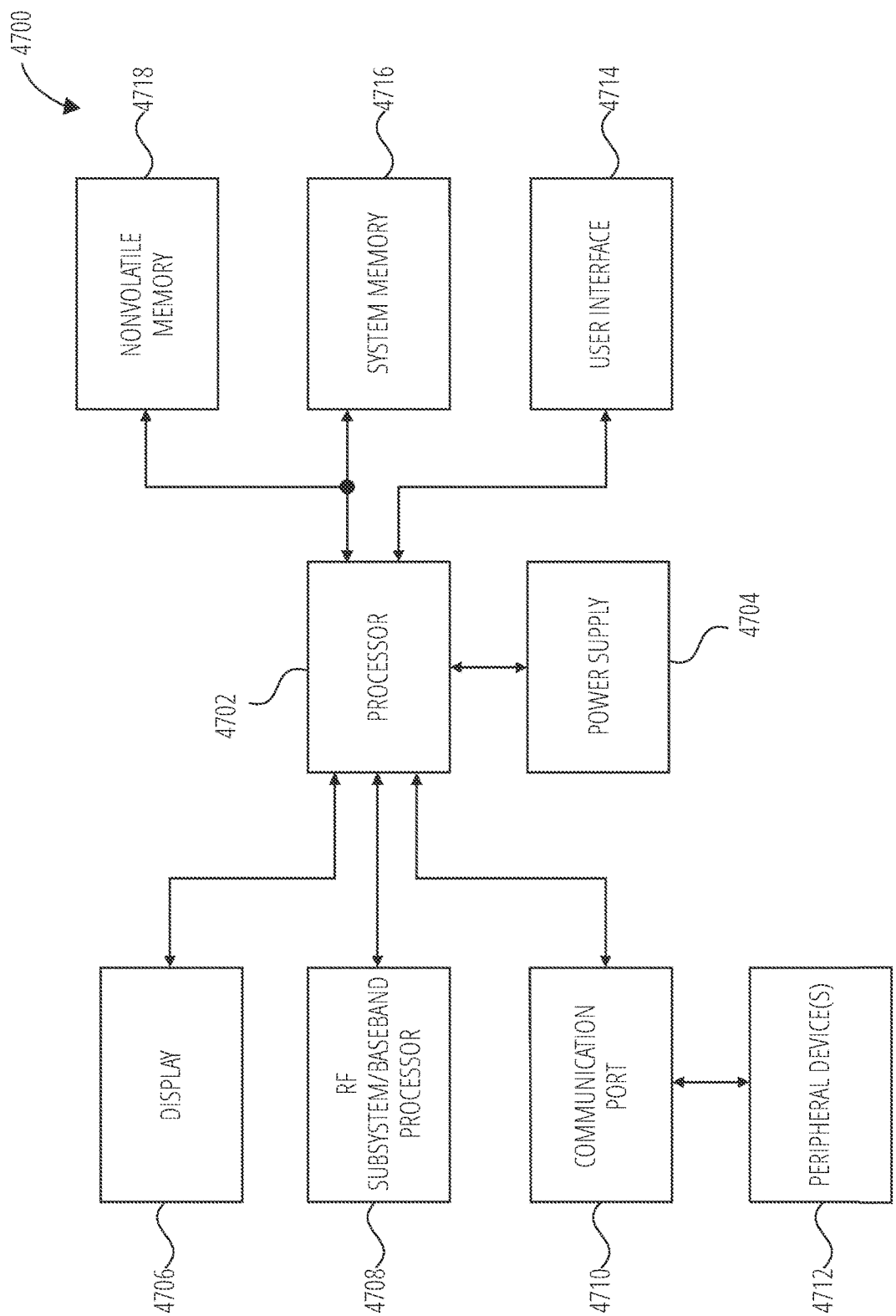
FIG. 47 is a block diagram of a processor-based system, in accordance with embodiments of the disclosure.

With reference to FIG. 47, shown is a block diagram of a processor-based system 4700. The processor-based system 4700 may include various microelectronic devices (e.g., the microelectronic device 4500 of FIG. 45) and microelectronic device structures (e.g., any of the disclosed microelectronic device structures with aligned multi-deck pillar arrays of differing pillar densities) manufactured in accordance with embodiments of the present disclosure. The processor-based system 4700 may be any of a variety of types, such as a computer, a pager, a cellular phone, a personal organizer, a control circuit, or another electronic device. The processor-based system 4700 may include one or more processors 4702, such as a microprocessor, to control the processing of system functions and requests in the processor-based system 4700. The processor 4702 and other subcomponents of the processor-based system 4700 may include microelectronic devices (e.g., the microelectronic device 4500 of FIG. 45) and microelectronic device structures (e.g., any of the disclosed microelectronic device structures with aligned multi-deck pillar arrays of differing pillar densities) manufactured in accordance with embodiments of the present disclosure.

The processor-based system 4700 may include a power supply 4704 in operable communication with the processor 4702. For example, if the processor-based system 4700 is a portable system, the power supply 4704 may include one or more of a fuel cell, a power scavenging device, permanent batteries, replaceable batteries, and/or rechargeable batteries. The power supply 4704 may also include an AC adapter; therefore, the processor-based system 4700 may be plugged into a wall outlet, for example. The power supply 4704 may also include a DC adapter such that the processor-based system 4700 may be plugged into a vehicle cigarette lighter or a vehicle power port, for example.

Various other devices may be coupled to the processor 4702 depending on the functions that the processor-based system 4700 performs. For example, a user interface 4714 may be coupled to the processor 4702. The user interface 4714 may include one or more input devices, such as buttons, switches, a keyboard, a light pen, a mouse, a digitizer and stylus, a touch screen, a voice recognition system, a microphone, or a combination thereof. A display 4706 may also be coupled to the processor 4702. The display 4706 may include an LCD display, an SED display, a CRT display, a DLP display, a plasma display, an OLED display, an LED display, a three-dimensional projection, an audio display, or a combination thereof. Furthermore, an RF subsystem/baseband processor 4708 may also be coupled to the processor 4702. The RF subsystem/baseband processor 4708 may include an antenna that is coupled to an RF receiver and to an RF transmitter. A communication port 4710, or more than one communication port 4710, may also be coupled to the processor 4702. The communication port 4710 may be adapted to be coupled to one or more peripheral devices 4712 (e.g., a modem, a printer, a computer, a scanner, a camera) and/or to a network (e.g., a local area network (LAN), a remote area network, an intranet, or the Internet).

The processor 4702 may control the processor-based system 4700 by implementing software programs stored in the memory (e.g., system memory 4716). The software programs may include an operating system, database software, drafting software, word processing software, media editing software, and/or media-playing software, for example. The memory (e.g., the system memory 4716) is operably coupled to the processor 4702 to store and facilitate execution of various programs. For example, the processor 4702 may be coupled to system memory 4716, which may include one or more of spin torque transfer magnetic random-access memory (STT-MRAM), magnetic random-access memory (MRAM), dynamic random-access memory (DRAM), static random-access memory (SRAM), racetrack memory, and/or other known memory types. The system memory 4716 may include volatile memory, nonvolatile memory, or a combination thereof. The system memory 4716 is typically large so it can store dynamically loaded applications and data. In some embodiments, the system memory 4716 may include semiconductor devices (e.g., the microelectronic device 4500 of FIG. 45) and structures (e.g., any of the disclosed microelectronic device structures with aligned multi-deck pillar arrays of differing pillar densities) described above, or a combination thereof.

The processor 4702 may also be coupled to nonvolatile memory 4718, which is not to suggest that system memory 4716 is necessarily volatile. The nonvolatile memory 4718 may include one or more of STT-MRAM, MRAM, read-only memory (ROM) (e.g., EPROM, resistive read-only memory (RROM)), and Flash memory to be used in conjunction with the system memory 4716. The size of the nonvolatile memory 4718 is typically selected to be just large enough to store any necessary operating system, application programs, and fixed data. Additionally, the nonvolatile memory 4718 may include a high-capacity memory (e.g., disk drive memory, such as a hybrid-drive including resistive memory or other types of nonvolatile solid-state memory, for example). The nonvolatile memory 4718 may include microelectronic devices (e.g., the microelectronic device 4500 of FIG. 45) and structures (e.g., any of the disclosed microelectronic device structures with aligned multi-deck pillar arrays of differing pillar densities) described above, or a combination thereof.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure. The at least one microelectronic device structure comprises at least two decks, each of the decks comprising pillars extending through a stack structure of vertically alternating insulative structures and conductive structures arranged in tiers. The at least two decks include an upper deck and a lower deck. The pillars of the upper deck define a first pillar density across an array of the pillars of the upper deck. The pillars of the lower deck define a second pillar density, different than the first pillar density, across an array of the pillars of the lower deck. The pillars of the lower deck are in physical contact with the pillars of the upper deck along an interface between the lower deck and the upper deck.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
    a lower deck and an upper deck, each comprising a stack structure comprising a vertically alternating sequence of insulative structures and conductive structures arranged in tiers;
    a first array of pillars extending through the stack structure of the lower deck; and
    a second array of pillars extending through the stack structure of the upper deck,
    at least some of the pillars of one or more of the first array and the second array exhibiting a greater degree of bending away from a vertical orientation than at least some others of the pillars of the one or more of the first array and the second array,
    the pillars of the first array aligning with the pillars of the second array along an interface between the lower deck and the upper deck.

2. The microelectronic device of claim 1, wherein at least some of the pillars of the first array exhibit the greater degree of bending away from the vertical orientation than at least some others of the pillars of the first array.

3. The microelectronic device of claim 1, wherein at least some of the pillars of the second array exhibit the greater degree of bending away from the vertical orientation than at least some others of the pillars of the second array.

4. The microelectronic device of claim 1, wherein:
    at least some of the pillars of the first array exhibit the greater degree of bending away from the vertical orientation than at least some others of the pillars of the first array; and
    the pillars of the second array are substantially vertically oriented.

5. The microelectronic device of claim 1, wherein:
    at least some of the pillars of the first array exhibit the greater degree of bending away from the vertical orientation than at least some others of the pillars of the first array; and
    at least some of the pillars of the second array exhibit the greater degree of bending away from the vertical orientation than at least some others of the pillars of the second array.

6. The microelectronic device of claim 1, wherein, within at least one horizontal area of the microelectronic device, a pillar density of the first array along a lower elevation of the lower deck is less than a pillar density of the second array along the interface.

7. The microelectronic device of claim 1, wherein, within at least one horizontal area of the microelectronic device, a pillar density of the first array along a lower elevation of the lower deck is greater than a pillar density of the second array along the interface.

8. The microelectronic device of claim 1, wherein, within at least one horizontal area of the microelectronic device, a pillar density of the first array along a lower elevation of the lower deck is substantially consistent.

9. The microelectronic device of claim 8, wherein, within the at least one horizontal area of the microelectronic device, a pillar density of the second array along the interface is substantially consistent.

10. The microelectronic device of claim 8, wherein, within the at least one horizontal area of the microelectronic device, a pillar density of the second array varies along the interface.

11. The microelectronic device of claim 1, wherein, within at least one horizontal area of the microelectronic device, a pillar density of the first array along a lower elevation of the lower deck varies.

12. The microelectronic device of claim 11, wherein, within the at least one horizontal area of the microelectronic device, a pillar density of the second array along the interface is substantially consistent.

13. A method of forming a microelectronic device, the method comprising:
    forming a lower deck comprising a stack structure comprising a vertically alternating sequence of insulative structures and conductive structures arranged in tiers;
    forming a first array of pillars extending through the stack structure of the lower deck;
    forming an upper deck on the lower deck, the upper deck comprising an additional stack structure comprising an additional vertically alternating sequence of additional insulative structures and additional conductive structures arranged in additional tiers; and
    forming a second array of pillars extending through the additional stack structure of the upper deck,
    at least some of the pillars of one or more of the first array and the second array exhibiting a greater degree of bending away from a vertical orientation than at least some other of the pillars of the one or more of the first array and the second array,
    the pillars of the first array aligning with the pillars of the second array along an interface between the lower deck and the upper deck.

14. The method of claim 13, wherein:
    forming the first array of pillars comprises using a lower deck reticle having a first pattern feature density; and
    forming the second array of pillars comprises using an upper deck reticle having a second pattern feature density differing from the first pattern feature density.

15. The method of claim 13, wherein:
    forming the first array of pillars comprises using a lower deck reticle having a first pattern feature density; and
    forming the second array of pillars comprises using an upper deck reticle having a second pattern feature density,
    at least one of the first pattern feature density and the second pattern feature density varying across a width of a respective one of the lower deck reticle and the upper deck reticle.

16. A microelectronic device, comprising:
    a stack structure comprising a vertically alternating sequence of insulative structures and conductive structures arranged in tiers, the stack structure comprising a first deck and a second deck above the first deck;
    a first array of pillars extending through the first deck of the stack structure; and
    a second array of pillars extending through the second deck of the stack structure,
    the pillars of the first array directly adjoining the pillars of the second array along an interface between the first deck and the second deck,
    a longitudinal axis of each of at least some of the pillars exhibiting bending away from a vertical orientation.

17. The microelectronic device of claim 16, wherein a pillar density of the first array differs from a pillar density of the second array in at least one horizontal area of the stack structure.

18. The microelectronic device of claim 16, wherein:
    a pillar density of the first array is substantially symmetrical about a centerline of the stack structure; and a pillar density of the second array is substantially symmetrical about the centerline of the stack structure.

19. The microelectronic device of claim 16, further comprising an array of conductive contacts above the second array of pillars.

20. The microelectronic device of claim 19, wherein, a spacing density of the conductive contacts of the array of conductive contacts varies across at least one horizontal area of the microelectronic device.

* * * * *